United States Patent
Visco et al.

(10) Patent No.: US 10,840,547 B2
(45) Date of Patent: Nov. 17, 2020

(54) ENCAPSULATED SULFIDE GLASS SOLID ELECTROLYTES AND SOLID-STATE LAMINATE ELECTRODE ASSEMBLIES

(71) Applicant: PolyPlus Battery Company, Berkeley, CA (US)

(72) Inventors: Steven J. Visco, Berkeley, CA (US); Vitaliy Nimon, San Francisco, CA (US); Yevgeniy S. Nimon, Danville, CA (US); Bruce D. Katz, Moraga, CA (US)

(73) Assignee: POLYPLUS BATTERY COMPANY, Berkeley, CA (US)

( * ) Notice: Subject to any disclaimer, the term of this patent is extended or adjusted under 35 U.S.C. 154(b) by 59 days.

(21) Appl. No.: 16/341,872

(22) PCT Filed: Jun. 27, 2018

(86) PCT No.: PCT/US2018/039862
§ 371 (c)(1),
(2) Date: Apr. 12, 2019

(87) PCT Pub. No.: WO2019/010047
PCT Pub. Date: Jan. 10, 2019

(65) Prior Publication Data
US 2019/0229370 A1 Jul. 25, 2019

Related U.S. Application Data

(63) Continuation-in-part of application No. 16/012,588, filed on Jun. 19, 2018, now Pat. No. 10,629,950.
(Continued)

(51) Int. Cl.
*H01M 4/02* (2006.01)
*H01M 10/0562* (2010.01)
(Continued)

(52) U.S. Cl.
CPC ....... *H01M 10/0562* (2013.01); *C23C 16/345* (2013.01); *C23C 16/40* (2013.01);
(Continued)

(58) Field of Classification Search
None
See application file for complete search history.

(56) References Cited

U.S. PATENT DOCUMENTS 4,042,482 A 8/1977 Shannon et al.
4,208,474 A 6/1980 Jacobson et al.
(Continued)

FOREIGN PATENT DOCUMENTS

CN 101494299 A 7/2009
EP 0774654 B1 1/2000
(Continued)

OTHER PUBLICATIONS

Restriction Requirement for U.S. Appl. No. 15/380,989, dated Jul. 5, 2018.
(Continued)

*Primary Examiner* — Jacob B Marks
(74) *Attorney, Agent, or Firm* — Weaver Austin Villeneuve & Sampson LLP

(57) ABSTRACT

Nanofilm-encapsulated sulfide glass solid electrolyte structures and methods for making the encapsulated glass structures involve a lithium ion conducting sulfide glass sheet encapsulated on its opposing major surfaces by a continuous and conformal nanofilm made by atomic layer deposition (ALD). During manufacture, the reactive surfaces of the sulfide glass sheet are protected from deleterious reaction with ambient moisture, and the nanofilm can be configured to provide additional performance advantages, including enhanced mechanical strength and improved chemical resistance.

20 Claims, 44 Drawing Sheets

Related U.S. Application Data

(60) Provisional application No. 62/669,592, filed on May 10, 2018, provisional application No. 62/620,958, filed on Jan. 23, 2018, provisional application No. 62/534,624, filed on Jul. 19, 2017, provisional application No. 62/529,732, filed on Jul. 7, 2017.

(51) Int. Cl.
*H01M 10/0525* (2010.01)
*C23C 16/34* (2006.01)
*C23C 16/40* (2006.01)
*C23C 16/455* (2006.01)
*H01M 4/04* (2006.01)
H01M 4/38 (2006.01)
B82Y 30/00 (2011.01)

(52) U.S. Cl.
CPC ..... *C23C 16/45536* (2013.01); *H01M 4/0421* (2013.01); *H01M 10/0525* (2013.01); *B82Y 30/00* (2013.01); *H01M 4/382* (2013.01); *H01M 2300/0068* (2013.01); *H01M 2300/0071* (2013.01); *H01M 2300/0094* (2013.01)

(56) References Cited

U.S. PATENT DOCUMENTS

| | | | |
|---|---|---|---|
| 4,331,750 A | 5/1982 | Malugani et al. | |
| 4,444,857 A | 4/1984 | Duchange et al. | |
| 4,465,745 A | 8/1984 | Akridge | |
| 4,465,746 A | 8/1984 | Akridge | |
| 4,477,545 A | 10/1984 | Akridge et al. | |
| 4,478,920 A | 10/1984 | Gabano et al. | |
| 4,513,070 A | 4/1985 | Carette et al. | |
| 4,585,714 A | 4/1986 | Akridge et al. | |
| 4,599,284 A | 7/1986 | Adridge | |
| 4,985,317 A | 1/1991 | Adachi et al. | |
| 5,314,765 A | 5/1994 | Bates | |
| 5,338,625 A | 8/1994 | Bates et al. | |
| 5,413,881 A | 5/1995 | Licht | |
| 5,455,126 A | 10/1995 | Bates et al. | |
| 5,512,147 A | 4/1996 | Bates et al. | |
| 5,567,210 A | 10/1996 | Bates et al. | |
| 5,569,520 A | 10/1996 | Bates | |
| 5,597,660 A | 1/1997 | Bates et al. | |
| 5,612,152 A | 3/1997 | Bates | |
| 5,648,187 A | 7/1997 | Skotheim | |
| 5,702,995 A | 12/1997 | Fu | |
| 5,958,281 A | 9/1999 | Takada et al. | |
| 5,961,672 A | 10/1999 | Skotheim et al. | |
| 6,030,909 A | 2/2000 | Fu | |
| 6,214,061 B1 | 4/2001 | Visco et al. | |
| 6,315,881 B1 | 11/2001 | Fu | |
| 6,402,795 B1 | 6/2002 | Chu et al. | |
| 6,432,584 B1 | 8/2002 | Visco et al. | |
| 6,485,622 B1 | 11/2002 | Fu | |
| 6,723,140 B2 | 4/2004 | Chu et al. | |
| 6,733,924 B1 | 5/2004 | Skotheim et al. | |
| 6,797,428 B1 | 9/2004 | Skotheim et al. | |
| 7,211,532 B2 | 5/2007 | Fu | |
| 7,247,408 B2 | 7/2007 | Skotheim | |
| 7,273,682 B2 | 9/2007 | Park et al. | |
| 7,282,295 B2 | 10/2007 | Visco et al. | |
| 7,282,296 B2 | 10/2007 | Visco et al. | |
| 7,282,302 B2 | 10/2007 | Visco et al. | |
| 7,390,591 B2 | 6/2008 | Visco et al. | |
| 7,645,543 B2 | 1/2010 | Visco et al. | |
| 7,666,233 B2 | 2/2010 | Visco et al. | |
| 7,824,806 B2 | 11/2010 | Visco et al. | |
| 7,829,212 B2 | 11/2010 | Visco et al. | |
| 7,838,144 B2 | 11/2010 | Visco et al. | |
| 7,858,223 B2 | 12/2010 | Visco et al. | |
| 8,048,570 B2 | 11/2011 | Visco et al. | |
| 8,048,571 B2 | 11/2011 | Visco et al. | |
| 8,114,171 B2 | 2/2012 | Visco et al. | |
| 8,129,052 B2 | 3/2012 | Visco et al. | |
| 8,182,943 B2 | 5/2012 | Visco et al. | |
| 8,202,649 B2 | 6/2012 | Visco et al. | |
| 8,293,398 B2 | 10/2012 | Visco et al. | |
| 8,323,820 B2 | 12/2012 | Visco et al. | |
| 8,334,075 B2 | 12/2012 | Visco et al. | |
| 8,389,147 B2 | 3/2013 | Visco et al. | |
| 8,445,136 B2 | 5/2013 | Visco et al. | |
| 8,455,131 B2 | 6/2013 | Visco et al. | |
| 8,501,339 B2 | 8/2013 | Visco et al. | |
| 8,652,686 B2 | 2/2014 | Visco et al. | |
| 8,658,304 B2 | 2/2014 | Visco et al. | |
| 8,673,477 B2 | 3/2014 | Visco et al. | |
| 8,691,444 B2 | 4/2014 | Visco et al. | |
| 8,778,522 B2 | 7/2014 | Visco et al. | |
| 8,778,543 B2 | 7/2014 | Shinohara et al. | |
| 8,828,573 B2 | 9/2014 | Visco et al. | |
| 8,828,574 B2 | 9/2014 | Visco et al. | |
| 8,828,575 B2 | 9/2014 | Visco et al. | |
| 8,828,580 B2 | 9/2014 | Visco et al. | |
| 9,123,941 B2 | 9/2015 | Visco et al. | |
| 9,130,198 B2 | 9/2015 | Visco et al. | |
| 9,136,568 B2 | 9/2015 | Visco et al. | |
| 9,287,573 B2 | 3/2016 | Visco et al. | |
| 9,362,538 B2 | 6/2016 | Visco et al. | |
| 9,660,265 B2 | 5/2017 | Visco et al. | |
| 10,147,968 B2 | 12/2018 | Visco et al. | |
| 10,164,289 B2 | 12/2018 | Visco et al. | |
| 2002/0012846 A1 | 1/2002 | Skotheim et al. | |
| 2002/0036131 A1 | 3/2002 | Kugai et al. | |
| 2004/0005504 A1 | 1/2004 | Kugai et al. | |
| 2007/0037058 A1 | 2/2007 | Visco et al. | |
| 2007/0087269 A1 | 4/2007 | Inda | |
| 2007/0172739 A1 | 7/2007 | Visco et al. | |
| 2007/0231704 A1 | 10/2007 | Inda | |
| 2007/0248888 A1 | 10/2007 | Seino et al. | |
| 2007/0295385 A1 | 12/2007 | Sheats et al. | |
| 2008/0057386 A1 | 3/2008 | Visco et al. | |
| 2008/0057387 A1 | 3/2008 | Visco et al. | |
| 2008/0057399 A1 | 3/2008 | Visco et al. | |
| 2008/0113261 A1 | 5/2008 | De Jongye et al. | |
| 2008/0318132 A1 | 12/2008 | Visco et al. | |
| 2009/0142669 A1 | 6/2009 | Shinohara et al. | |
| 2009/0159839 A1 | 6/2009 | Seino et al. | |
| 2009/0297935 A1 | 12/2009 | Visco et al. | |
| 2010/0040952 A1 | 2/2010 | Kimura et al. | |
| 2010/0075209 A1 | 3/2010 | Kimura et al. | |
| 2010/0190063 A1 | 7/2010 | Fukumoto et al. | |
| 2011/0065007 A1 | 3/2011 | Kamya et al. | |
| 2011/0076570 A1 | 3/2011 | Hama et al. | |
| 2011/0108642 A1 | 5/2011 | Hama et al. | |
| 2011/0117726 A1 | 5/2011 | Pinnington et al. | |
| 2012/0034529 A1 | 2/2012 | Tatsumisago et al. | |
| 2012/0094188 A1 | 4/2012 | Visco et al. | |
| 2012/0177997 A1 | 7/2012 | Nakamoto et al. | |
| 2012/0183834 A1 | 7/2012 | Kanda et al. | |
| 2012/0189918 A1 | 7/2012 | Tatsumisago et al. | |
| 2013/0122365 A1 | 5/2013 | Zaghib et al. | |
| 2013/0164631 A1 | 6/2013 | Ohtomo et al. | |
| 2013/0164632 A1 | 6/2013 | Kato et al. | |
| 2013/0288134 A1 | 10/2013 | Hama et al. | |
| 2014/0072875 A1 | 3/2014 | Uchiyama | |
| 2014/0093785 A1 | 4/2014 | Sugiura et al. | |
| 2014/0141341 A1 | 5/2014 | Ohtomo et al. | |
| 2014/0151371 A1 | 6/2014 | Chang et al. | |
| 2014/0162108 A1 | 6/2014 | Visco et al. | |
| 2014/0170465 A1 | 6/2014 | Visco et al. | |
| 2014/0322584 A1 | 10/2014 | Visco et al. | |
| 2015/0214555 A1 | 7/2015 | Visco et al. | |
| 2015/0340720 A1 | 11/2015 | Visco et al. | |
| 2015/0349371 A1 | 12/2015 | Neudecker et al. | |
| 2016/0028053 A1 | 1/2016 | Visco et al. | |
| 2016/0028063 A1 | 1/2016 | Visco et al. | |
| 2016/0072153 A1* | 3/2016 | Ichikawa | H01M 2/1686 429/103 |
| 2016/0087263 A1 | 3/2016 | Gadkaree et al. | |
| 2016/0156065 A1 | 6/2016 | Visco et al. | |
| 2016/0190640 A1 | 6/2016 | Visco et al. | |
| 2016/0197326 A1 | 7/2016 | Visco et al. | |

(56) References Cited

U.S. PATENT DOCUMENTS

| | | | |
|---|---|---|---|
| 2016/0351878 | A1 | 12/2016 | Visco et al. |
| 2016/0351879 | A1 | 12/2016 | Visco et al. |
| 2017/0229731 | A1 | 8/2017 | Visco et al. |
| 2017/0331156 | A1 | 11/2017 | Visco et al. |
| 2017/0365853 | A1 | 12/2017 | Visco et al. |
| 2018/0131040 | A1 | 5/2018 | Visco et al. |
| 2019/0013546 | A1 | 1/2019 | Visco et al. |
| 2019/0148768 | A1 | 5/2019 | Visco et al. |
| 2019/0173128 | A1 | 6/2019 | Visco et al. |
| 2019/0181496 | A1 | 6/2019 | Visco et al. |
| 2019/0237810 | A1 | 8/2019 | Visco et al. |
| 2020/0014063 | A1 | 1/2020 | Visco et al. |
| 2020/0028209 | A1 | 1/2020 | Visco et al. |
| 2020/0127275 | A1 | 4/2020 | Visco et al. |
| 2020/0243902 | A1 | 7/2020 | Visco et al. |
| 2020/0251773 | A1 | 8/2020 | Visco et al. |
| 2020/0259212 | A1 | 8/2020 | Visco et al. |

FOREIGN PATENT DOCUMENTS

| | | |
|---|---|---|
| EP | 3 227 952 | 10/2017 |
| JP | 2004-063419 A | 2/2004 |
| JP | 2008-103229 A | 5/2008 |
| JP | 2008-300300 A | 12/2008 |
| JP | 2009-158476 A | 7/2009 |
| JP | 2010-108881 | 5/2010 |
| JP | 2012-043654 | 3/2012 |
| JP | 2012-089424 | 5/2012 |
| JP | 2012-096973 A | 5/2012 |
| JP | 2013-117398 A | 1/2013 |
| JP | 2013-232335 | 11/2013 |
| JP | 2014-035989 A | 2/2014 |
| JP | 2014-096311 | 5/2014 |
| JP | 2014-221714 | 11/2014 |
| WO | 2016/089897 A1 | 6/2016 |
| WO | 2016/089899 A1 | 6/2016 |
| WO | 2017/112550 A1 | 6/2017 |
| WO | 2017/197039 A1 | 11/2017 |
| WO | 2019/010047 A1 | 1/2019 |

OTHER PUBLICATIONS

Non-Final Office Action for U.S. Appl. No. 14/954,812, dated Aug. 1, 2018.
Non-Final Office Action for U.S. Appl. No. 14/954,816, dated Aug. 1, 2018.
Notice of Allowance for U.S. Appl. No. 14/954,816, dated Oct. 15, 2018.
Notice of Allowance for U.S. Appl. No. 14/954,812, dated Oct. 30, 2018.
Non-final Office Actions for U.S. Appl. No. 15/380,989, dated Mar. 26, 2019.
WO patent application No. PCT/US2015/063234, International Search Report and Written Opinion dated Apr. 1, 2016.
WO patent application No. PCT/US2015/063231, International Search Report and Written Opinion dated Mar. 11, 2016.
WO patent application No. PCT/US2016/067338, International Search Report and Written Opinion dated May 19, 2017.
First Office Action, dated Aug. 15, 2017, for Mexican Application No. MX/a/2017/007265. No Translation.
Extended European Search Report, dated May 22, 2018, for European Patent Application No. 15864779.2.
WO patent application No. PCT/US2015/063234, International Preliminary Report on Patentability, dated Jun. 15, 2017.
WO patent application No. PCT/US2015/063231, International Preliminary Report on Patentability, dated Jun. 15, 2017.
WO patent application No. PCT/US2016/067338, International Preliminary Report on Patentability, dated Jul. 5, 2017.
WO patent application No. PCT/US2018/039862, Invitation to Pay Additional Fees and, where applicable, Protest Fee, dated Aug. 28, 2018.
WO patent application No. PCT/US2018/042476, Invitation to Pay Additional Fees and, where applicable, Protest Fee, dated Sep. 12, 2018.
WO patent application No. PCT/US2018/039862, International Search Report and Written Opinion dated Oct. 19, 2018.
WO patent application No. PCT/US2018/042476, International Search Report and Written Opinion dated Nov. 9, 2018.
Communication Pursuant to Rules 161(2) and 162 EPC, (request for extra claims fees), dated Aug. 4, 2018, for European Patent Application No. 15864779.2.
Communication Pursuant to Rules 70(2) and 70a(2), dated Jun. 8, 2018, deadline for response to Extended European Search Report, for European Patent Application No. 15864779.2.
First Office Action, dated Feb. 3, 2019, for Chinese Patent Application No. 201580075233.0, with Chinese Search Report and English Translation.
Akridge, James R. et al., "Solid state batteries using vitreous solid electrolytes," *Solid State Ionics* 18 & 19 (1986) 1082-1087.
Bartholomew, Roger F. et al., "Electrical properties of new glasses based on the Li2S—SiS2 system," Journal of Non-Crystalline Solids 256&257 (1999) 242-247.
Bates, J.B. et al., "Thin-film rechargeable lithium batteries," 1995, *Journal of Power Sources*.
Bates, J.B. et al., "Electrical properties of amorphous lithium electrolyte thin films," 1992, *Solid State Ionics*.
Burckhardt, W. et al., "Fast $Li^+$ ion transport in iodine-thioborate glasses," *Mat. Res. Bull.*, vol. 19, pp. 1083-1089, 1984.
Cao, Can et al., "Recent advances in inorganic solid electrolytes for lithium batteries," *Frontiers in Energy Research*, Jun. 2014, vol. 2, Article 25, pp. 1-10.
Fu, Jie, "Fast Li+ Ion Conduction in Li2O—Al2O3—TiO2—SiO2—P2O5 Glass-Ceramics," *Journal of the American Ceramics Society*, vol. 80, No. 7, Jul. 1997, pp. 1-5.
Fu, Jie, "Superionic conductivity of glass-ceramics in the system $Li_2O$—$Al_2O_3$—$TiO_3$—$P_2O_5$", *Solid State Ionics* 96 (1997), pp. 195-200.
Fu, Jie, "Fast Li+ ion conducting glass-ceramics in the system $Li_2O$—$Al_2O_3$—$GeO_2$—$P_2O_5$", *Solid State Ionics* 104 (1997), pp. 191-194.
Hayashi, Akitoshi et al., "Characterization of $Li_2S$—$P_2S_5$ glass-ceramics as a solid electrolyte for lithium secondary batteries," *Solid State Ionics* 175 (2004) 683-686.
Hayashi, Akitoshi et al., "Formation of superionic crystals from mechanically milled Li2S—P2S5 glasses," Electrochemistry Communications 5 (2003) 111-114, Nov. 26, 2002.
Hayashi, Akitoshi et al., "Preparation and ionic conductivity of $Li_7P_3S_{11-z}$ glass-ceramic electrolytes," *Journal of Non-Crystalline Solids* 356 (2010) 2670-2673.
Hayashi, Akitoshi et al., "Preparation of $Li_2S$—$P_2S_5$ amorphous solid electrolytes by mechanical milling," *J. Am. Ceram. Soc.*, 84 [2] 477-79 (2001).
Hayashi, Akitoshi et al., "Mechanochemical synthesis of amorphous solid electrolytes using SiS2 and various lithium compounds," Solid State Ionics 175 (2004) 637-640, Dec. 9, 2003.
Jones, Steven D. et al., "A thin-film solid-state microbattery," *Journal of Power Sources*, 43-44 (1993) 505-513.
Kennedy, John H. et al., "Improved stability for the $SiS_2$—$P_2S_5$—$Li_2S$—LiI glass system," *Solid State Ionics* 28-30 (1998) 726-728.
Kennedy, J.H., "Ionically conductive glasses based on $SiS_2$,"*Materials Chemistry and Physics*, 23 (1989) 29-50.
Kennedy, John H. et al., "Ionically conductive sulfide-based lithium glasses," *Journal of Non-Crystalline Solids* 123 (1990) 328-338.
Kennedy, John H. et al., "Preparation and conductivity measurements of $SiS_2$—$Li_2S$ glasses doped with LiBr and LiCl," *Solid State Ionics* 18 & 19 (1986) 368-371.
Kitaura, Hirokazu et al., "Fabrication of electrode-electrolyte interfaces in all-solid-state rechargeable lithium batteries by using a supercooled liquid state of the glassy electrolytes," *J. Mater. Chem.*, 2011, 21, 118.
Kondo, S. et al., "New lithium ion conductors based on $Li_2S$—$SiS_2$ system," *Solid State Ionics* 53-56 (1992) 1183-1186.

(56) References Cited

OTHER PUBLICATIONS

Malugani, J.P. et al., "Preparation and electrical properties of the 0,37 $Li_2S$—0,18$P_2S_5$—0,45 LiI glass," *Solid State Ionics* 1 (1980) 519-523.
Mercier, René et al., "Superionic conduction in $Li_2S$—$P_2S_5$—LiI-glasses," *Solid State Ionics* 5 (1981) 663-666.
Minami, Keiichi et al., "Electical and electrochemical properties of glass-ceramic electrolytes in the systems Li2S—P2S5—P2S3 and Li2S—P2S5—P2O5," Solid State Ionics 192 (2011) 122-125.
Minami, Keiichi et al., "Mechanochemical synthesis of Li2S—P2S5 glass electrolytes with lithium salts," *Solid State Ionics* 181 (2010) 1505-1509.
Minami, Keiichi et al., "Preparation and characterization of lithium ion conducting Li2S—P2S5—GeS2 glasses and glass-ceramics," Journal of Non-Crystalline Solids 356 (2010) 2666-2669.
Minami, Tsutomu et al., "Preparation and characterization of lithium ion-conducting oxysulfide glasses," Solid State Ionics 136-137 (2000) 1015-1023.
Mizuno, Fuminori et al., "Lithium ion conducting solid electrolytes prepared from Li2S, elemental P and S," Solid State Ionics 177 (2006) 2753-2757.
Ohtomo, Takamasa et al., "All-solid-state lithium secondary batteries using the 75$Li_2S$—25$P_2S_5$glass and the 70$Li_2S$—30$P_2S_5$ glass-ceramic as solid electrolytes," *Journal of Power Sources* 233 (2013) 231-235.
Ohtomo, Takamasa et al., "Electrical and electrochemical properties of $Li_2S$—$P_2S_5$—$P_2$—$O_5$ glass-ceramic electrolytes," *Journal of Power Sources* 146 (2005) 715-718.
Ohtomo, Takamasa et al., "Mechanochemical synthesis of lithium ion conducting glasses and glass-ceramics in the system $Lip_2S$—P—S," *Solid State Ionics* 176 (2005) 2349-2353.
Pradel, Annie et al., "Electrical properties of lithium conductive silicon sulfide glasses prepared by twin roller quenching," *Solid State Ionics* 18 & 19 (1986) 351-355.
Rudolph, B. et al., "Cyclic voltammetry studies of the lithiumthioborate glass-indium interface," *Electrochimica Acta*, vol. 34, No. 11, pp. 1519-1521, 1989.
Sahami, Saeed et al., "Preparation and conductivity measurements of $SiS_2$—$Li_2S$—LiBr lithium ion conductive glasses," *Journal of the Electrochemical Society*,Apr. 1985, pp. 985-986.
Sakuda, Atsushi et al., "Sulfide solid electrolyte with favorable mechanical property for all-solid-state lithium battery," *Scientific Reports* 3:2261, Jul. 23, 2013.
Tatsumisago, Masahiro, "Glassy materials based on $Li_2S$ for all-solid-state lithium secondary batteries," *Solid State Ionics* 175 (2004) 13-18.
Tatsumisago, Masahiro et al., "Preparation and structure of lithium-ion-conducting mixed-anion glasses in the system $LiBO_2$—$LiBS_2$," *J. Am. Ceram. Soc.*, 71 [9] 766-69 (1988).
Tatsumisago, Masahiro et al., "Recent development of sulfide solid electrolytes and interfacial modification for all-solid-state rechargeable lithium batteries," *Journal of Asian Ceramic Societies* 1 (2013) 17-25.
Trevey, James et al., "Glass-ceramic Li2S—P2S5 electrolytes prepared by a single step ball billing process and their appliction for all-solid-state lithium-ion batteries," Electrochemistry Communications 11 (2009) 1830-1833.
Visco, Steven J. et al., "Complex plane and $^7$Li NMR studies of highly conductive sulfide-based lithium glasses," *Battery Testing*, vol. 132, No. 4, pp. 751-753.
Visco, Steven J. et al., "Complex plane and $^7$Li NMR studies of arsenic sulfide-based lithium glasses," *J. Electrochem. Soc.: Solid-State Science and Technology*, Jul. 1985, pp. 1766-1770.
Yang, Min et al., "Membranes in lithium ion batteries," *Membranes* 2012, 2, 367-383.
U.S. Appl. No. 16/161,720, filed Oct. 16, 2018, Visco et al.
U.S. Appl. No. 16/174,058, filed Oct. 29, 2018, Visco et al.
U.S. Appl. No. 16/179,803, filed Nov. 2, 2018, Visco et al.
U.S. Appl. No. 16/341,874, filed Apr. 12, 2019, Visco et al.
Restriction Requirement for U.S. Appl. No. 15/726,302, dated Nov. 19, 2019.
Notice of Allowance for U.S. Appl. No. 16/012,588, dated Dec. 3, 2019.
Notice of Allowance for U.S. Appl. No. 15/380,989, dated Dec. 6, 2019.
Final Office Action for U.S. Appl. No. 15/592,102, dated Jan. 27, 2020.
Notice of Allowance for U.S. Appl. No. 15/592,102, dated Mar. 6, 2020.
Non-final Office Action for U.S. Appl. No. 15/726,302, dated Apr. 16, 2020.
Non-final Office Action for U.S. Appl. No. 16/179,803, dated Apr. 28, 2020.
Non-final Office Action for U.S. Appl. No. 16/161,720, dated Apr. 28, 2020.
Restriction Requirement for U.S. Appl. No. 16/174,058, dated Apr. 16, 2020.
Notice of Allowance for U.S. Appl. No. 16/161,720, dated Aug. 6, 2020.
Notice of Allowance for U.S. Appl. No. 16/179,803, dated Aug. 11, 2020.
WO patent application No. PCT/US2017/032024, International Search Report and Written Opinion, dated Aug. 21, 2017.
Communication Pursuant to Article 94(3) EPC, First Office Action, dated May 13, 2019, for European Patent Application No. 15864779.2.
Notice of Reasons for Rejection, dated May 24, 2019, for Japanese Patent Application No. 2017-529785, with machine translation.
Second Office Action, dated Nov. 15, 2019, for Chinese Patent Application No. 201580075233.0, with English Translation.
Notice of Reasons for Rejection, dated Jan. 14, 2020, for Japanese Patent Application No. 2017-529785, with machine translation.
WO patent application No. PCT/US2018/039862, International Preliminary Report on Patentability, dated Jan. 7, 2020.
WO patent application No. PCT/US2018/042476, International Preliminary Report on Patentability, dated Jan. 21, 2020.
First Office Action, dated Jan. 14, 2020, for Brazilian Patent Application No. BR112017011768-1, with English Translation.
First Office Action, dated Jan. 14, 2020, for Brazilian Patent Application No. BR112017011548-1, with English Translation.
Notice of Allowance, dated Mar. 10, 2020, for Chinese Patent Application No. 201580075233.0, with English Translation.
U.S. Appl. No. 16/663,177, filed Oct. 24, 2019, Visco et al.
U.S. Appl. No. 16/721,787, filed Dec. 19, 2019, Visco et al.
U.S. Appl. No. 16/781,713, filed Feb. 4, 2020, Visco et al.
U.S. Appl. No. 16/784,162, filed Feb. 6, 2020, Visco et al.
U.S. Appl. No. 15/929,959, filed May 29, 2020, Visco et al.
Notice of Allowance for U.S. Appl. No. 16/341,874, dated Sep. 3, 2020.
Notice of Allowance for U.S. Appl. No. 16/663,177, dated Sep. 3, 2020.
Examination Report, dated Sep. 14, 2020, for European Patent Application No. 15864779.2, 3 Pages.
Decision for Grant, dated Sep. 29, 2020, for Japanese Patent Application No. 2017-529785, without translation.

\* cited by examiner

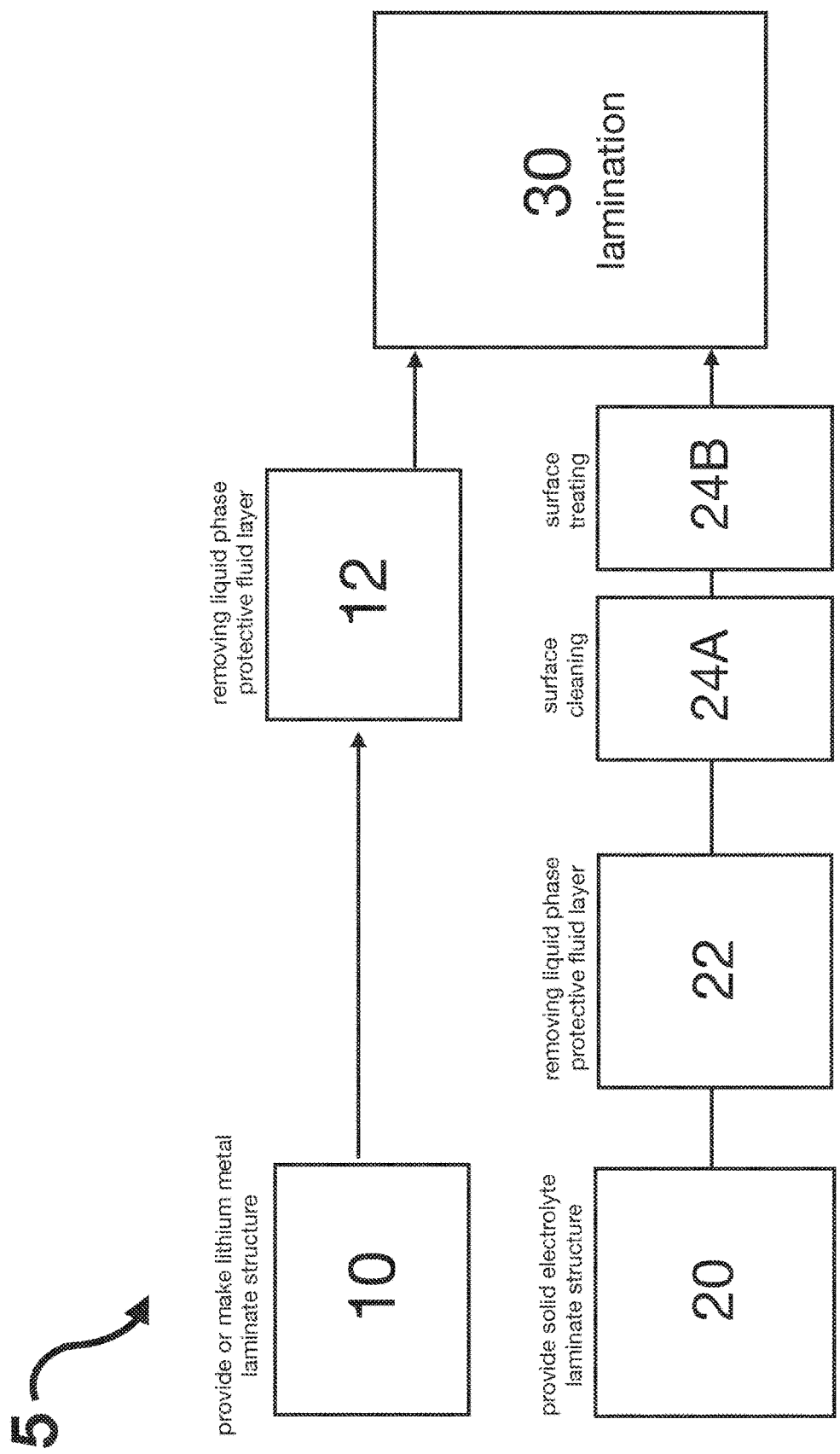

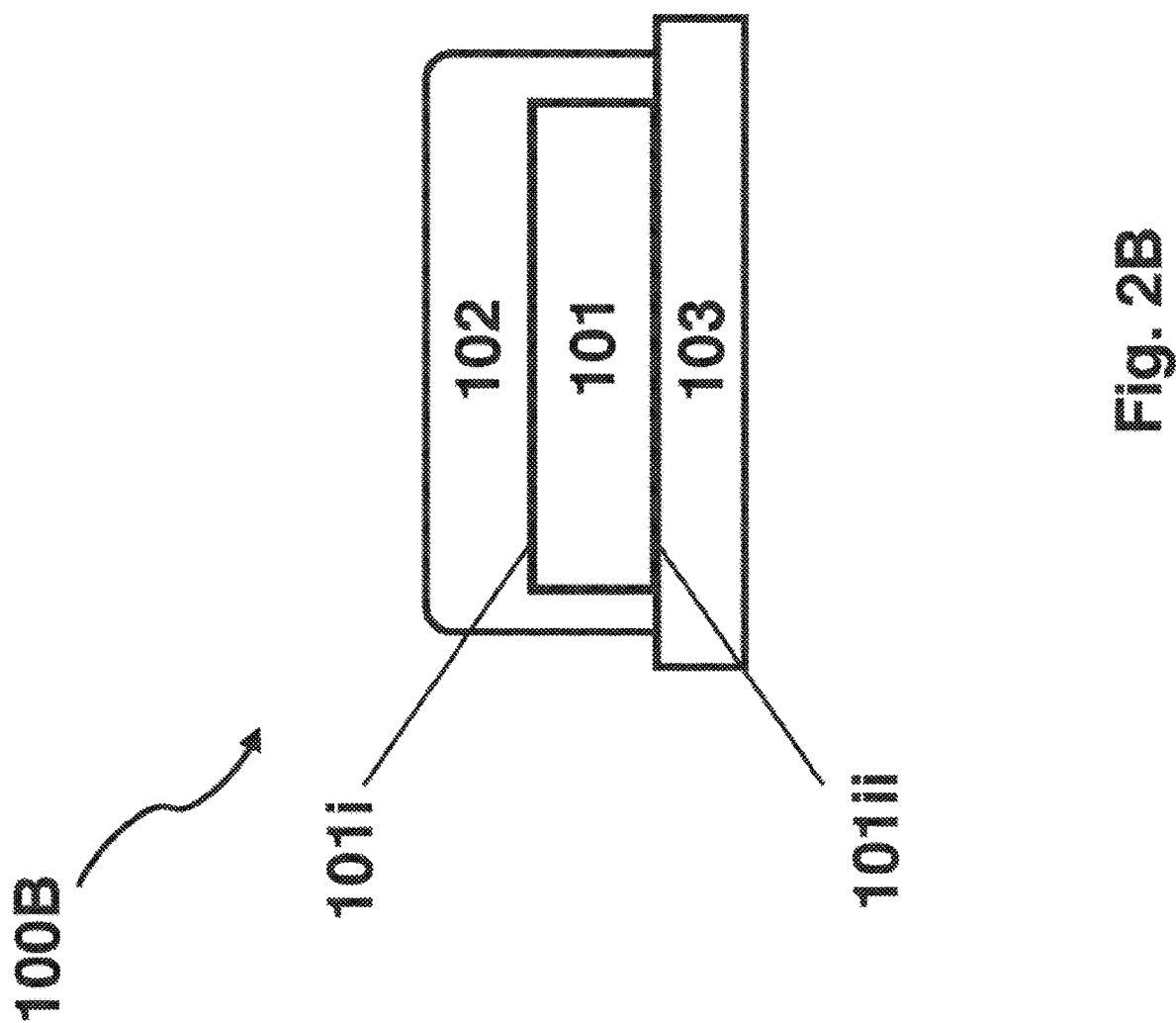

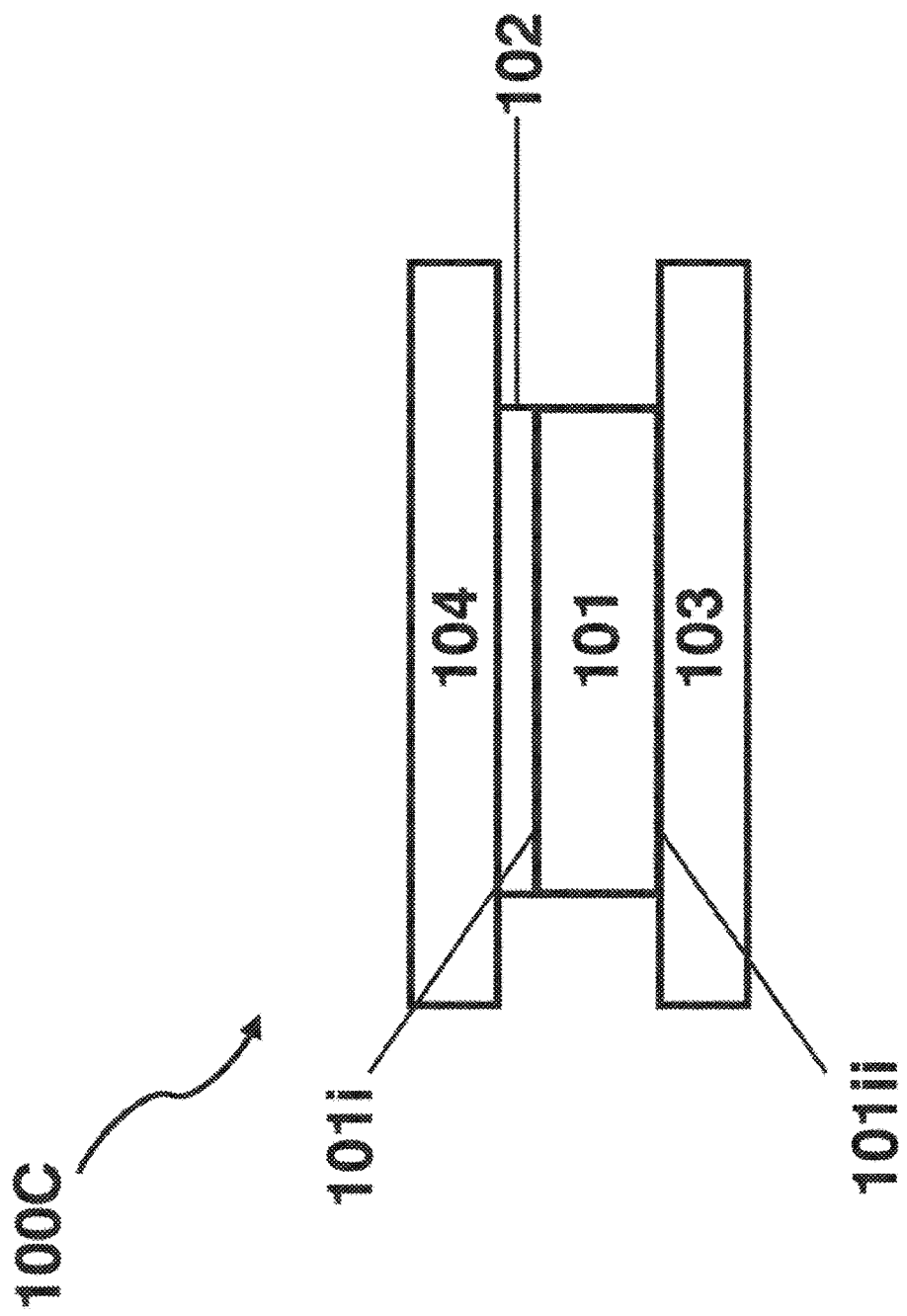

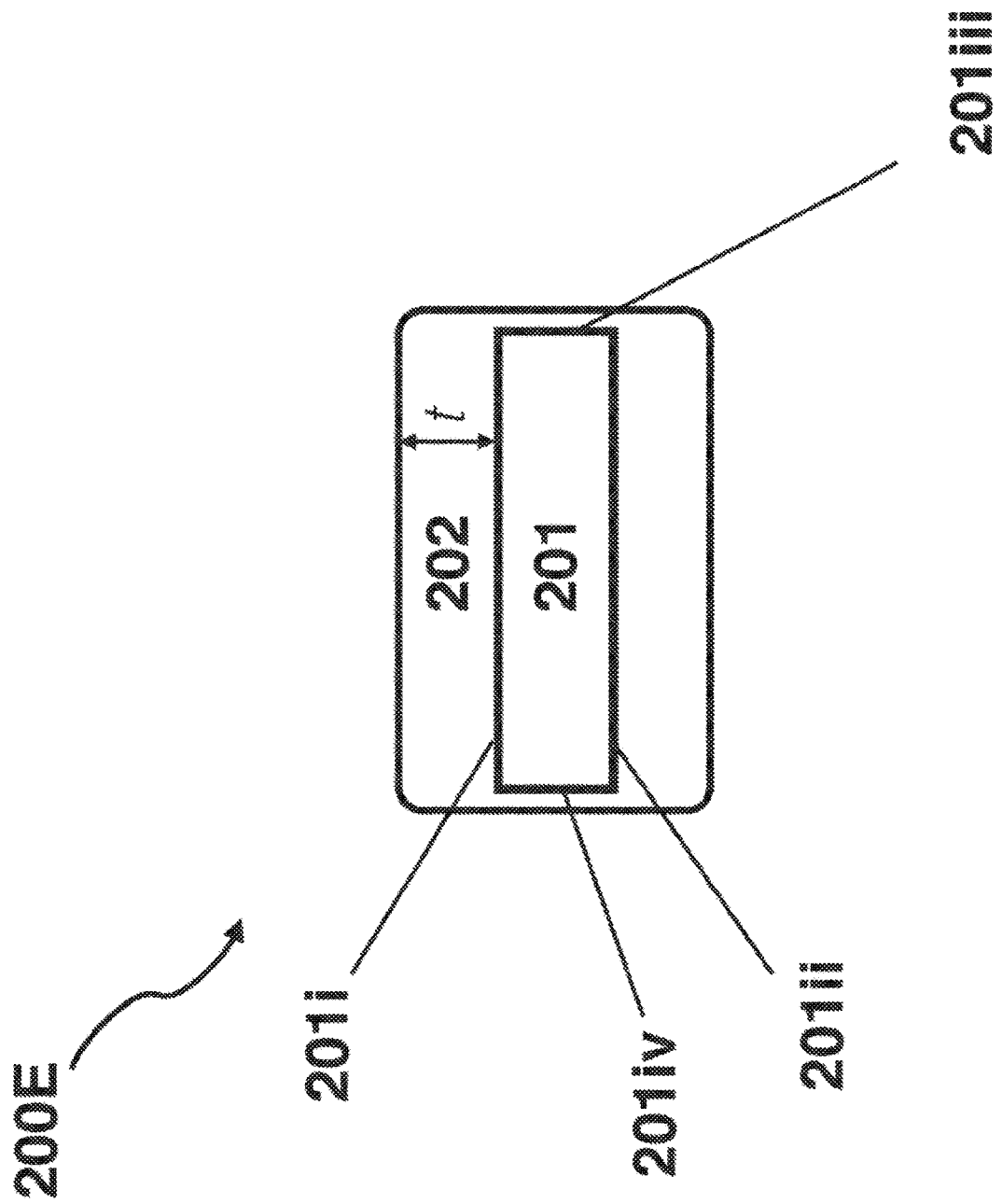

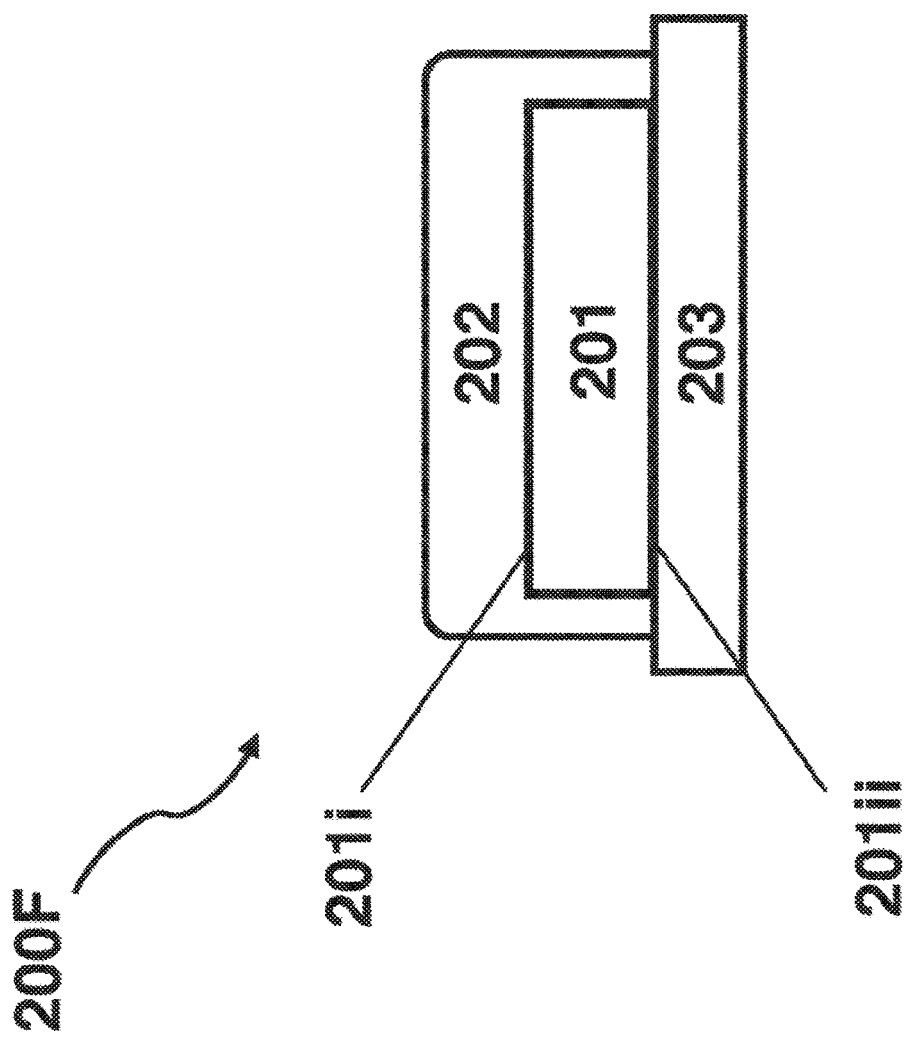

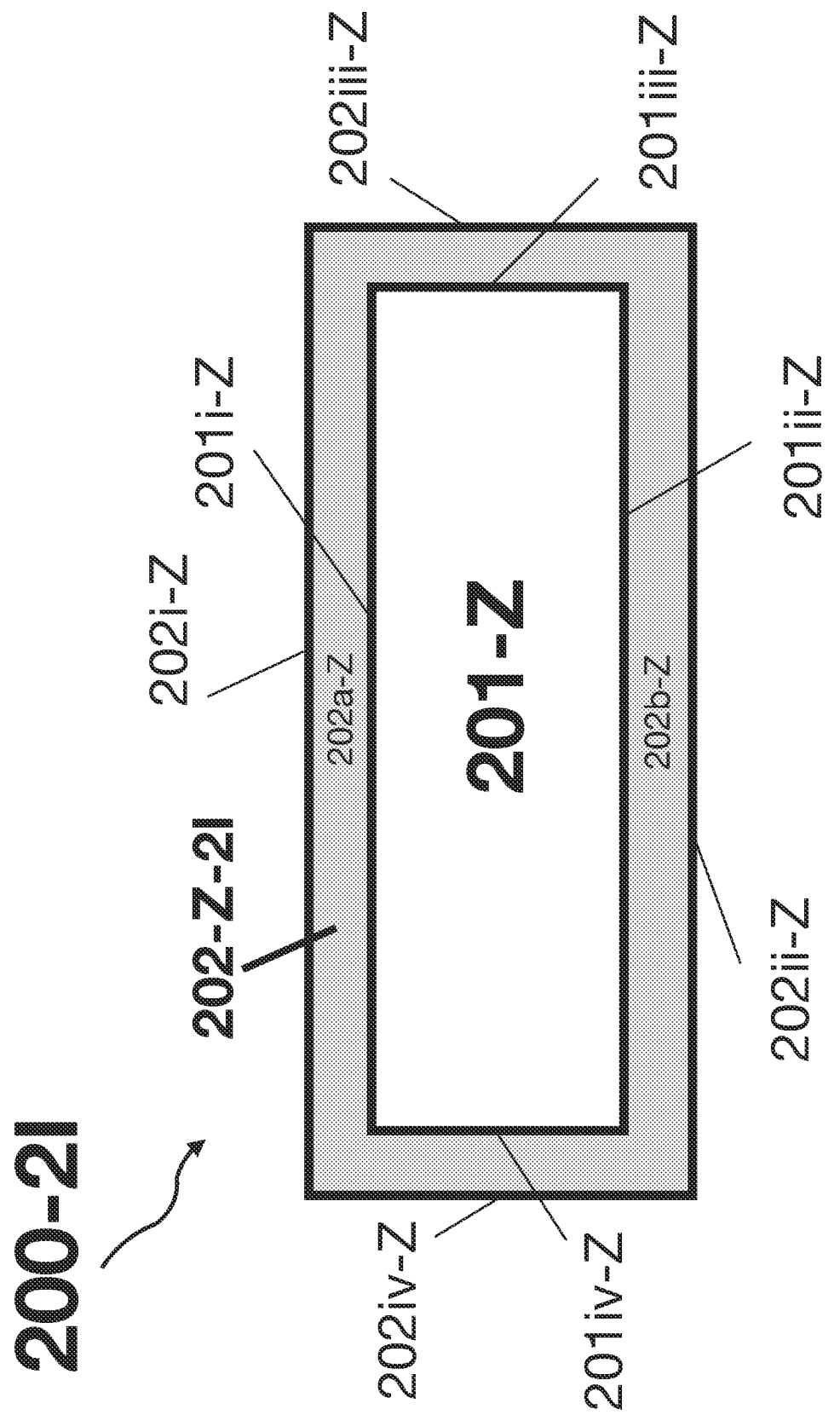

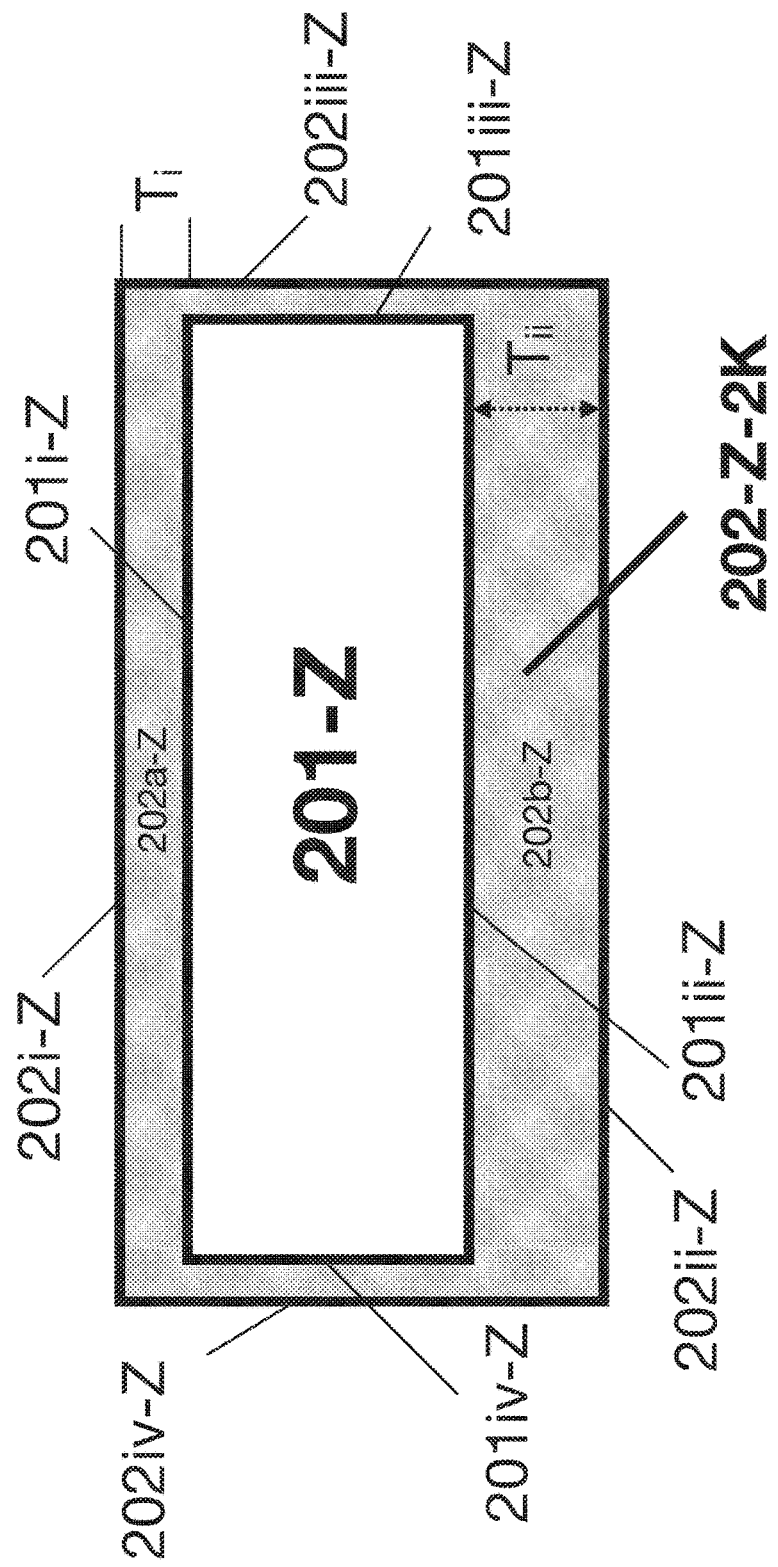

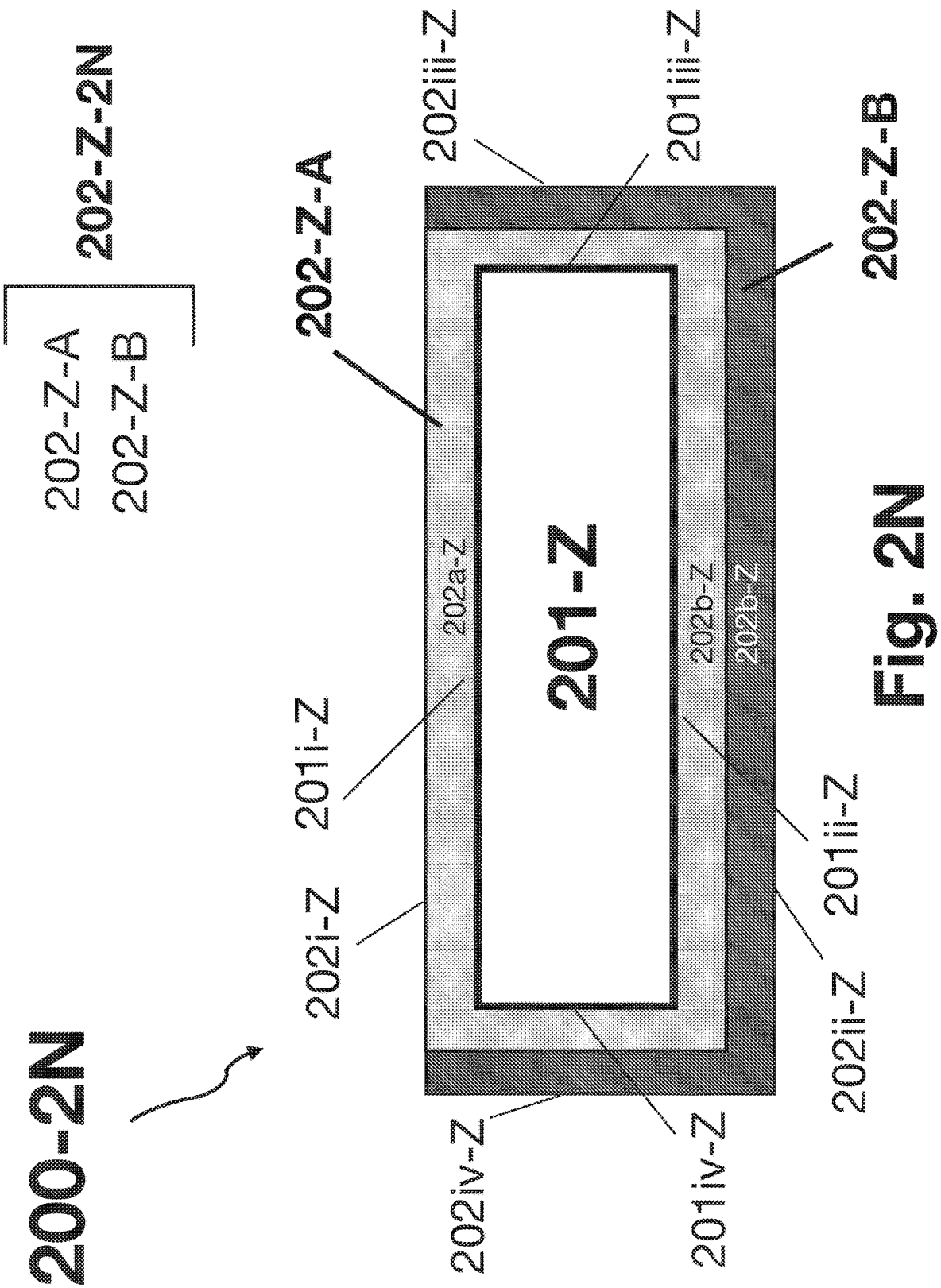

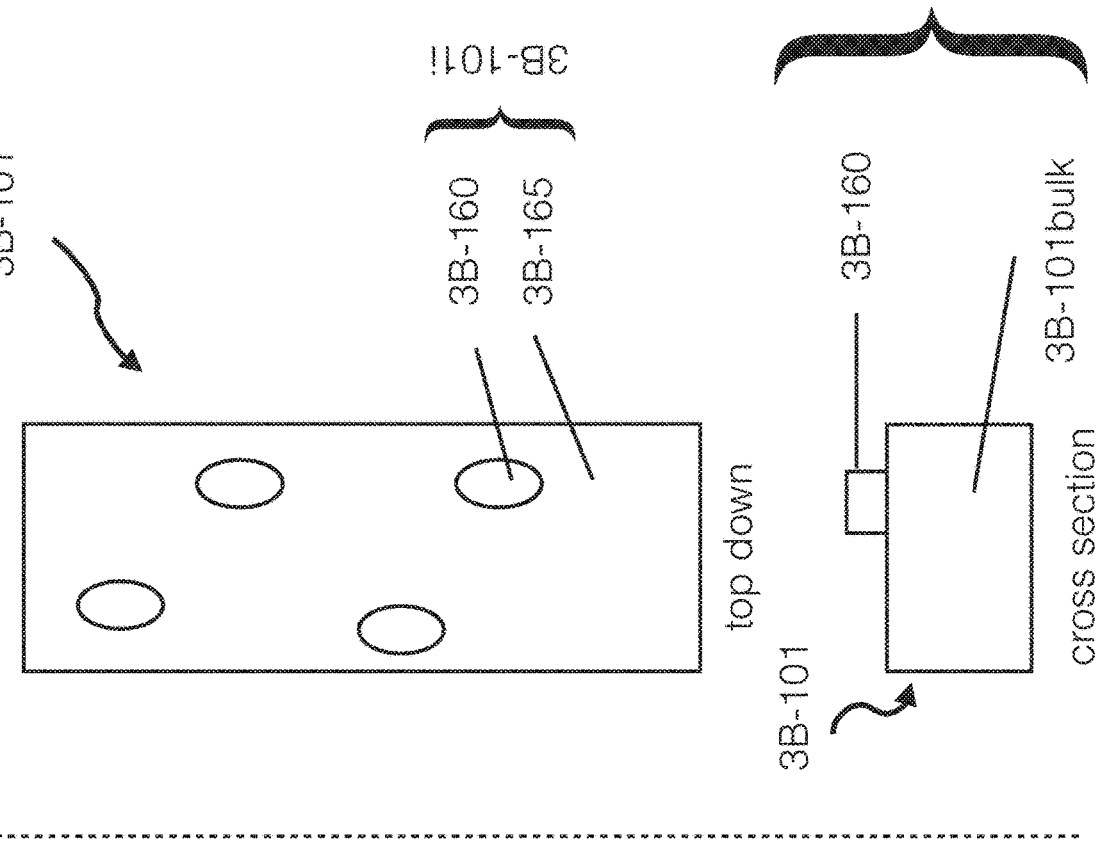
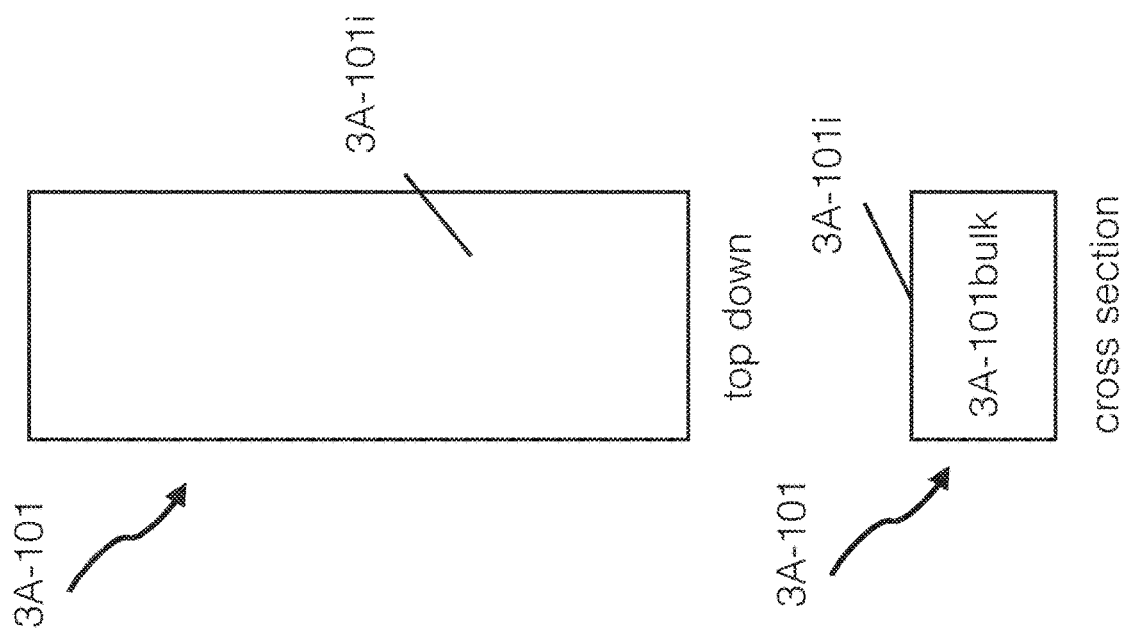

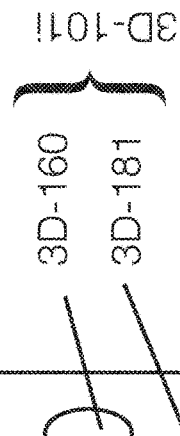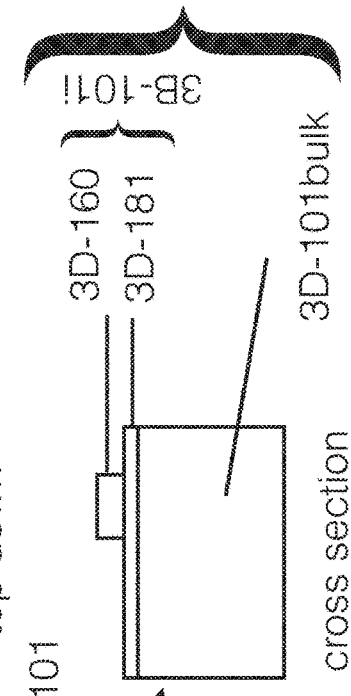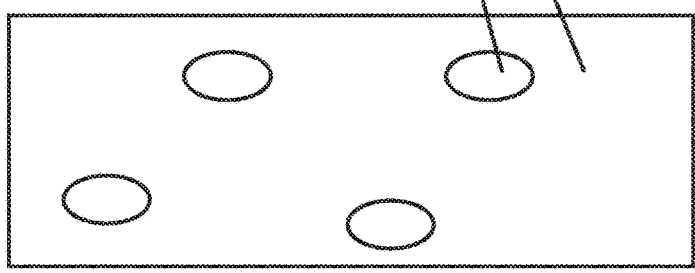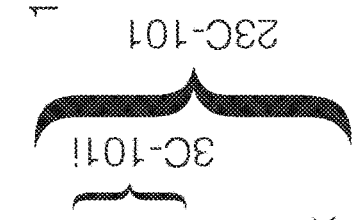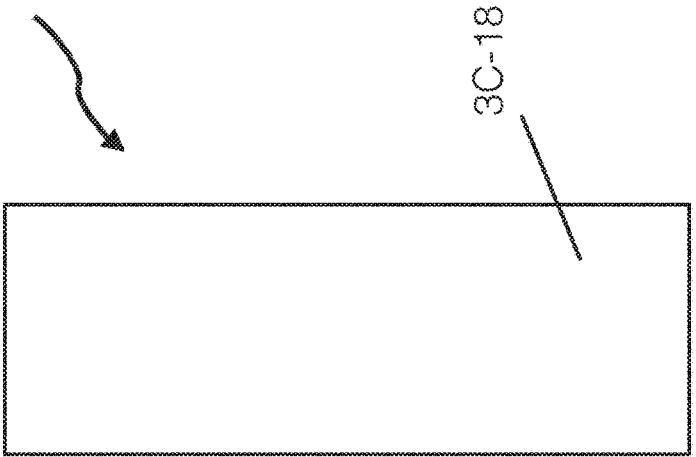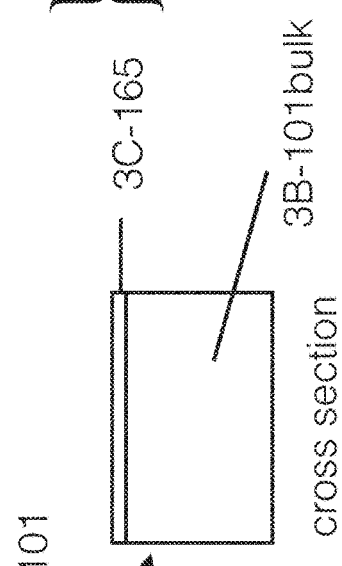

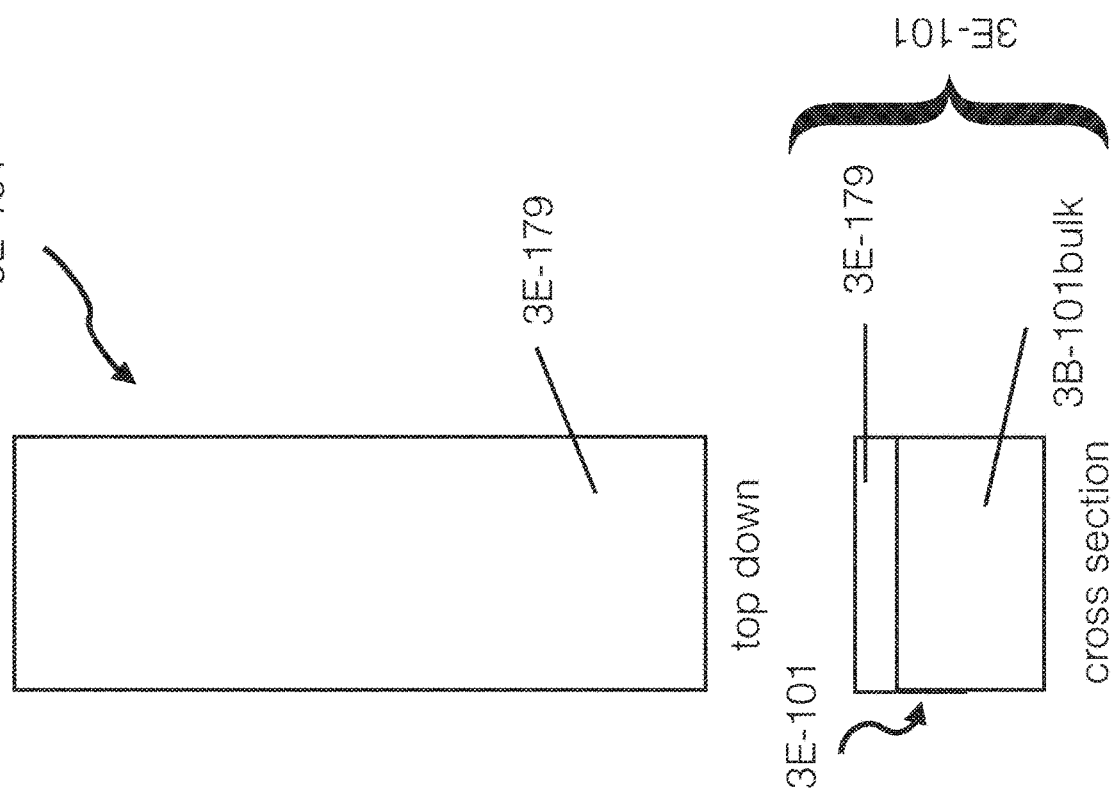

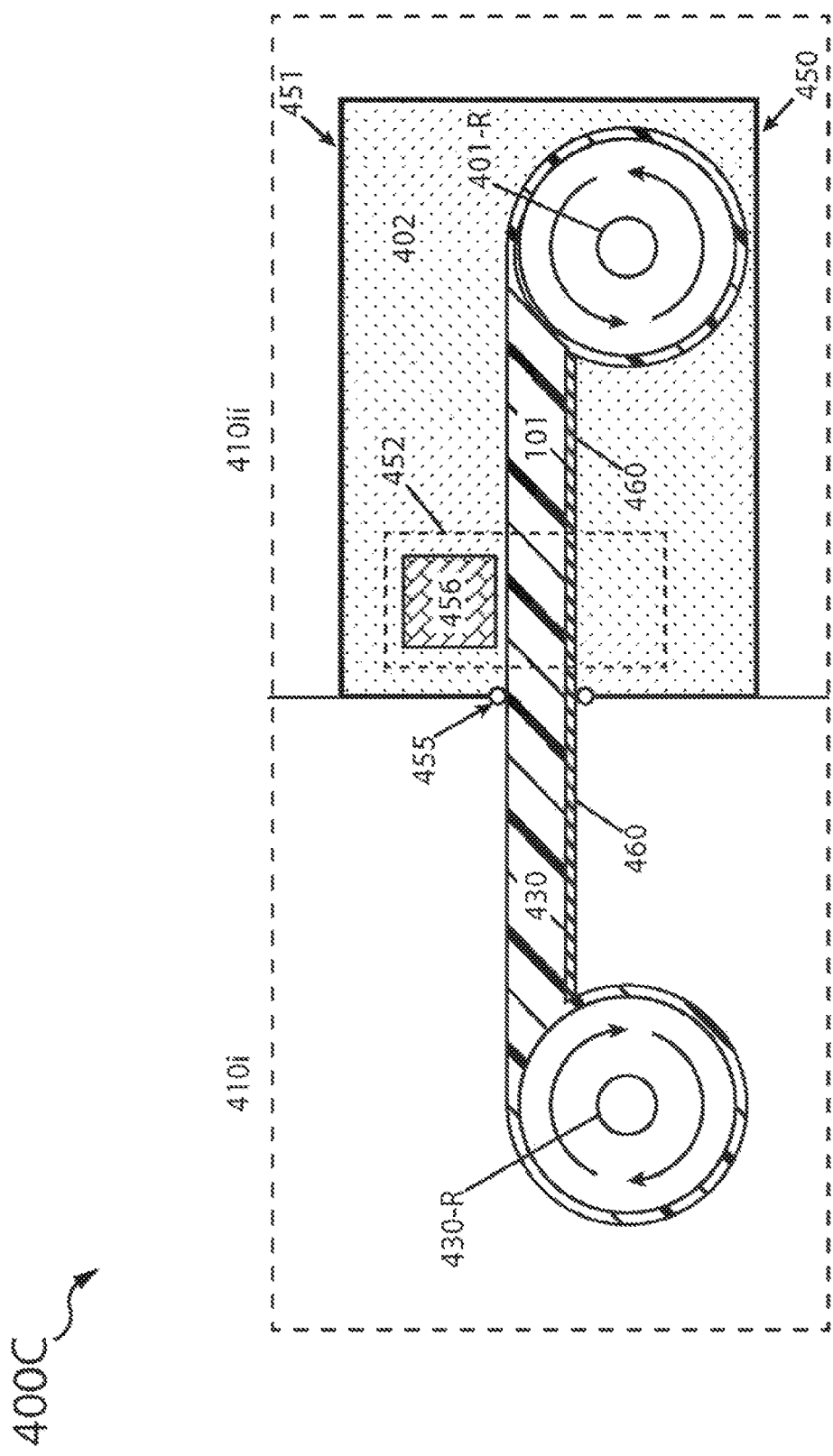

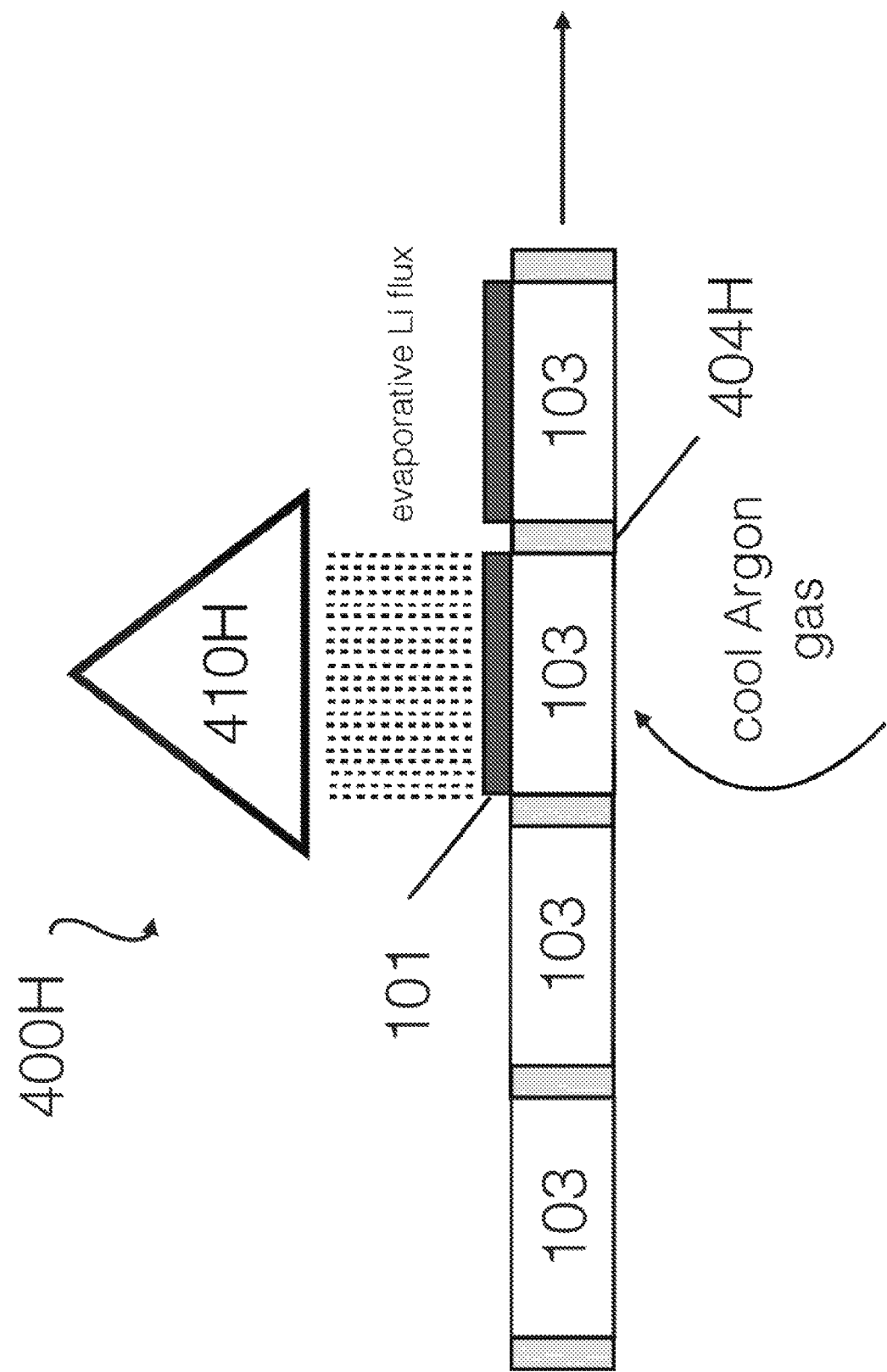

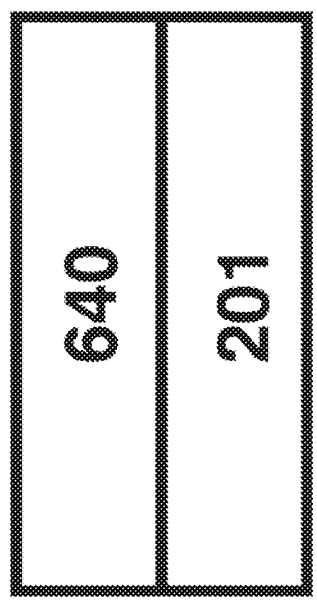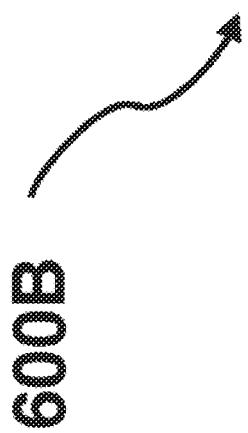
Fig. 6B

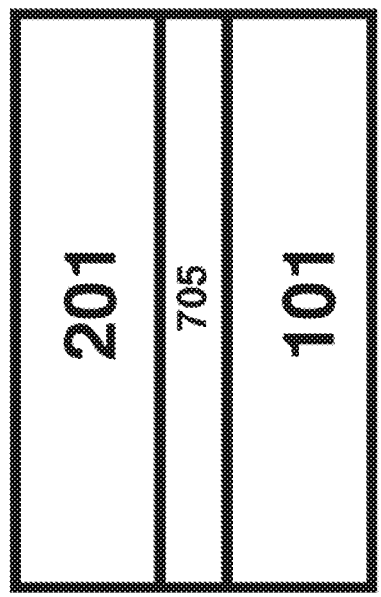
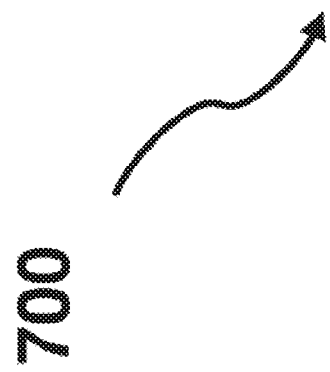
Fig. 7

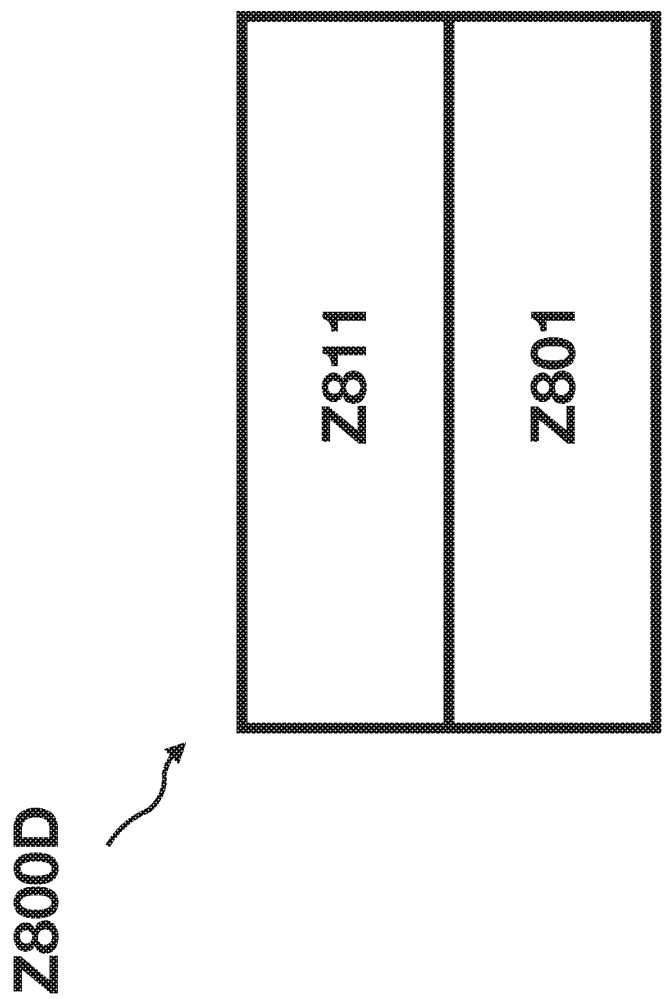

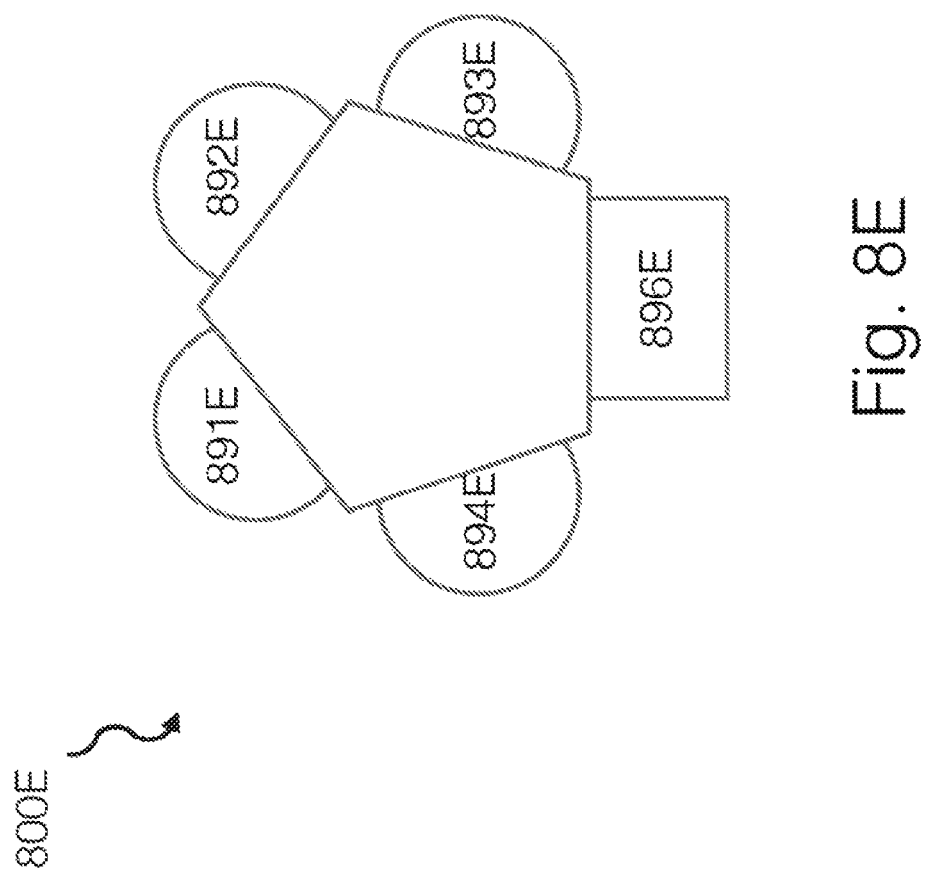

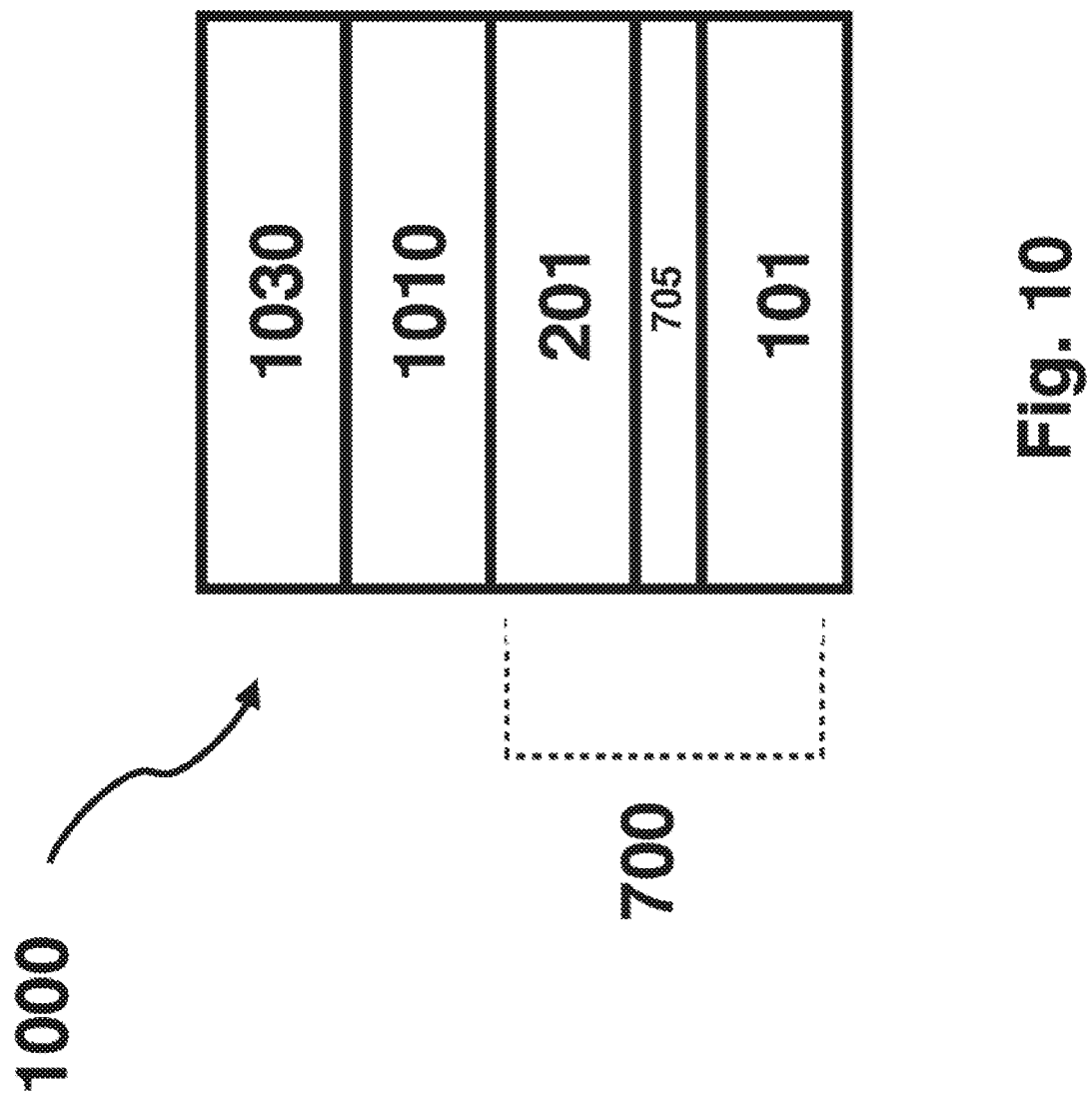

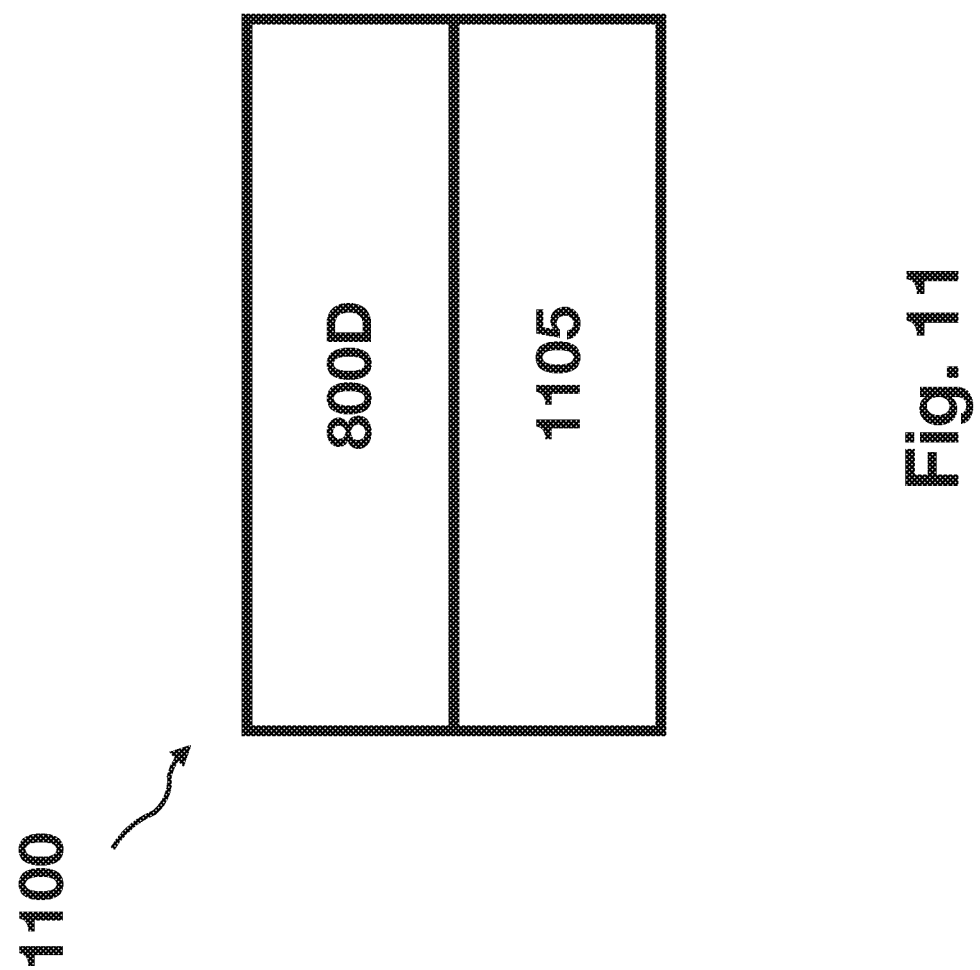

ENCAPSULATED SULFIDE GLASS SOLID ELECTROLYTES AND SOLID-STATE LAMINATE ELECTRODE ASSEMBLIES

CROSS-REFERENCE TO RELATED APPLICATIONS

This application claims priority to U.S. patent application Ser. No. 16/012,588, filed Jun. 19, 2018, titled ENCAPSULATED SULFIDE GLASS SOLID ELECTROLYTES AND SOLID-STATE LAMINATE ELECTRODE ASSEMBLIES; and to U.S. Provisional Patent Application Nos. 62/529,732, filed Jul. 7, 2017, titled ENCAPSULATED LITHIUM ION CONDUCTING SULFIDE GLASS SOLID ELECTROLYTE STRUCTURES; 62/534,624, filed Jul. 19, 2017, titled SOLID-STATE LAMINATE ELECTRODE ASSEMBLIES AND METHODS OF MAKING INCLUDING EVAPORATION, ENCAPSULATION AND/OR ALD; 62/620,958, filed Jan. 23, 2018, titled SOLID-STATE LAMINATE ELECTRODE ASSEMBLIES AND METHODS OF MAKING; and 62/669,592, filed May 10, 2018, titled SURFACE ENCAPSULATED SULFIDE GLASS SOLID ELECTROLYTES; the disclosures of which are incorporated by reference herein in their entirety and for all purposes.

STATEMENT OF GOVERNMENT SUPPORT

This invention was made with Government support under Award No.: DE-AR0000772 awarded by the Advanced Research Projects Agency-Energy (ARPA-E), U.S. Department of Energy. The Government has certain rights in this invention.

BACKGROUND

There is a continuing need for high performance battery cells, and their associated cell components, and particularly for high energy density rechargeable lithium metal batteries.

SUMMARY

The present disclosure describes nanofilm-encapsulated solid electrolyte structures, methods of making the nanofilm-encapsulated structures, solid-state laminate electrode assemblies, various methods for making the solid-state laminate electrode assemblies and battery cells.

In one aspect the present disclosure provides methods for making a solid-state laminate electrode assembly.

In various embodiments the solid-state laminate electrode assembly comprises a lithium metal layer reactively bonded to a lithium ion conducting sulfide glass layer. Preferably, the reactive bond is sufficiently complete that it forms a continuous solid electrolyte interphase (SEI) at the boundary between the layers.

In various embodiments, to bring about a continuous SEI, the lithium metal layer should have a major surface, which, just prior to bonding (e.g., by laminating), is in a highly reactive state (i.e., it is substantially unpassivated). In various embodiments the method involves making a pristine lithium metal layer having a substantially unpassivated first major surface, and therefore highly reactive, and maintaining the highly reactive surface in its substantially unpassivated state until it has been reactively bonded with the sulfide glass layer.

In various embodiments the method comprises:
A method for making a solid-state laminate electrode assembly, the method comprising the steps of
  i) providing a lithium metal laminate structure the laminate comprising:
     a. a lithium metal layer having a first major surface that is substantially unpassivated; and
     b. an inert protective material layer that removably covers the lithium metal first major surface, the protective material layer in direct contact with the lithium first major surface;
  ii) providing an inorganic solid electrolyte laminate structure, the laminate comprising:
     a. an inorganic lithium ion conducting sulfide glass layer having a first major surface and an opposing second major surface; and
     b. an inert protective material layer that removably covers the sulfide glass first major surface, the protective material layer in direct contact with the sulfide glass;
  iii) removing the inert protective material layer from the lithium metal first major surface;
  iv) removing the inert protective material layer off the sulfide glass first major surface;
  v) reactively bonding the sulfide glass layer with the lithium metal layer via their first major surfaces; and
  wherein the reactive bond is complete and the interface between the sulfide glass layer and the lithium metal is defined by a continuous solid electrolyte interphase.

In various embodiments, the inert protective material layer on the sulfide glass first major surface is a liquid phase layer of a dry hydrocarbon liquid, and the inert protective material layer on the substantially unpassivated lithium metal first major surface is a liquid phase layer of a dry hydrocarbon liquid.

In various embodiments, the hydrocarbon liquid on the lithium metal surface is removed substantially immediately prior to the reactive bonding step, and optionally the hydrocarbon liquid on the sulfide glass is removed substantially immediately prior to reactively bonding step.

In various embodiments, the removal of the hydrocarbon liquid is accelerated by the application of one or more heat (conductive or convective), vacuum suction, blowing a jet of dry Ar or He, and blowing a jet of high vapor pressure protective liquid followed by vacuum suction.

In various embodiments, the step of cleaning the major surface of the sulfide glass layer under an Argon plasma, by ion etching; wherein the cleaning step is performed after the liquid phase layer of protective fluid has been removed.

In various embodiments, the step of treating the clean first major surface of the sulfide glass under a Nitrogen containing plasma, wherein the treatment modifies the surface composition of the sulfide glass by introducing Nitrogen into/onto the glass surface.

In various embodiments, the step of treating the clean sulfide glass first major surface to form a precursor film consisting of 1 to 5 monolayers of a halogen (e.g., iodine) or an interhalogen, or nitrogen onto the clean glass surface, wherein the monolayer(s) react with lithium on bonding to form a solid electrolyte interphase.

In various embodiments, the step of treating the clean sulfide glass first major surface to form a precursor film of Nitrogen molecules on the glass surface.

In various embodiments, the solid electrolyte interphase comprises $Li_3N$.

In various embodiments, a method of making a lithium metal layer having a substantially unpassivated first major surface, and preferably a pristine surface, includes extruding lithium metal directly into a liquid phase of protective fluid (e.g., super dry liquid hydrocarbon).

In various embodiments, a method of making a lithium metal layer having a substantially unpassivated first major surface, and preferably a pristine surface, includes extruding lithium metal and substantially immediately covering the freshly formed lithium metal surfaces with a liquid phase protective fluid.

In various embodiments, the extrusion comprises at least two extrusions performed by roll reduction, and the as-extruded lithium metal layers are substantially immediately covered in liquid phase protective fluid right after each roll reduction step, and maintained under liquid phase protective fluid throughout the process.

In various embodiments, the lithium metal layer is in the form of a long continuous roll, and the method further comprises the step of placing the lithium metal roll into a hermetic canister filled with liquid phase protective fluid, the lithium metal layer completely immersed within the protective fluid.

In various embodiments, the substantially unpassivated first major surface of the lithium metal layer has never been in direct touching contact with a gas phase atmosphere or vacuum.

In various embodiments, a lithium metal laminate structure is provided. The laminate includes:
  i) a lithium metal layer having a first and second major surface, wherein the first major surface is substantially unpassivated; and
  ii) a protective material layer that removably covers and protects the lithium first major surface in direct contact.

In various embodiments, the substantially unpassivated lithium metal surface is stable.

In various embodiments, the protective material layer is a liquid phase hydrocarbon liquid, preferably super dry.

In various embodiments, a lithium metal laminate structure is formed via thermal evaporation of lithium metal onto a substrate, and then substantially immediately covering the fresh formed lithium metal layer with a protective material layer (e.g., a liquid phase hyrdrocarbon liquid). In some embodiments the substrate on which the lithium metal layer is formed is copper foil. In other embodiments the substrate may be a metallized polymeric film (e.g., a PET film metallized with Cu, Ni or the like). In a particular embodiment the liquid phase hydrocarbon is applied onto the first major surface of the evaporated lithium metal layer by gravure printing the hydrocarbon liquid (i.e., via a gravure cylinder).

In various embodiments, to achieve a smooth lithium surface the evaporated lithium metal layer may be treated by ion bombarding its surface (e.g., using low-energy Argon ion bombardment). For instance, the thermal evaporator may be equipped with an ion gun that generates ions with energies of a few keV. The ion bombardment may be applied during evaporation of the lithium metal, or exclusively after the lithium metal layer has formed. The process is generally referred to as ion-beam assisted deposition (IBAD). In this instance, the ion bombardment is a process that takes place after the lithium metal layer has formed. IBAD is a process known for making optical quality mirrors, and is applied here for making a high quality and smooth lithium metal surface. Once evaporated and optionally smoothed by ion bombardment, the lithium metal surface is substantially immediately covered in protective fluid, thus forming a lithium metal laminate structure of the present disclosure. The protective fluid may be applied inside the vacuum chamber of the evaporator (and while under vacuum), or it may be applied in a dry box that is configured to receive the evaporated lithium metal layer. In various embodiments the layer of protective fluid is applied to the lithium metal surface using a gravure printing process, as described in more detail herein below.

When the lithium metal layer is formed by evaporation (e.g., thermal evaporation) its thickness is generally not greater than 10 um, and more typically not greater than 5 um (e.g., it is about 5 um, or about 4 um, or about 3 um, or about 2 um, or about 1 um). As described in more detail herein below, once the evaporated lithium metal layer is encapsulated by the protective liquid layer, it may be rolled or otherwise covered with a solid material release layer to form a lithium metal laminate structure having a wet-decal architecture as described in detail herein below.

In various embodiments the solid-state laminate electrode assembly of the present disclosure is formed by depositing lithium metal onto a freestanding (or freestandable) sulfide solid electrolyte glass layer (e.g., a sulfide glass sheet) or directly onto a nanofilm-encapsulated sulfide glass solid electrolyte sheet (as described herein below) using a physical vapor deposition technique such as evaporation or sputtering (e.g., thermal evaporation), the sulfide glass sheet (e.g., nanofilm-encapsulated) serves as the substrate for lithium deposition).

When referring to the sulfide glass sheet as "freestanding" or "freestandable" it is meant that the sheet is a self-supporting layer that displays a mechanical strength (e.g., tensile strength) sufficient to allow it (the sheet) to remain intact in the absence of a substrate (i.e., self-supporting), and thereby the freestanding solid electrolyte sheet is not dependent upon another self-supporting layer for its continuous intact existence (e.g., a positive or negative electrode layer or an inert carrier film). Accordingly, in various embodiments the instant freestanding solid electrolyte sulfide glass sheet is "substrate-less."

In some embodiments it is contemplated that the lithium metal layer may be thermally evaporated directly onto the glass first major surface, or a precursor film (as described above and below) may be applied to the glass first major surface, and the lithium metal layer deposited onto the precursor film to form an engineered solid electrolyte interphase (SEI) having improved electrochemical properties.

When thermally evaporating the lithium metal layer onto the freestanding sulfide glass sheet (e.g., a nanofilm-encapsulated glass sheet, as described herein below), care is to be taken to ensure that the sulfide glass does not devitrify and the sheet's first major surface is not damaged by the evaporation (e.g., thermally damaged). In various embodiments the sulfide glass substrate sheet (e.g., nanofilm-encapsulated) is actively cooled during thermal evaporation of lithium metal. Preferably, the temperature of the sulfide glass sheet is at a temperature of 100° C. or less during the evaporation process. By "actively cooled" it is meant that the sulfide glass sheet is cooled while the evaporation of lithium metal is taking place. In various embodiments the substrate (i.e., the sulfide glass sheet) is positioned in a material frame (e.g., a ceramic frame) and while lithium metal is coated onto the first major surface (or precursor film), the opposing second major surface is actively cooled (e.g., by flowing a cool inert gas in direct contact with the second major surface). Typically the cool inert gas is cold Argon, and preferably obtained from a cryogenic Argon tank. For instance, the inert gas (e.g., cool Argon gas) contacts the sulfide glass second major surface and it (the gas) is applied to the surface at a temperature that is no greater than 10° C., or no greater than 0° C., or no greater than −10° C., or no greater than −20° C. When actively cooling the sulfide glass sheet during evaporation, the sheet is preferably release-ably sealed to the ceramic frame in order to prevent the cool Argon gas from releasing into the vacuum chamber of the evaporator or from diffusing into the evaporating lithium flux (e.g., the edges of the glass sheet glued to the frame, such as with an epoxy). In various embodiments several frames are incorporated into a cassette of frames, to allow for multiple evaporations in a single run. In other embodiments the sulfide glass sheet may be passively cooled, which is to mean cooled to a temperature below 15° C. prior to evaporating the lithium metal onto the glass first major surface. Typically when passively cooled the sulfide glass sheet is at a temperature that is less than 10° C. prior to evaporation, or less than 0° C., or less than −10° C., or less than −20° C. In some embodiments the substrate is both actively cooled and passively cooled as described above. In other embodiments the substrate is exclusively passively cooled (i.e., passively cooled and not actively cooled), or vice versa exclusively actively cooled.

In various embodiments, an inorganic solid electrolyte laminate structure is provided. The laminate includes:
 i) a lithium ion conducting sulfide glass layer having a first and second major surface; and
 ii) a protective material layer that removably covers and protects the sulfide glass first major surface.

In various embodiments, the protective material layer is a liquid phase hydrocarbon liquid, preferably super dry.

In various embodiments, a method for storing a solid-state laminate electrode assembly is provided. The method includes making a solid-state laminate electrode assembly as described herein, and immersing the laminate electrode assembly into a bath of a liquid phase protective fluid (e.g., a super dry liquid hydrocarbon).

In various embodiments, a method for storing a lithium metal layer having a substantially unpassivated first major surface is provided. The method includes making the substantially unpassivated first major surface, and immersing the lithium metal layer into a bath of a liquid phase protective fluid (e.g., a super dry liquid hydrocarbon).

In various embodiments, a method for storing a sulfide glass layer having a clean first major surface is provided. The method includes cleaning the first major surface in an Argon plasma, and immersing the sulfide glass layer into a bath of a liquid phase protective fluid (e.g., a super dry liquid hydrocarbon)

In another aspect the present disclosure provides nanofilm-encapsulated sulfide based solid electrolyte structures that are resistant to chemical degradation by atmospheric moisture. In accordance with the present disclosure, the moisture resistant solid electrolyte structures are composed of a moisture sensitive and dense inorganic lithium ion conducting sulfide solid electrolyte layer (e.g., a lithium ion conducting sulfide glass sheet) encapsulated on all, or some, of its surfaces by a continuous inorganic nanofilm that is dense, pinhole free and conforms to the glass surfaces of the sulfide sheet, and thereon provides a moisture barrier that protects the encapsulated surfaces from reacting with ambient moisture during storage or manufacture.

In various embodiments the moisture barrier provided by the continuous nanofilm is sufficiently water impervious to prevent egress of hydrogen sulfide gas during manufacture in a controlled atmosphere dry box or dry room (e.g., the atmosphere having a dew point of −20° C. or lower, or −40° C. or lower, or −60° C. or lower). In various embodiments, the nanofilm is configured as a moisture barrier and does not impart a large area specific resistance (ASR); e.g., the ASR of the nanoencapsulated sulfide glass solid electrolyte sheet is less than 200 $\Omega$-cm$^2$, when measured in a battery cell at room temperature; and preferably less than 100 $\Omega$-cm$^2$, and even more preferably less than 50 $\Omega$-cm$^2$.

In various embodiments, the nanofilm-encapsulation is configured to impart water imperviousness and to enhance mechanical strength. For instance, in various embodiments the the nanofilm-encapsulation increases the flexural strength of the sulfide glass sheet by greater than 30%, preferably greater than 50%, and even more preferably greater than 100%.

In various embodiments the nanofilm-encapsulated sulfide glass sheet, as described herein, and in the claims, is, itself, a discrete battery cell separator component, and thus not yet disposed in a battery cell or combined with an electroactive material layer (e.g., when forming a solid-state laminate electrode assembly). For instance, the discrete nanofilm-encapsulated sulfide glass sheet may be in the form of a continuous web, and optionally wound and disposed for storage and/or manufacture as a roll of battery separator.

In various embodiments, the nanofilm-encapsulated sulfide glass solid electrolyte sheet is made by depositing onto the sulfide glass sheet a continuous inorganic nanofilm that encapsulates, in direct contact, the first and second major opposing surfaces of the sulfide sheet, as well as one or more peripheral edge surfaces. In some embodiments, when the sulfide sheet is of a substantially rectangular shape, the continuous inorganic nanofilm is configured to encapsulate, in direct contact, the major opposing surfaces of the sulfide glass sheet, and the opposing lengthwise edge surfaces, but not necessarily the opposing widthwise edge surfaces. In other embodiments the sulfide glass sheet is fully encapsulated on all surfaces by the inorganic nanofilm, including all peripheral edge surfaces (lengthwise and widthwise edge surfaces).

In various embodiments, the continuous and conformal nanofilm is a continuous inorganic nanolayer having a substantially uniform composition and thickness as a function of its position on the surface of the glass sheet.

In various embodiments the continuous nanofilm is composed of two or more continuous inorganic nanolayers, which are configured, relative to each other and the surface of the sulfide glass sheet, to provide a moisture barrier and one or more performance advantages, including enhanced mechanical strength (e.g., a 30% increase in flexural strength), reduced interface resistance in contact with lithium metal, and/or improved chemical resistance to liquid electrolytes (e.g., the encapsulation leading to zero dissolution of sulfur), and/or oxidative stability in direct contact with electroactive cathode materials.

In various embodiments the encapsulating nanofilm is formed onto the sulfide glass sheet by a technique known as atomic layer deposition (ALD), and to a thickness that is typically less than 100 nm (e.g., about 1 nm or less, or about 2 nm, or about 5 nm, or about 10 nm, or about 20 nm, or about 30 nm, or about 40 nm, or about 50 nm, or about 60 nm, or about 70 nm, or about 80 nm, or about 90 nm, or about 100 nm). In various embodiments, the surfaces of the sulfide glass sheet are cleaned by ion etching (e.g., in Argon plasma) prior to ALD deposition of the nanofilm, In another aspect the present disclosure provides a solid-state laminate electrode assembly composed of the nano-encapsulated sulfide glass sheet structure, as described above, and a lithium metal layer on a first major surface of the sulfide glass sheet. The lithium metal layer is in direct intimate contact with the encapsulating nanofilm.

In various embodiments the lithium metal layer may be deposited onto the first major surface of the nano-encapsulated sulfide glass sheet by thermal evaporation of lithium metal directly onto the nanofilm. In other embodiments the lithium metal layer may be laminated to the first major surface of the encapsulated sulfide glass sheet structure, in direct contact with the surface of the nanofilm. When thermally evaporated the thickness of the lithium metal layer is generally not greater than 10 um, and more typically not greater than 5 um.

In another aspect the present disclosure provides a battery cell that incorporates the nanofilm-encapsulated sulfide glass solid electrolyte structure as a solid electrolyte separator In various embodiments the material composition of the nanofilm or nanolayer is an insulator in bulk form, but is transparent or permeable to lithium ions as a nano layer.

These and other aspects of the present disclosure are described in further detail below, including with reference to the drawings.

BRIEF DESCRIPTION OF THE DRAWINGS

FIG. 1 is a process flow diagram for making a solid-state laminate electrode assembly in accordance with one embodiments of the present disclosure.

FIGS. 2A-D illustrate cross sectional depictions of standalone alkali metal laminate structures in accordance with various embodiments of the present disclosure.

FIGS. 2E-H illustrate cross sectional depictions of standalone inorganic solid electrolyte laminate structures in accordance with various embodiments of the present disclosure.

FIGS. 2I-P illustrate cross sectional depictions of nanofilm-encapsulated sulfide glass separator sheets in accordance with various embodiments of the present disclosure.

FIGS. 3A-E illustrate cross sectional and top down depictions of lithium metal layers and lithium metal surfaces.

FIGS. 4A-G illustrate apparatus and method for making a lithium metal layer having substantially unpassivated surfaces, in accordance with various embodiments of the present disclosure.

FIGS. 4H-J illustrate apparatus, methods and tools for making a lithium metal layer by evaporation and having substantially unpassivated surfaces, in accordance with various embodiments of the present disclosure.

FIG. 6B illustrates a cross sectional depiction of an inorganic solid electrolyte layer coated with a thin precursor film, in accordance with one embodiment of the present disclosure.

FIG. 7 illustrates a cross sectional depiction of a solid-state laminate electrode assembly in accordance with one embodiment of the present disclosure.

FIG. 8D illustrates cross sectional depictions of solid-state laminate electrode assemblies in accordance with one embodiment of the present disclosure.

FIG. 8E illustrates an arrangement of a combination apparatus (or tool) suitable for thin film fabrication methods described herein, including ALD tool, a lithium thermal evaporation tool, and an Argon plasma ion etch tool for cleaning sulfide glass surfaces.

FIG. 10 illustrates a cross sectional depiction of a battery cell in accordance with one embodiment of the present disclosure.

FIG. 11 illustrates a cross sectional depiction of a battery cell in accordance with one embodiment of the present disclosure.

DETAILED DESCRIPTION OF SPECIFIC EMBODIMENTS

Figure 2A:
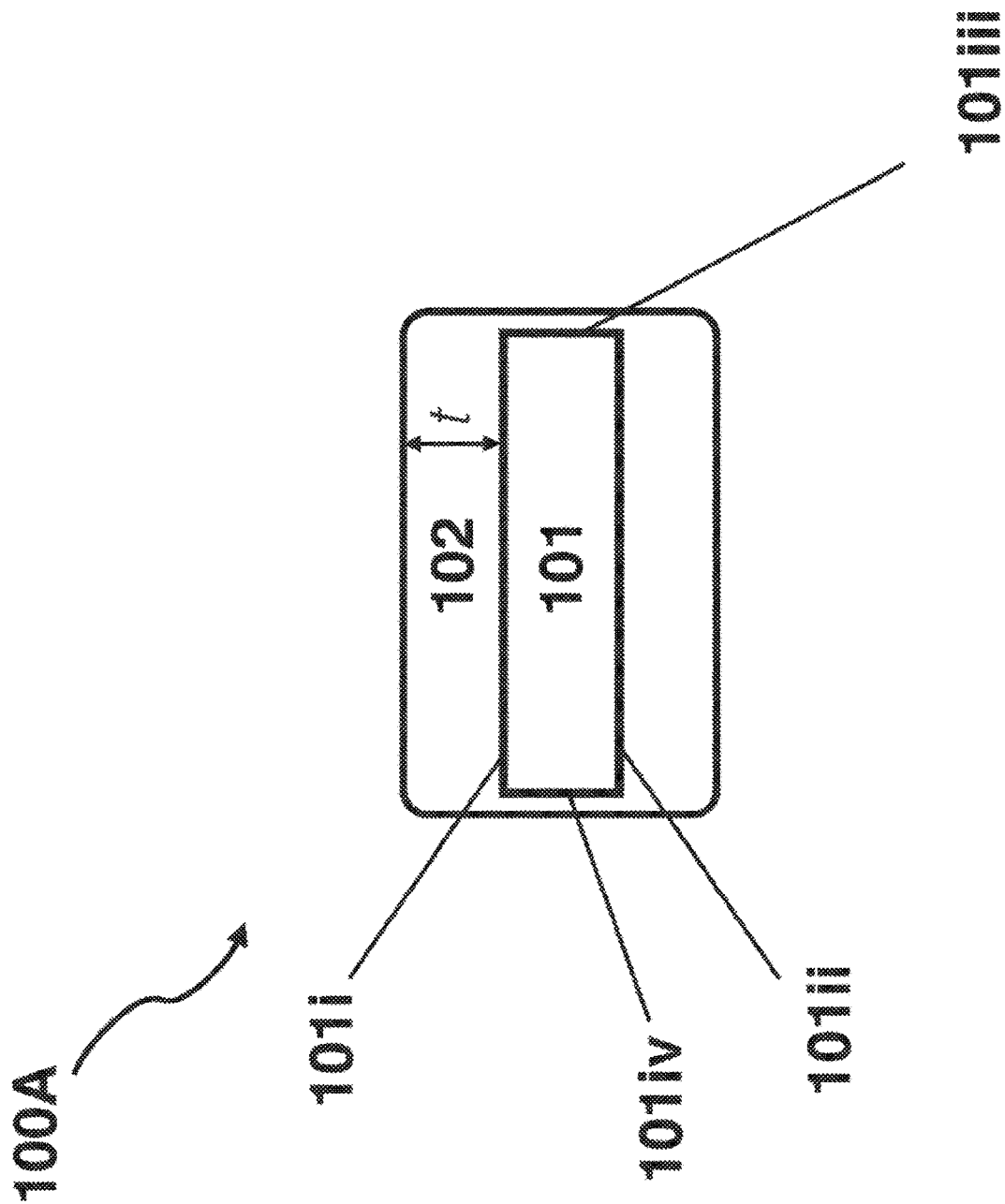

Reference will now be made in detail to specific embodiments of this disclosure. Examples of the specific embodiments are illustrated in the accompanying drawings. While this disclosure will be described in conjunction with these specific embodiments, it will be understood that it is not intended to limit this disclosure to such specific embodiments. On the contrary, it is intended to cover alternatives, modifications, and equivalents as may be included within the spirit and scope of this disclosure. In the following description, numerous specific details are set forth in order to provide a thorough understanding of this disclosure. This disclosure may be practiced without some or all of these specific details. In other instances, well known process operations have not been described in detail in order to not unnecessarily obscure this disclosure.

Introduction

The present disclosure describes solid-state laminate electrode assemblies and various methods for making the solid-state laminate electrode assemblies.

In various embodiments the solid-state laminate electrode assembly comprises a lithium metal layer reactively bonded to a lithium ion conducting sulfide glass layer. Preferably, the reactive bond is sufficiently complete that it forms a continuous solid electrolyte interphase (SEI) at the boundary between the layers.

In various embodiments, to bring about a continuous SEI, the lithium metal layer should have a major surface, which, just prior to bonding (e.g., by laminating), is in a highly reactive state (i.e., it is substantially unpassivated). In various embodiments the method involves making a pristine lithium metal layer having a substantially unpassivated first major surface, and therefore highly reactive, and maintaining the highly reactive surface in its substantially unpassivated state until it has been reactively bonded with the sulfide glass layer.

In various embodiments, the present disclosure provides methods for making a solid-state laminate electrode assembly. Such a method includes:

ii) providing a lithium metal laminate structure the laminate comprising:
  a. a lithium metal layer having a first major surface that is substantially unpassivated; and
  b. an inert protective material layer that removably covers the lithium metal first major surface, the protective material layer in direct contact with the lithium first major surface;
ii) providing an inorganic solid electrolyte laminate structure, the laminate comprising:
  c. an inorganic lithium ion conducting sulfide glass layer having a first major surface and an opposing second major surface; and
  d. an inert protective material layer that removably covers the sulfide glass first major surface, the protective material layer in direct contact with the sulfide glass;
iii) removing the inert protective material layer off the lithium metal first major surface;
iv) removing the inert protective material layer off the sulfide glass first major surface;
v) reactively bonding the sulfide glass layer with the lithium metal layer via their first major surfaces; and wherein the reactive bond is complete and the interface between the sulfide glass layer and the lithium metal is defined by a continuous solid electrolyte interphase.

In various embodiments the reactive bonding step is a lamination process performed in a chamber filled with a dry gas (e.g., dry Argon). Typically the laminating step involves applying both heat and pressure.

In various embodiments the inert protective material layer removably covering one or both of the sulfide glass first major surface and the substantially unpassivated lithium metal surface is a liquid phase protective fluid.

In various embodiments the liquid phase protective fluid removably covering the lithium metal surface is removed just prior to the reactive bonding step (e.g., the period of time between removing the liquid phase protective fluid and reactive bonding is less than 10 seconds, and preferably less than 5 seconds, and even more preferably less than 2 seconds).

In various embodiments to ensure that the interface formed between the lithium metal layer and the lithium ion conducting sulfide glass is electrochemically operable or otherwise optimized, an SEI may be engineered by coating a first major surface of the sulfide glass with a thin precursor film that reacts with lithium metal during the bonding step to form a solid electrolyte interphase.

In some embodiments the sulfide glass surface may be treated under a Nitrogen containing plasma to incorporate Nitrogen into the surface of the glass, and then forming a lithium nitride.

In various embodiments the method further comprises the step of cleaning the first major surface of the sulfide glass under an Argon plasma, by ion etching, this step performed after removing the inert protective material layer off of the sulfide glass but before reactive bonding.

In various embodiments the method further comprises the step of treating the clean sulfide glass first major surface to modify its surface composition. In various embodiments the surface composition is modified by placing the clean first major surface of the sulfide glass under a Nitrogen containing plasma, wherein the treatment modifies the surface composition of the sulfide glass by introducing Nitrogen into/onto the surface.

In various embodiments the method further comprises the step of coating the clean sulfide glass first major surface with a thin precursor film having a composition that will react in direct contact with lithium metal.

In various embodiments the thin precursor film is formed by condensing between 1 to 5 monolayers of a Halogen (e.g., iodine) or Interhalogen or Nitrogen onto the clean sulfide glass surface; wherein the iodine monolayers leads to reactive wetting during the reactive bonding step.

In various embodiments the method further comprises coating the clean sulfide glass surface to form a precursor film that reacts with lithium during the reactive bonding step to form a solid electrolyte interphase between the lithium metal layer and sulfide glass layer.

In various embodiments the inert protective material layer removably covering one or both of the sulfide glass first major surface and the substantially unpassivated lithium metal surface is a liquid phase protective fluid.

In one aspect the present disclosure provides methods for making a pristine lithium metal layer having a substantially unpassivated first major surface, as defined herein below. In various embodiments the opposing second major surface of the pristine lithium metal layer is adhered to a current collector (e.g., a copper foil)

In various embodiments the pristine lithium metal layer is in the form of a long continuous roll of lithium that is immersed in liquid phase protective fluid for storage and/or downstream processing of battery cells (e.g., the pristine lithium metal layer at least 100 cm in length).

In various embodiments the method involves making the pristine lithium metal layer in a protective inert fluid, and maintaining the pristine lithium metal layer in protective fluid (e.g., protective liquid) to prevent directly exposing the surface to the ambient gaseous atmosphere (including dry Argon of a glove box or dry Air of a dry room). In various embodiments the protective fluid is an inert liquid or the vapor of an inert liquid (i.e., protective vapor). In various embodiments the lithium metal layer is in the form of a long continuous ribbon (e.g., more than 50 cm in length).

In various embodiments the method for making the substantially unpassivated lithium metal surface includes an extrusion step that produces a fresh substantially unpassivated lithium first major surface inside or surrounded by protective fluid (e.g., a protective and super dry liquid hydrocarbon). By use of the term super dry it is meant that the amount of moisture in the liquid hydrocarbon is not greater than 0.1 ppm. In various embodiments the pristine lithium metal layer and its substantially unpassivated surface is extruded directly into liquid phase protective fluid (i.e., protective liquid), and then optionally the method further includes winding the lithium metal layer into a long continuous roll while it is immersed in liquid phase protective fluid.

In various embodiments the extrusion step is die extrusion of lithium ingot directly into a super dry liquid hydrocarbon bath. In various embodiments the extrusion step is a roller extrusion wherein the lithium metal foil thickness is roll reduced in protective liquid, and in the process forms fresh lithium substantially unpassivated lithium metal surfaces, wherein the area of the fresh surfaces so formed is proportional to the reduction in thickness of the lithium layer. In various embodiments multiple roll reduction steps are performed (e.g., 2, 3, 4 or 5 or more) in order to produce the desired thickness and to perfect the substantially unpassivated surface (e.g., a pristine surface). In various embodiments, the stock foil used for the roll reduction process has been pre-passivated, to improve reproducibility of the starting surface condition. In a particular embodiment a lithium ingot is die extruded directly into protective fluid to form a pristine lithium metal layer, and then that layer is immediately roll reduced in protective fluid to the desired thickness, and throughout the process the substantially unpassivated lithium metal surface remains covered or immersed in liquid phase protective fluid. The pristine lithium metal as formed may then be wound into a long continuous roll of pristine lithium metal, the winding performed in protective fluid (e.g., the winding performed inside liquid phase protective fluid).

In various embodiments the substantially unpassivated lithium metal surfaces are stored in a canister of protective liquid, or they are formed and immediately transferred into the canister, without exposing the surfaces to the ambient gaseous environment.

In another aspect the present disclosure provides a standalone electrochemical material laminate structure for maintaining a major surface of a battery active material layer in a substantially unpassivated and/or substantially uncontaminated condition during handling, storage and/or battery cell fabrication.

In various embodiments the battery active material layer reacts with water and/or Oxygen, and even under fairly dry ambient conditions, such as that of a dry air room or a dry Argon filled glove box the battery material surfaces chemically degrade or passivate rather quickly. The laminate structures of the present disclosure protect the battery material surfaces by encapsulating them underneath an inert removable layer, which inhibits moisture and/or oxygen from reaching the surfaces.

Accordingly, the standalone electrochemical material laminate structures of the present disclosure are particularly useful for making, storing and transporting moisture sensitive battery active material layers, and for making downstream battery cells and laminate electrode assemblies from those material layers.

In accordance with the present disclosure, a standalone electrochemical material laminate structure may be composed of two or more continuous material layers, wherein at least one of the material layers (i.e., a first material layer) is a "battery active solid material" having a clean (i.e., substantially uncontaminated) and/or substantially unpassivated surface, and another material layer (i.e., a second material layer) is a "protective material" that is inert, not battery active, and removably covers, in direct contact, a first major surface of the battery active material.

When referring to a material as "battery active" it generally means that the material is active in an electrochemical sense and useful in a battery cell (i.e., it is either an electro-active material or an electrolyte material). As used herein, the term "battery active solid material layer" means either a solid alkali metal or an inorganic solid electrolyte having utility as a continuous solid layer in a battery cell (e.g., a lithium metal layer or a Li-ion conducting sulfide glass sheet, respectively).

In contrast to the battery active material layer, the protective material layer is inert and not battery active. By use of the term "inert" it means that the referenced inert material does not chemically react in contact with the battery active solid material on which it is intended to protect. And when referring to the protective material layer as "not battery active," it is meant that the material layer is not useful in a battery cell, and is furthermore not intended for use in a battery cell, and not active in a battery/electrochemical sense (i.e., not an electroactive material or alkali metal ion conductor).

In accordance with the present disclosure the protective material layer: i) provides an encapsulating barrier against direct touching exposure between the first major surface of the battery active material layer and the ambient gaseous atmosphere or contaminants in a vacuum chamber about the layer; ii) is inert in direct contact with the first major surface; and iii) is readily removed without physically damaging the surface. To achieve these objectives, in various embodiments the protective material layer is an inert liquid (e.g., a super dry hydrocarbon liquid) that encapsulates the surface on which it is applied, and may be evaporatively removed in the absence of solid to solid touching contact In a first embodiment, the battery active material layer is an electroactive alkali metal layer having a substantially unpassivated first major surface (e.g., a pristine lithium metal layer), and in such embodiments the standalone electrochemical material laminate structure is generally referred to herein as a standalone alkali metal laminate structure; e.g., a standalone lithium metal laminate structure.

In a second embodiment, the battery active material layer is an inorganic solid electrolyte layer having a substantially uncontaminated first major surface (e.g., a lithium ion conducting sulfide glass sheet), and in such embodiments the standalone electrochemical material laminate structure is generally referred to herein as a standalone solid electrolyte laminate structure; e.g., a standalone sulfide glass laminate structure.

By use of the term "standalone" when referring to an electrochemical material laminate structure, such as a standalone alkali metal laminate structure or a standalone solid electrolyte laminate structure, it is meant to emphasis that the battery active material layer in the standalone laminate is a discrete battery active material layer that has not yet been combined or coupled with a second battery active material layer, or yet been placed in a battery cell.

In another aspect the present disclosure provides methods for making lithium metal layers having substantially unpassivated surfaces and preventing passivation by encapsulating them with inert liquid. In various embodiments the methods include making a lithium metal foil having substantially unpassivated surfaces by die extruding a lithium ingot into a bath of super dry liquid hydrocarbons. In various embodiments the as made substantially unpassivated lithium metal foil may be further reduced in thickness by roller reduction and applying hydrocarbon liquid onto the freshly formed surfaces to ensure that they remain substantially unpassivated. In various embodiments a pre-passivated lithium metal layer of thickness (t) may be roller reduced in a roller mill using multiple roll reduction steps while at all times maintaining liquid hydrocarbon on the freshly formed lithium metal layer surfaces. By using pre-passivated lithium metal (e.g., passivated by exposure to $CO_2$), reproducibility is improved because the initial surface condition of the lithium is itself reproducible, as opposed to using lithium metal that is passivated in a less or uncontrolled fashion. Moreover, the area of freshly formed lithium is proportional to the decrease in thickness of the layer.

In another aspect the present disclosure provides methods for making inorganic lithium ion conducting sulfide glass sheets having substantially uncontaminated surfaces, and for preventing hydrolysis of those surfaces by encapsulating them underneath an inert super dry hydrocarbon fluid (e.g., liquid). For instance, in various embodiments the inorganic sulfide glass sheets are cleaned by ion etching in an Ar plasma to etch away any contaminated surface(s), and then substantially immediately after the ion etching step, the cleaned sulfide glass sheet may be immersed in a liquid hydrocarbon bath, or the clean surface encapsulated by a protective liquid layer, as described above. In various embodiments, the surface composition of the sulfide glass may be modified during or immediately after cleaning by using an Argon/Nitrogen plasma mixture for incorporating Nitrogen into the surface of the sulfide glass sheet, or the surfaces may be treated sequentially, using a first ion etch in argon plasma, followed by a second treatment in a nitrogen containing plasma (e.g., pure Nitrogen or an Argon/Nitrogen mixture).

In yet another aspect the present disclosure provides methods of making a strongly adhered fully solid-state inorganic laminate electrode assembly having a substantially contaminate free inorganic interface. In various embodiments the method includes providing a first battery active material as a component of a lithium metal laminate structure (e.g., a lithium metal layer having a first major surface which is substantially unpassivated and protected by an inert hydrocarbon liquid layer); providing a second battery active material layer as a component of an inorganic solid electrolyte laminate structure (e.g., a lithium ion conducting sulfide glass sheet having a clean first major surface that is devoid of hydrolysis reaction products and protected by an inert hydrocarbon liquid layer); removing the inert hydrocarbon liquid layers; and then, substantially immediately thereafter, reactively bonding the substantially unpassivated lithium metal surface to the clean inorganic sulfide glass surface, to form a strongly adhered laminate having a clean inorganic interface with a low area resistance (preferably, less than 50 Ω-cm$^2$). Preferably the peel strength of the laminate electrode assembly is greater than the tensile strength of its lithium metal layer, such that any attempt to peel off the lithium from the laminate results in the lithium tearing prior to peeling.

In various embodiments, an improved laminate interface is formed by laminating the fluid protected lithium metal surface to a solid electrolyte sheet using techniques whereby the fluid is removed substantially immediately prior to, or during, the laminating step, as the solid electrolyte comes into direct contact with the fluid and the lithium metal layer. In various embodiments, the laminating step effects a three phase boundary of lithium metal layer, solid electrolyte, and protective fluid, and causes the fluid to be removed from the surface substantially instantaneously as the solid electrolyte layer reactively adheres to the pristine lithium metal layer surface.

In another aspect, the present disclosure relates to methods and reagents to form a thin, dense and lithium ion conductive layer between a lithium metal layer and an inorganic solid electrolyte layer (e.g., a lithium ion conducting sulfide glass). The layer is sometimes referred to herein as a solid electrolyte interphase (SEI) as it is formed by reacting a first major surface of the lithium metal layer with a coating on the glass surface that allows for the glass electrolyte to be optimized for high ionic conductivity and processability, regardless of its chemical compatibility with lithium metal.

In another aspect the present disclosure provides methods of making battery cells by combining the fully solid-state inorganic laminate electrode assembly of the present disclosure with a positive electrode (e.g., a lithium ion intercalating positive electrode).

A list of suitable hydrocarbons which may be used as protective fluid (e.g., inert liquid) in accordance with the various embodiments and aspects of the present disclosure is provided below, as well as their structural formulas and vapor pressure (and/or boiling point) values. In various embodiments, the protective fluid is selected from a group of saturated hydrocarbons with the number of carbon atoms from 5 to 15. In one particular case, the protective fluid is isododecane. The protective fluids may be a combination of these various fluids. The fluids generally contain no dissolved or dispersed chemicals (e.g., salts, lubricants and/or greases) that would coat the surface of the lithium metal layer or solid electrolyte layer with a solid film or residue. Accordingly the protective fluid is devoid of any dissolved salts (e.g., lithium salts).

Suitable protective fluids are chemically inert to Li metal or Li alloys and contain less than 0.1 ppm of moisture, less than 1 ppm of moisture, less than 5 ppm of moisture, less than 10 ppm of moisture. In the case when a protective fluid is used in combination with a glass coating designed to form a solid electrolyte interphase (SEI) upon contact with Li, the protective fluid is chosen to be non-reactive with the glass coating.

Protective Fluids
Saturated Hydrocarbons (Alkanes) $C_nH_{2n+2}$
Straight-Chain Alkanes $C_5$-$C_{15}$
n-Pentane $C_5H_{12}$ BP=36° C., Vapor Pressure: 434 mmHg at 20° C.

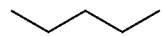

n-Hexane $C_6H_{14}$ BP=69° C., Vapor Pressure: 121 mmHg at 20° C.

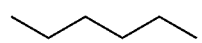

n-Heptane $C_7H_{16}$ BP=99° C., Vapor Pressure: 46 mmHg at 20° C.

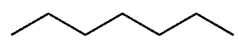

n-Octane $C_8H_{18}$ BP=125° C., Vapor Pressure: 11 mmHg at 20° C.

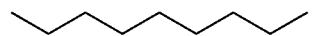

n-Nonane $C_9H_{20}$ BP=151° C., Vapor Pressure: 3.8 mmHg at 25° C.

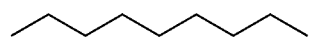

n-Decane $C_{10}H_{22}$ BP=174° C., Vapor Pressure: 2.7 mmHg at 20° C.

n-Undecane $C_{11}H_{24}$ BP=196° C., Vapor Pressure: 0.4 mmHg at 25° C.

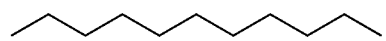

n-Dodecane $C_{12}H_{26}$ BP=216° C., Vapor Pressure: 0.14 mmHg at 25° C.

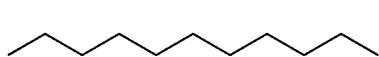

Branched-Chain Alkanes $C_5C_{15}$

Isopentane $C_5H_{12}$ BP=28° C., Vapor Pressure: 577 mmHg at 20° C.

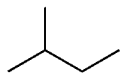

Isohexane $C_6H_{14}$ BP=61° C., Vapor Pressure: 172 mmHg at 20° C.

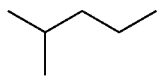

Isoheptane $C_7H_{16}$ BP=90° C., Vapor Pressure: 66 mmHg at 20° C.

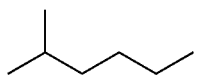

Isooctane $C_8H_{18}$ BP=99° C., Vapor Pressure: 41 mmHg at 21° C.

Tetraethylmethane $C_9H_{20}$ BP=146° C., Vapor Pressure: 7.3 mmHg at 25° C.

Isodecane $C_{10}H_{22}$ BP=167° C., Vapor Pressure: 2.3 mmHg at 25° C.

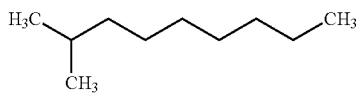

3-Methyldecane $C_{11}H_{24}$ BP=188° C. Vapor Pressure: N/A

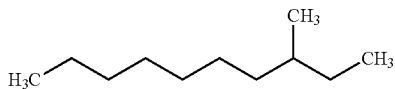

Isododecane $C_{12}H_{26}$ BP=180° C., Vapor Pressure: 0.301 mmHg at 20° C.

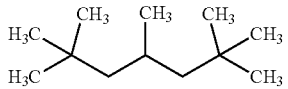

Cycloalkanes $C_6$-$C_8$ $C_nH_{2n}$

Cyclohexane $C_6H_{12}$ BP=81° C., Vapor Pressure: 78 mmHg at 20° C.

Cycloheptane $C_7H_{14}$ BP=118° C., Vapor Pressure: 22 mmHg at 20° C.

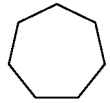

Cyclooctane $C_8H_{16}$ BP=149° C., Vapor Pressure: 16 mmHg at 37.7° C.

Unsaturated Acyclic Hydrocarbons $C_nH_{2(n-m-1)}$, n=number of carbon atoms m=number of double bonds Alkenes $C_6$-$C_{11}$, $C_nH_{2n}$ 1-Hexene $C_6H_{12}$ BP=64° C., Vapor Pressure: 155 mmHg at 21° C.

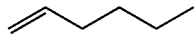

1-Heptene $C_7H_{14}$ BP=94° C., Vapor Pressure: 101 mmHg at 37.7° C.

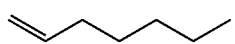

1-Octene $C_8H_{16}$ BP=122° C., Vapor Pressure: 36 mmHg at 37.7° C.

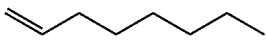

1-Nonene $C_9H_{18}$ BP=146° C., Vapor Pressure: 11 mmHg at 37.7° C.

1-Docene $C_{10}H_{20}$ BP=172° C., Vapor Pressure: 1.67 mmHg at 25° C.

1-Undecene $C_{11}H_{22}$, BP=192° C., Vapor Pressure: N/A

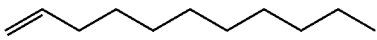

1-Dodecene $C_{12}H_{24}$ BP=214° C., Vapor Pressure: N/A

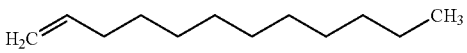

Alkadienes: $C_6$-$C_{12}$ $C_nH_{2n-2}$ 1,5-Hexadiene $C_6H_{10}$ BP=60° C., Vapor Pressure: 367 mmHg at 37.7° C.

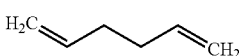

2,4-Hexadiene $C_6H_{10}$ BP=82° C., Vapor Pressure: N/A

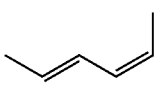

1,6-Heptadiene $C_7H_{12}$ BP=90° C., Vapor Pressure: N/A 1,7-Octadiene $C_8H_{14}$ BP=118° C., Vapor Pressure: 19 mmHg at 25° C.

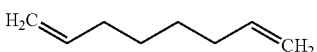

1,8-Nonadiene $C_9H_{16}$ BP=141° C., Vapor Pressure: 7 mmHg at 25° C.

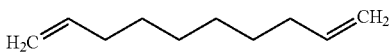

1,9-Decadiene $C_{10}H_{18}$ BP=169° C., Vapor Pressure: 4 mmHg at 20° C.

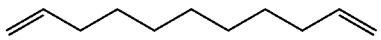

1,10-Undecadiene $C_{11}H_{20}$ BP=187° C., Vapor Pressure: N/A

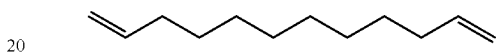

1,11-Dodecadiene $C_{12}H_{22}$ BP=207° C., Vapor Pressure: N/A

Unsaturated Cyclic Hydrocarbons $C_nH_{2(n-m)}$, n=number of carbon atoms m=number of double bonds Cycloalkenes $C_6$-$C_8$, $C_nH_{2n-2}$ Cyclohexene $C_6H_{10}$ BP=83° C., Vapor Pressure: 160 mmHg at 20° C.

Cycloheptene $C_7H_{12}$ BP=113° C., Vapor Pressure: 22 mmHg at 20° C.

Cyclooctene $C_8H_{14}$ BP=145° C., Vapor Pressure: N/A

Cycloalkadienes $C_6$-$C_8$, $C_nH_{2n-4}$ 1,3-Cyclohexadiene $C_6H_8$ BP=80° C., Vapor Pressure: 56 mmHg at 25° C.

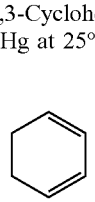

1,4-Cyclohexadiene C$_6$H$_8$ BP=88° C., Vapor Pressure: N/A

1,3-Cycloheptadiene C$_7$H$_{12}$ BP=120° C., Vapor Pressure: N/A

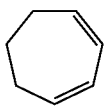

1,3-Cyclooctadiene C$_8$H$_{14}$ BP=143° C., Vapor Pressure: 13.4 mmHg at 25° C.

Generally, the protective inert liquid layer is devoid of dissolved and/or dispersed chemicals (e.g., salts, lubricants and/or greases) that would coat the surface of the battery active material layer with a solid film or leave behind a sticky residue. Accordingly, the protective inert liquid layer is generally devoid of dissolved salts (e.g., lithium salts, or more generally alkali metal salts).

In order to be inert in direct contact with the battery active material layer, the liquid hydrocarbon(s) should have a very low concentration of moisture. Preferably the concentration of moisture in the inert liquid hydrocarbon layer is less than 10 ppm of water, more preferably less than 5 ppm of water, even more preferably less than 1 ppm of water, and yet even more preferably less than 0.1 ppm of water (i.e., super dry). In various embodiments the inert liquid is actively dried in the presence of sacrificial alkali metal surfaces (e.g., pieces/chips of lithium or sodium metal) that getter oxygen, water and nitrogen impurities. Moreover, the liquid hydrocarbons may be passed through a drying chamber in order to maintain very low moisture levels. The drying chamber may contain drying agents and oxygen getters. Examples of drying agents for liquid hydrocarbons include molecular sieves (3A, 4A, or 5A depending on the hydrocarbon type), magnesium oxide, zinc chloride, calcium sulfate, calcium chloride, calcium hydride, and alumina (neutral or basic). In various embodiments, the cumulative area of the sacrificial alkali metal surfaces in direct contact with the inert liquid is greater than the first major surface of the battery active material layer on which the inert liquid covers in direct contact, for instance when the battery active material layer is disposed in a protective liquid bath, as described in more detail herein below.

Depicted Embodiments

In one aspect the present disclosure provides methods for making a solid-state laminate electrode assembly. In various embodiments, the solid-state laminate electrode assembly is a lithium metal layer reactively bonded with a lithium ion conducting sulfide glass layer.

With reference to FIG. 1 there is illustrated process flow diagram 5 for making a solid-state laminate electrode assembly in accordance with various embodiments of the present disclosure.

The process includes initial steps 10 and 20, for making or providing a first and a second standalone electrochemical material laminate structure, respectively. Notably, first and second electrochemical material laminate structures are not the same. At this point, before continuing to describe the process flow diagram, it is prudent to digress for a moment and address what is meant by the term standalone electrochemical material laminate structure.

As used herein, the term electrochemical material laminate structure means a laminate of two or more continuous material layers, wherein at least one of the material layers (i.e., a first material layer) is a "battery active solid material layer" having a clean (i.e., substantially uncontaminated) and/or substantially unpassivated first major surface, and another material layer (i.e., a second material layer) is a "protective material layer" that is inert, not battery active, and removably covers, in direct intimate contact, the first major surface of the battery active material layer. In various embodiments the protective material layer is a liquid phase layer of a protective fluid, such as a super dry hydrocarbon liquid that is spread out evenly over the first major surface of the battery active material layer.

Generally, the battery active material layer is highly reactive with water and/or oxygen, and its surfaces chemically degrade or passivate rather quickly, even under dry or vacuum conditions, including that of a dry air room suited for handling lithium metal (e.g., having a dew point between −20 to −40° C.) or a dry Argon filled glove box (e.g., having a low moisture and oxygen content of between 1 to 5 ppm). Accordingly, the electrochemical laminate structure is the laminate that is used to shield a battery active material layer against adverse reactions with the environment in which it (the battery active material layer) is made, processed and/or stored. And by the term "solid battery active material layer" it is meant either a solid alkali metal layer (e.g., typically embodied herein as a lithium metal layer) or an inorganic solid electrolyte layer (e.g., typically embodied herein as a lithium ion conducting sulfide glass). When the battery active material layer is a lithium metal layer, the laminate structure is referred to generally as an alkali metal laminate structure (or more specifically in this case as a lithium metal laminate structure), and when the battery active material layer is an inorganic lithium ion conducting sulfide glass, the laminate structure is referred generally as a solid electrolyte laminate structure (or more specifically in this case as a sulfide glass laminate structure). Furthermore, by use of the term "standalone" when referring to an electrochemical material laminate structure, such as a standalone alkali metal laminate structure or a standalone solid electrolyte laminate structure, it is meant to emphasis that the battery active material layer in the standalone laminate is a discrete battery active material layer that has not yet been combined or coupled with a second battery active material layer, or yet been placed in a battery cell. For instance, when standalone lithium laminate structures are absent of an electrolyte and standalone sulfide glass solid electrolyte laminate structures are absent of battery electroactive materials.

Continuing with reference to FIG. 1 the first electrochemical material laminate structure, which is provided or made in process step 10 is a standalone lithium metal laminate structure, and the second electrochemical material laminate structure, which is provided in process step 20, is a standalone sulfide glass laminate structure. Once the laminate structures are provided (or made), the protective material layer on their respective first major surfaces is removed during process steps 12 and 22, and done without physically damaging the surfaces. As mentioned above, in various embodiments the protective material layer is an inert liquid phase layer of a super dry liquid hydrocarbon. Moreover, the liquid hydrocarbon employed herein as a protective material layer is selected, in part, on its ability to remain on the surface of the lithium metal or sulfide glass layer until such time that it is to be controllably removed; accordingly it cannot be allowed to evaporate off by happenstance. Processes for accelerating and controllably removing the protective liquid layer off of the battery active material layer are generally performed in a chamber designed for that purpose. Such processes include one or more of heating, vacuum suction, blowing a jet of dry inert gas, blowing a jet of high vapor pressure protective fluid followed by vacuum suction, as well as rinsing the surfaces progressively with protective fluids having progressively higher vapor pressures.

Once the protective material layer has been removed, it is important to minimize any exposure to gaseous or vacuum environments in order to maintain the respective battery active material layer surfaces clean and unpassivated. Accordingly, in some embodiments the chamber or conduit through which the battery active material layers are translated may be filled with vapor phase protective fluid right up until the layers are combined for lamination, according to process step 30, wherein the layers are reactively bonded to each other.

In various embodiments, once the liquid phase layer of protective fluid has been removed from the surface of the sulfide glass, the glass first major surface may be processed and/or treated prior to laminating with lithium metal in order to engineer a solid electrolyte interphase (SEI) with improved electrochemical properties, or when the sulfide glass is not chemically compatible with lithium metal. As described in more detail herein below, the sulfide glass may undergo cleaning process 24A, exemplified by an ion etch treatment under an Ar plasma followed by surface treating process 24B, wherein the cleaned glass surface may be coated with a thin lithium metal reactive precursor film or treated to modify the surface composition of the glass (e.g., by placing the glass first major surface under a Nitrogen containing plasma).

The material laminate structures, methods and processes briefly described above with reference to process flow diagram in FIG. 1 are now described in more detail herein below, beginning with a description of the various architectures embodied for the standalone material laminate structures, followed by methods for making lithium metal layers having substantially unpassivated surfaces, as well as methods for treating the sulfide glass to engineer a solid electrolyte interphase.

Standalone Electrochemical Material Laminate Structure

In one aspect the present disclosure provides a standalone electrochemical material laminate structure for maintaining a major surface of a battery active material layer in a substantially unpassivated and/or substantially uncontaminated condition during storage and/or battery cell component fabrication (e.g., fabrication of a fully solid-state laminate electrode assembly).

In accordance with the present disclosure, the standalone electrochemical material laminate structure is composed of two or more continuous material layers, wherein at least one of the material layers (i.e., a first material layer) is a "battery active solid material layer" having a clean (i.e., substantially uncontaminated) and/or substantially unpassivated first major surface, and another material layer (i.e., a second material layer) is a "protective material layer" that is inert, not battery active, and removably covers, in direct contact, the first major surface of the battery active material layer.

In various embodiments the battery active material layer is highly reactive with water and/or Oxygen, and its surfaces will chemically degrade or passivate rather quickly, even under fairly dry conditions of a dry Air room (e.g., having a dew point of −20° C.) or a dry Argon filled glove box (e.g., having a low moisture and oxygen content of between 1 to 5 ppm).

In accordance with the present disclosure the protective material layer: i) minimizes, and preferably prevents, direct touching exposure between the first major surface of the battery active material layer and the ambient gaseous atmosphere or vacuum environment about the layer (e.g., during handling, processing and/or storage); ii) is inert in direct contact with the first major surface; and iii) is readily removed without physically damaging the surface. Accordingly, in various embodiments the protective material layer is an inert liquid (e.g., a super dry hydrocarbon liquid) that encapsulates the surface on which it is applied, and may be evaporatively removed in the absence of solid to solid touching contact.

In a first inventive embodiment, the battery active material layer is an electroactive alkali metal layer having a substantially unpassivated first major surface (e.g., a pristine lithium metal layer), and in such embodiments the standalone electrochemical material laminate structure is generally referred to herein as a standalone alkali metal laminate structure; e.g., a standalone lithium metal laminate structure. Preferably, the first major surface is pristine.

In a second inventive embodiment, the battery active material layer is an inorganic solid electrolyte layer (e.g., a lithium ion conducting sulfide glass sheet), and in such embodiments the standalone electrochemical material laminate structure is generally referred to herein as a standalone solid electrolyte laminate structure; e.g., a standalone sulfide glass laminate structure. In various embodiments the sulfide glass layer has a first major surface that is clean (i.e., substantially uncontaminated).

The standalone electrochemical material laminate structure of the present disclosure can be constructed using a number of different architectures, some of which are described in more detail herein below With reference to FIGS. 2A-D and FIGS. 2E-H there are illustrated cross sectional depictions of standalone electrochemical material laminate structures in accordance with various embodiments of the present disclosure. The main differences between the structures shown in FIGS. 2A-D and those shown FIGS. 2E-H are the battery active material layer. Specifically, in FIGS. 2A-D the battery active material layer is lithium metal, and the electrochemical material laminate structure is a lithium metal laminate structure. In FIGS. 2E-H the battery active material layer is a lithium ion conducting sulfide glass, and the electrochemical material laminate structure is an inorganic solid electrolyte laminate structure. The laminate structures may take on a variety of shared architectures and these architectures are now described with reference to a battery active material layer. Thereafter, details particular to the lithium metal layer and to the sulfide glass layer are provided.

With reference to FIG. 2A and FIG. 2E there are illustrated fully encapsulated electrochemical material laminate structures 100A/200E in accordance with various embodiments of the present disclosure. Structure 100A/200E: is composed of: i) freestanding battery active material layer 101/201 having first and second major surfaces (101$i$/201$i$ and 101$ii$/201$ii$) and lengthwise edge surfaces (101$iii$/201$iii$ and 101$iv$/201$iv$); and ii) inert liquid layer 102/202 encapsulating the major surfaces and the lengthwise edge surfaces (e.g., a super dry liquid hydrocarbon layer). In various embodiments inert liquid layer 102/202 is a super dry hydrocarbon that fully wets out the first and second major opposing surfaces and lengthwise edge surfaces (101$i$, 101$ii$, 101$iii$, and 101$iv$ as well as 201$i$, 201$ii$, 201$iii$, and 201$iv$).

With reference to FIG. 2B and FIG. 2F there is illustrated a substrate supported electrochemical material laminate structure in accordance with various embodiments of the present disclosure. Structure 100B/200F is composed of battery active material layer 101/201 and material backing layer 103/203, which may be rigid or flexible. In various embodiments layer 103/203 is a substrate onto which the battery active material layer is formed, or it (the backing layer) may be applied to second major surface 101$ii$/201$ii$ after layer 101/201 has already been formed. Inert liquid layer 102/202 encapsulates first major surface 101$i$/201$i$, and may additionally encapsulate its lengthwise edge surfaces, as shown. In various embodiments backing layer 103 extends beyond layer 101/201, and the inert liquid wets out the lengthwise edges, as shown. In various embodiments, backing layer 103/203 is electronically insulating, and used generally as a supporting layer 101/201 during handling, storage and processing (e.g., as an interleave to facilitate winding and unwinding). For example, when the battery active material layer is sulfide glass solid electrolyte layer 201, backing layer 103 may be an inert organic polymer (e.g., a polyethylene or polypropylene film). In other embodiments, when the battery active material layer is lithium metal layer 101, backing layer 103 (flexible or rigid) may be electronically conductive, and thereon serve as a current collector in a battery cell. For instance, backing layer 103 may be a metal foil or mesh (e.g., copper), or it (backing layer 103) may be a thin copper film deposited on a polymer support layer (e.g., a polyester film). When backing layer 103 is intended to serve as a current collector, standalone electrochemical material laminate structure 100B is sometimes referred to herein as having electrode architecture.

Figure 2D:
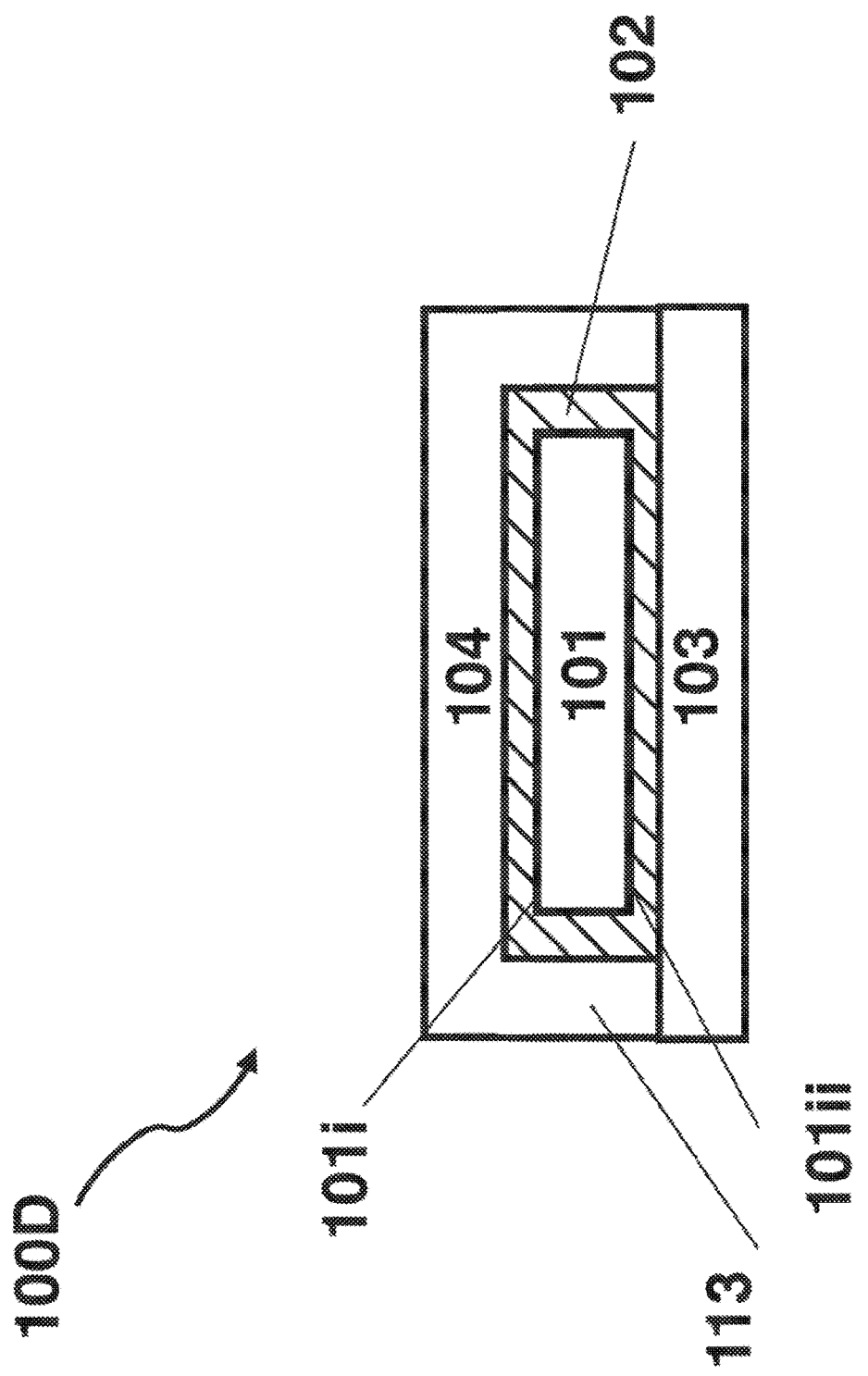
Figure 2G:
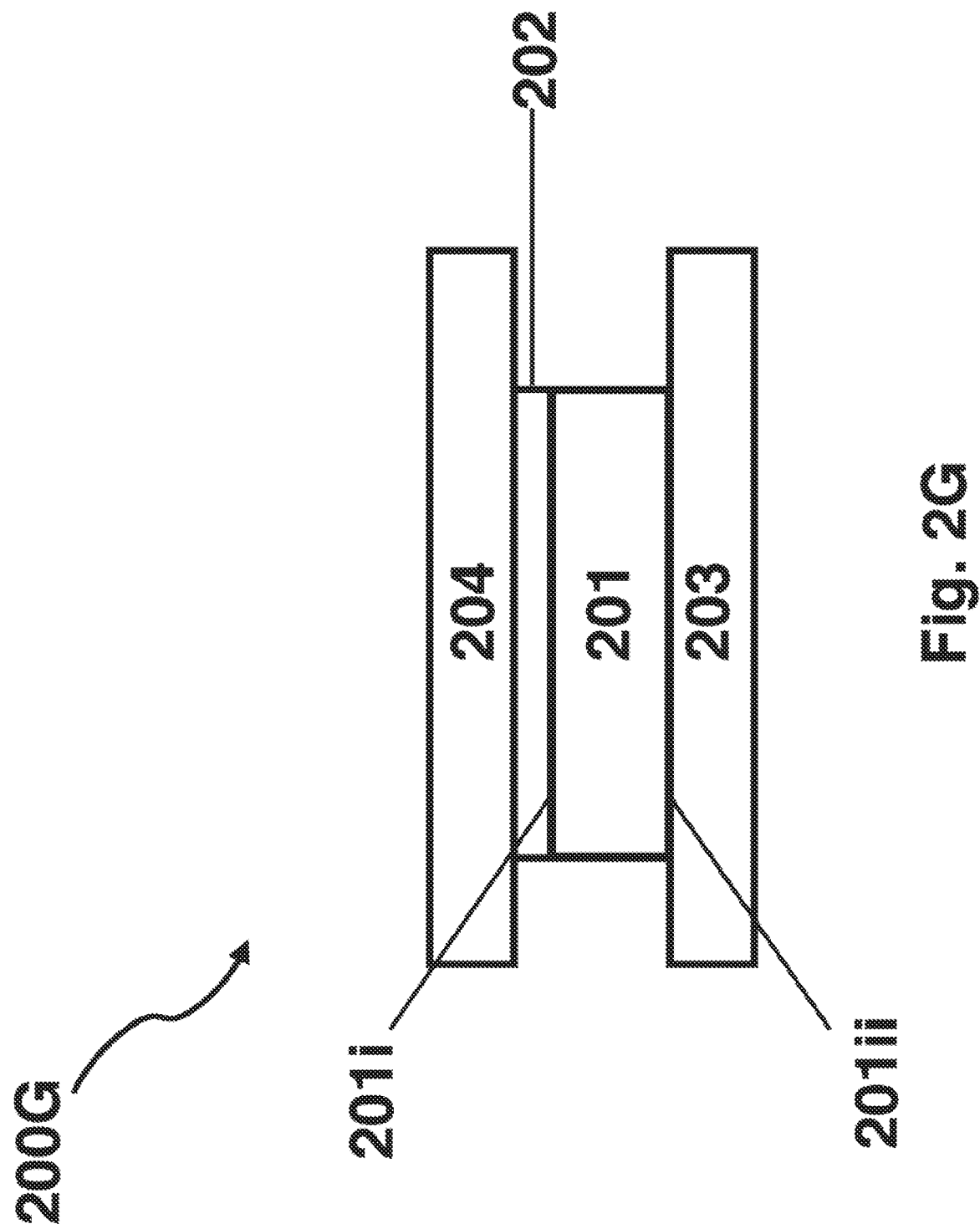

With reference to FIG. 2C and FIG. 2G there is illustrated standalone electrochemical material layer structure 100C/200G, which, in accordance with various embodiments of the present disclosure has, what is termed herein, a wet-decal architecture, and for this reason structure 100C/200G is sometimes referred to herein more simply as a wet-decal or decal (e.g., Li-decal 100C or sulfide glass decal 200G). Laminate structure 100C/200G includes solid material release layer 104/204 covering but not touching battery active material layer surface 101$i$/201$i$, and inert liquid layer 102/202 sandwiched therebetween, and encapsulating the surface on which it is applied (101$i$/201$i$).

Preferably, the inert liquid of layer 102/202 completely wets out surface 101$i$/201$i$ as well as the surface of release layer 104/204, and this leads to the formation of a liquid bridge between the layers and an associated wet adhesive force that assists in maintaining the release layer on the battery active material during handling and processing. The degree of wettability may be determined by the contact angle ($\theta$). Accordingly, in various embodiments one criterion that may be used for selecting the protective liquid is based, in part, on its ability to fully wet out the battery active material surface on which it is disposed. To effect wetting the contact angle that the liquid makes with the solid surface should be in the range of $0°\leq\theta<90°$, and preferably $\theta$ is near 0° for complete wet out (e.y., $\theta=0°$. Preferably the ability of the inert liquid to wet out both surface 101$i$/201$i$ and layer 104/204 is sufficient to spread the inert liquid layer evenly and intimately over surface 101$i$/201$i$, to encapsulate it (the first major surfaces) and prevent the solid release layer from touching the battery active material. Preferably, inert liquid layer 102/202 is thin enough to bring about a tight liquid bridge that is capable of maintaining the solid release on the battery active material during handling and processing.

Continuing with reference to FIG. 2C and FIG. 2G, in various embodiments the average thickness of protective liquid layer 102/202 is not greater than 50 µm, or not greater than 25 µm, or not greater than 10 µm, or not greater than 5 µm, but sufficiently thick and uniform, nonetheless, to prevent contact between the release layer and surface 101$i$ (e.g., 50 µm>t>5 µm; or 5 µm>t>100 nm). In various embodiments, inert liquid layer 102/202 has an average thickness in the range of 1 µm>t>100 nm; or in the range of 5 µm>t>1 µm; or in the range of 50 µm>t>5 µm. However, the present disclosure is not limited as such, and it is contemplated that structure 100C/200C may have pockets or isolated locations that are not covered by protective liquid, and in such embodiments, it is especially important that release layer 104/204 is inert in contact with the battery active material.

The wet decal architecture, as described above, has a number of advantages, including: i) protecting surface 101$i$/102$i$ against physical damage during handling; ii) enhancing the utility and/or the ability to use medium to high vapor pressure inert liquids by lessening their effective evaporation rate; iii) improving protection against degradation of surface 101$i$/201$i$ against impurity molecules from the ambient atmosphere, as the release layer itself provides an additional barrier against contaminating molecules entering the protective liquid from the ambient atmosphere; iv) extending storage shelf life and service lifetimes due to the additional barrier properties and lower evaporation rate of the inert liquid layer; and finally v) the solid release layer may serve as an interleave for winding or stacking the laminate structures.

Figure 2H:
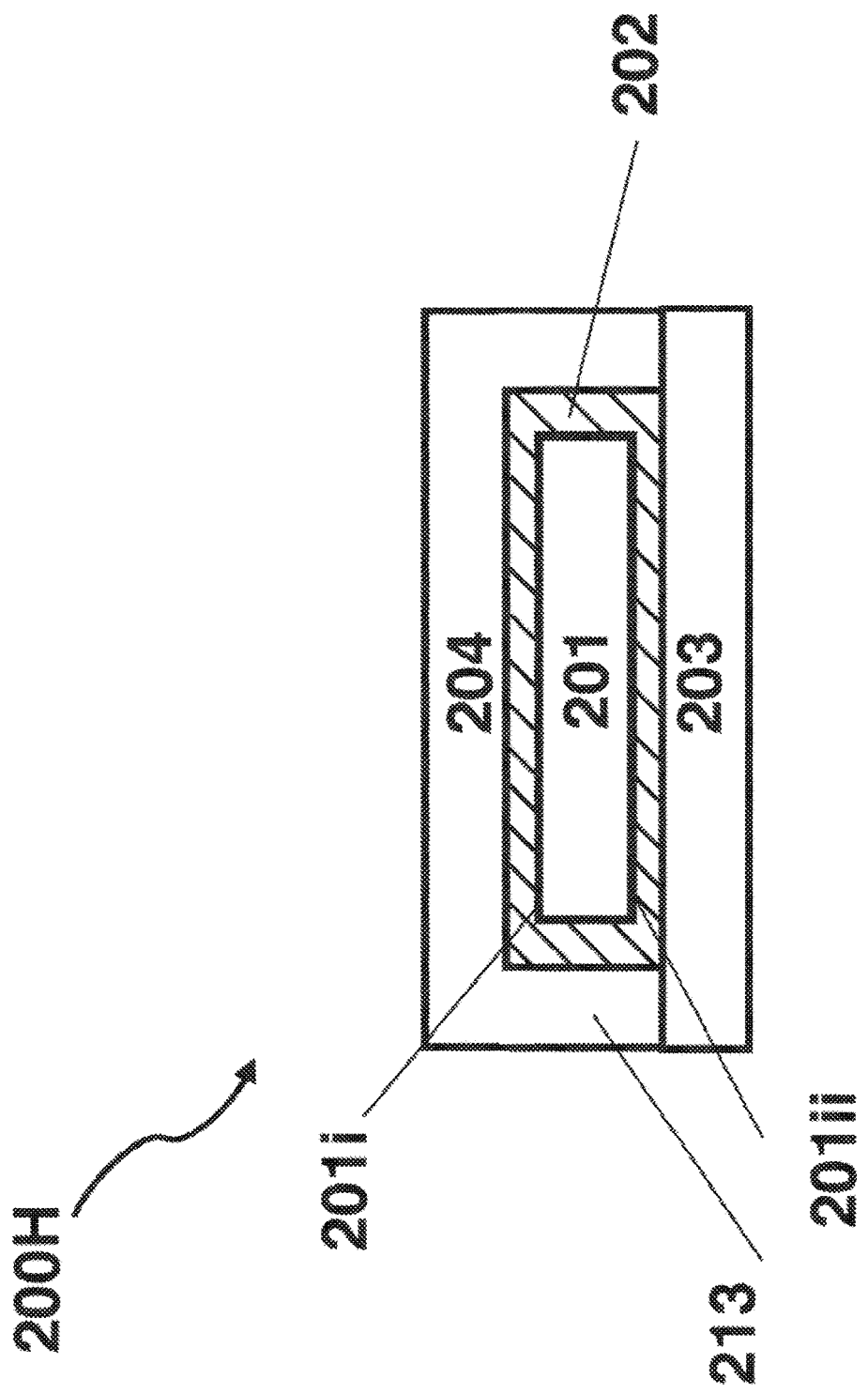

With reference to FIG. 2D and FIG. 2H, in various embodiments the wet-decal architecture is sealed along its lengthwise edges by seal 113/213, the seal providing an additional barrier against diffusion of impurity molecules from the ambient atmosphere seeping into the inert liquid layer and for minimizing evaporation of the inert liquid out from the laminate. When sealed, the lengthwise edges are preferably also covered in direct contact with inert liquid. Lengthwise edge seal 113/213 may be made by heat and pressure applied between release layer 104/204 and backing layer 103/203, which, in various wet-decal embodiments is simply a second release layer, similar or the same as layer 104/204. In embodiments wherein structure 100/200H includes current collector layer 103, an additional sealable backing layer may be placed behind the current collecting layer, for sealing the lengthwise edges. During downstream processing, when the release layer needs to be removed, the edge seal may be broken by slicing with a sharp edge.

In various embodiments the laminate thickness, as measured from the second major surface of the battery active material layer 101$ii$/201$ii$ to the top surface of inert liquid layer 102/202 is no greater than 1 mm thick, and more typically no greater than 500 um thick. For instance, in various embodiments the laminate thickness (as defined above) is less than 500 um, and typically less than 200 um, and in some embodiments less than 100 um, or less than 50 um (e.g., between 5-100 um). The laminate thickness, as defined above, does not include the thickness of the solid release layer, or backing layer when present.

Nanofilm-Encapsulated Sulfide Glass Solid Electrolyte Structures

With reference to FIGS. 2I-P there are illustrated cross sectional depictions of nanofilm-encapsulated sulfide glass solid electrolyte structures, in accordance with various embodiments of the present disclosure. With reference to FIG. 2I, nanofilm-encapsulated sulfide glass solid electrolyte structure 200-2I is composed of: i) sulfide glass solid electrolyte sheet 201-Z having first and second major opposing surfaces (201$i$-Z and 201$ii$-Z) and opposing lengthwise edge surfaces 201$iii$-Z/201$iv$-Z; and ii) continuous inorganic nanofilm 202-Z-2I which encapsulates the sulfide glass surfaces in direct contact. Not shown in FIG. 2I are the opposing widthwise edge surfaces of sulfide sheet 201-Z. In various embodiments, the opposing widthwise edges are also encapsulated by nanofilm 202-Z-2I, and in such embodiments solid electrolyte structure 200-2I is referred to herein as fully encapsulated (i.e., all surfaces of glass sheet 201-Z are encapsulated by nanofilm 202-Z-2I). In some embodiments, the widthwise edges are not encapsulated, but may ultimately be shielded from the ambient atmosphere by a polymeric edge sealant (also not shown).

Continuing with reference to FIG. 2I, encapsulating nanofilm 202-Z-2I is a conformal pinhole free inorganic material layer that encapsulates, in direct contact, sulfide sheet surfaces 201$i$-Z, 201$ii$-Z, 201$iii$-Z, and 201$iv$-Z. The nanofilm is conformal so its surfaces adjacently align with the surfaces of the sulfide glass sheet on which it (the nanofilm) encapsulates. Accordingly, in a likewise fashion to that of sulfide glass sheet 201-Z, the nanofilm may be characterized similarly, as having first and second opposing major surfaces (202$i$-Z and 202$ii$-Z), opposing lengthwise edge surfaces 202$iii$-Z and 202$iv$-Z, and opposing widthwise edge surfaces, not shown. Moreover, when describing certain aspects of the nanofilm, such as its composition, thickness, performance and function, it is expedient, for descriptive purposes, to differentiate specific portions of the continuous nanofilm, and in particular to distinguish among those portions of the nanofilm that are adjacent the first and second sulfide glass major surfaces and those which are adjacent the peripheral edge surfaces. As shown in FIG. 2I, portion 202$a$-Z and portion 202$b$-Z refer to those portions of nanofilm 202-Z-2I which are adjacent sulfide glass major surfaces 201$i$-Z and 201$ii$-Z, and portions of the nanofilm that encapsulate the edges of the sulfide glass sheet are referred to as edge encapsulating portions (e.g., lengthwise and widthwise nanofilm edge portions).

In various embodiments, thickness of nanofilm 202-Z-2I is a tradeoff between enhancing the moisture barrier properties by using a thicker film, and ensuring that the nanofilm is sufficiently thin to be transparent or permeable to Li-ions, so to allow lithium ions to move across the solid electrolyte separator without effectuating a large area specific resistance (ASR); e.g., the ASR of the separator is no greater than 200 $\Omega$-cm$^2$, when measured in a battery cell at room temperature, and preferably no greater than 100 $\Omega$-cm$^2$, and even more preferably no greater than 50 $\Omega$-cm$^2$. Other considerations regarding nanofilm thickness include time of fabrication, reliability and yield.

In various embodiments, the first and second major portions of continuous nanofilm 202-Z-2I each has substantially uniform thickness, typically in the range of 1 nm to 100 nm; e.g., [(1 nm≤t<5 nm); (5 nm≤t<10 nm); (10 nm≤t<30 nm); (30 nm≤t<50 nm); (50 nm≤t<100 nm)].

In various embodiments, the first and second major portions of nanofilm 202-Z-2I (i.e., portion 202$a$-Z and portion 202$b$-Z) have uniform thickness of about 0.1 nm, 0.2 nm, 0.3 nm, 0.4 nm, 0.5 nm, 0.6 nm, 0.7 nm, 0.8 nm, 0.9 nm, 1 nm, 2 nm, 3 nm, 4 nm, 5 nm, 10 nm, or about 20 nm, or about 30 nm or about 40 nm or about 50 nm, or about 60 nm, or about 70 nm or about 80 nm or about 90 nm or about 100 nm).

Generally, when referring to the nanofilm thickness, it is meant the thickness of the nanofilm adjacent to the first and second major surfaces (i.e., the thickness of the nanofilm major portions 202$a$-Z and 202$b$-Z), as it is these surfaces which adjacently oppose the electrodes in a battery cell and therefore function electrochemically. Whereas the primary benefit provided by the edge portion of the nanofilm is to effect a moisture barrier and preferably enhance mechanical strength by blunting surface defects at or near the edge of the sulfide glass sheet, and so it (the edge portion of the nanofilm) should be sufficiently thick to provide a water impervious barrier (as described above). As a result of the conformal nature of the nanofilm, the thickness of its edge portion(s) are generally a function of the thickness of the nanofilm first and second major portions, and the edge portion thickness is generally similar to or greater than the thickness of the major nanofilm portions, because, as described in more detail below, the edge regions may be coated more than once when forming the continuous nanofilm. Accordingly, in various embodiments the nanofilm has an edge portion thickness that is substantially equal to the sum of the first and second nanofilm major portions 202$a$-Z and 202$b$-Z.

In various embodiments nanofilm 202-Z-2I is a continuous and conformal film having substantially uniform composition and first and second major portion thicknesses less than 1000 nm, and more typically less than 500 nm, and even more typically less than 200 nm. Typically, the nanofilm first and second major portion thicknesses are between 100 nm to 0.1 nm (e.g., between 10 nm to 1 nm).

With reference to FIGS. 2J-2P there are illustrated cross sectional depictions of various embodiments of nanofilm-encapsulated sulfide glass solid electrolyte structures of the present disclosure wherein the nanofilm is configured to have a varied thickness and/or a varied composition relative to the position of the nanofilm along the sulfide sheet surface on which it encapsulates. In other words, nanofilm first major portion 202$a$-Z has a first composition and a first thickness, and nanofilm second major portion 202$b$-Z has a second composition and a second thickness.

Figure 2J:
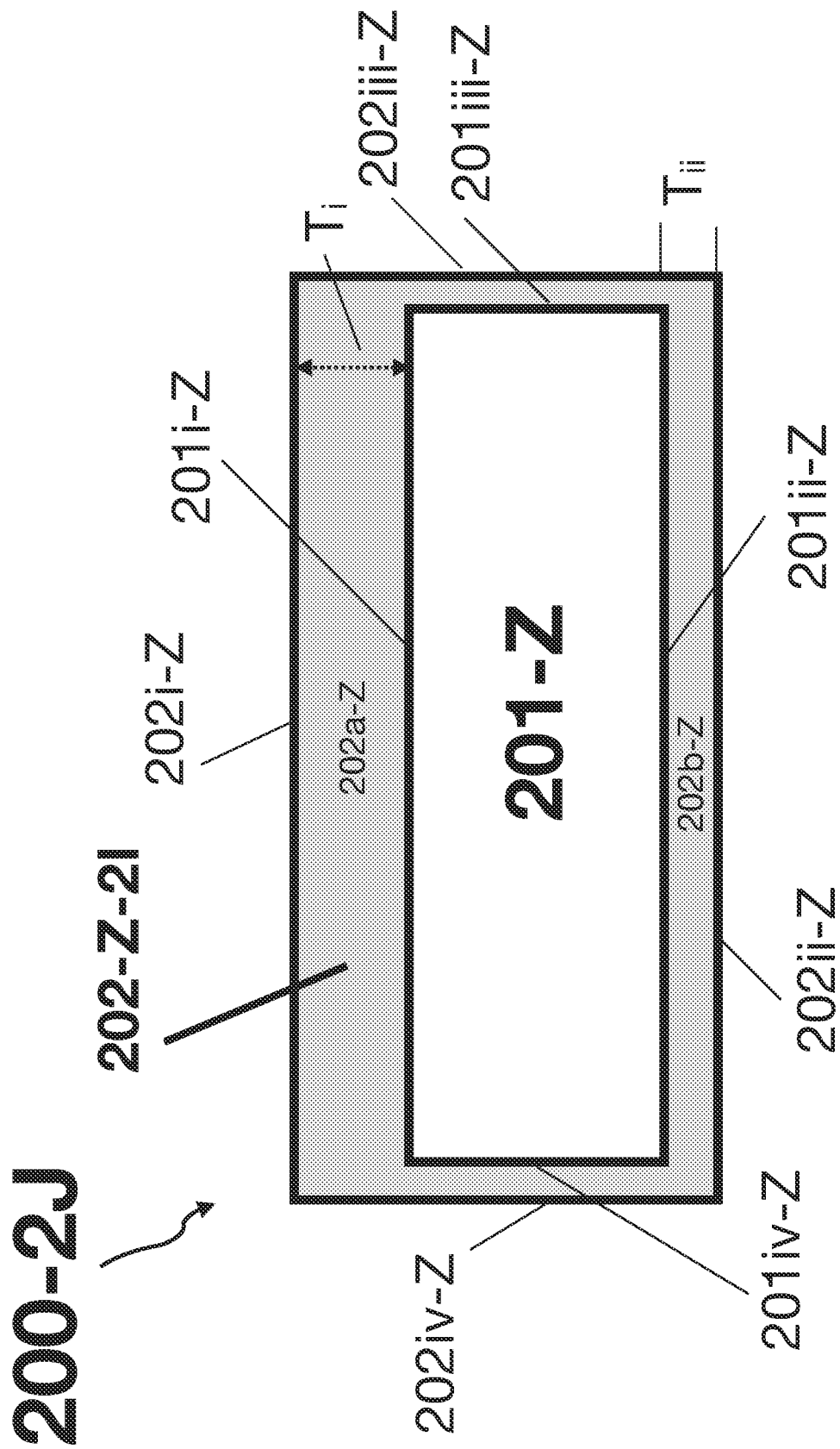

With reference to FIGS. 2J-2K, separator structures 200-2J and 200-2K are composed of sulfide glass solid electrolyte sheet 201-Z encapsulated by continuous inorganic nanofilm 202-Z-2I and 202-Z-2J, respectively. In accordance with these embodiments, the conformal nanofilm has a substantially uniform composition throughout and a thickness that is engineered to vary relative to the sulfide sheet surface on which it encapsulates. For solid electrolyte structure 200-2J, nanofilm thickness ($T_i$) refers to the substantially uniform nanofilm thickness adjacent sulfide sheet surface 201$i$-Z (i.e., the thickness of nanofilm portion 202$a$-Z), and it is significantly greater than nanofilm thickness ($T_{ii}$), which is the substantially uniform nanofilm thickness adjacent sulfide sheet surface 201$ii$-Z (i.e., the thickness of nanofilm portion 202$b$-Z) And for solid electrolyte structure 200-2K shown in FIG. 2K, $T_{ii}$ (thickness of nanofilm portion 202$b$-Z) is significantly greater than $T_i$ (thickness of nanofilm portion 202$a$-Z) Typically, when the thickness of the nanofilm along the major surfaces of the sulfide sheet are different, they are nonetheless generally substantially uniform. In various embodiments the absolute value of the difference between $T_i$ and $T_{ii}$ is between 1-5 nm, or between 5-10 nm, or between 10-20 nm, or between 20-50 nm, or between 50-100 nm.

Figure 2L:
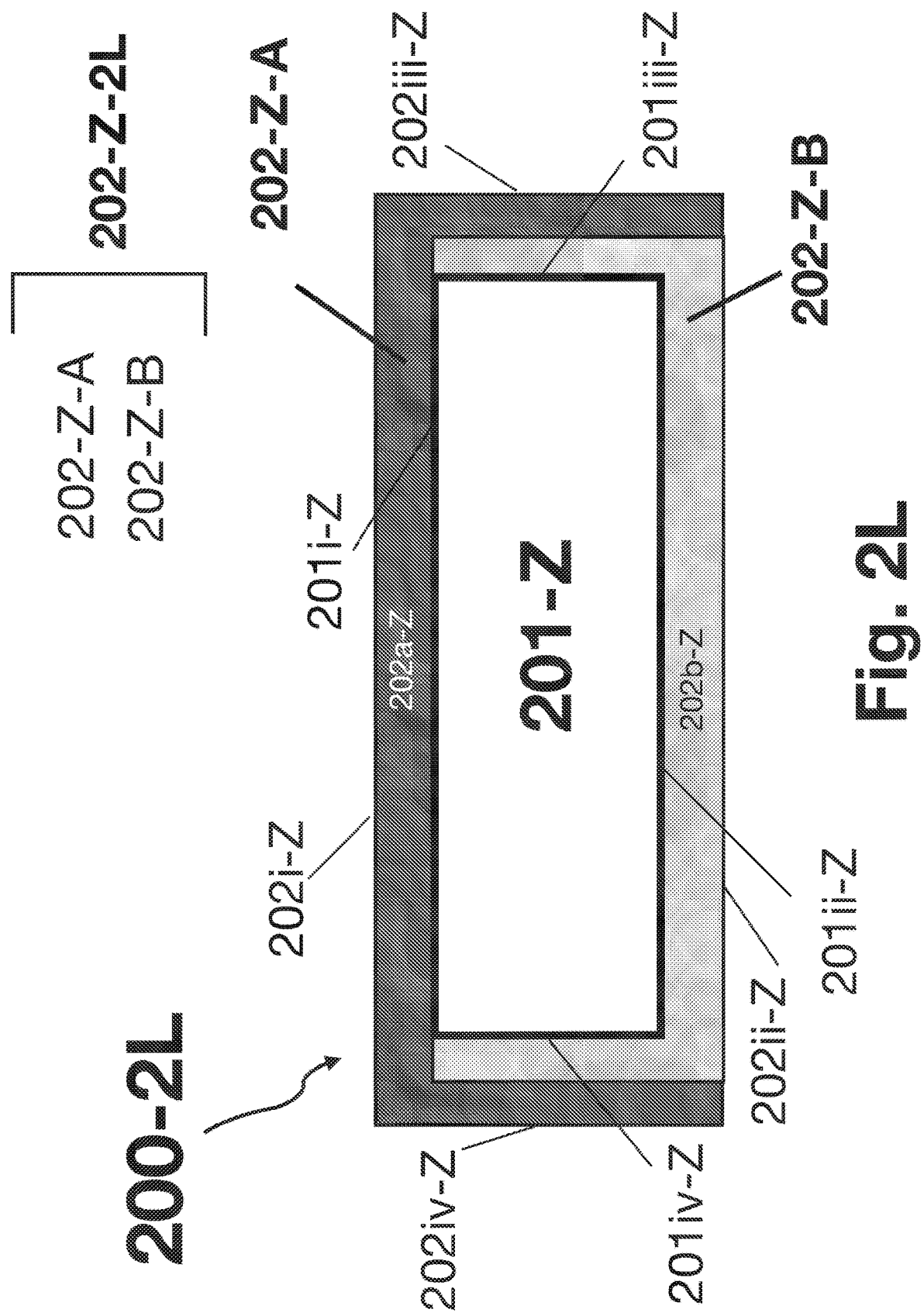

With reference to FIG. 2L there is illustrated nanofilm-encapsulated sulfide glass solid electrolyte structure 200-2L wherein sulfide glass solid electrolyte sheet 201-Z is encapsulated by two continuous and conformal nanolayers (first nanolayer: 202-Z-A) and (second nanolayer: 202-Z-B), which, in combination, form continuous nanofilm 202-Z-2L. Continuous nanolayer 202-Z-A encapsulates in direct contact sulfide sheet first major surface Z101i (thus forming major nanofilm portion 202a-Z) and continuous nanolayer 202-Z-B encapsulates, in direct contact, sulfide sheet first major surface Z101ii (thus forming major nanofilm portion 202b-Z). In accordance with this embodiment, nanofilm 202-Z-2L is configured to have an asymmetric architecture wherein the material composition of first nanolayer 202-Z-A is different than the material composition of second nanolayer 202-Z-B (i.e., the material composition of the first major nanofilm portion is different than the material composition of the second major nanofilm portion. With reference to solid electrolyte structure 200-2L, the asymmetric nanofilm is a contiguous planar composite of first and second nanolayers, as opposed to a stacked multi-layer, which it is not as the nanolayers do not overlap on either major surface of the sulfide glass sheet. Rather the contiguity of the nanolayers is realized by an overlap at the edge portions of the glass sheet.

Figure 2M:
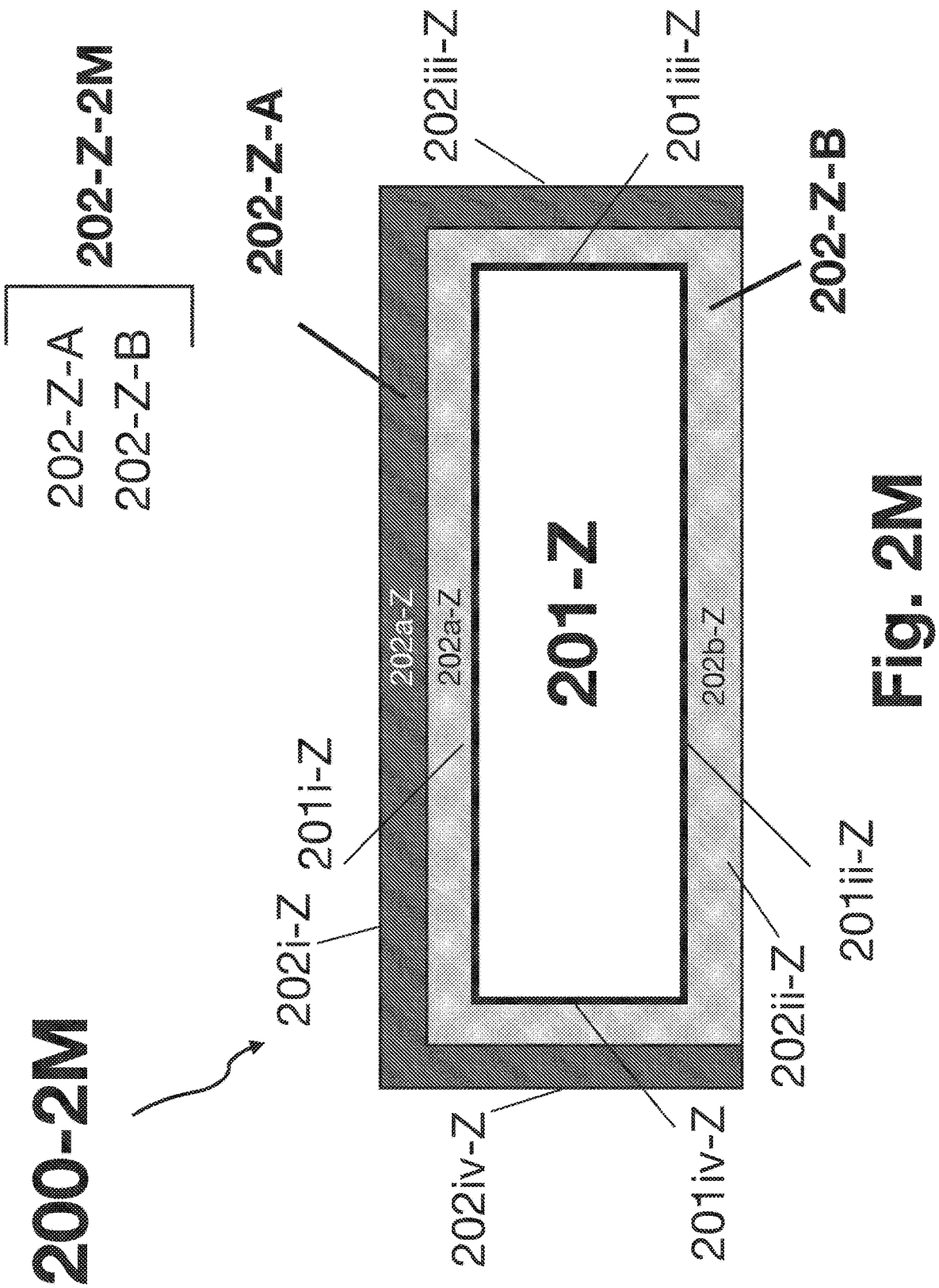
Figure 2O:
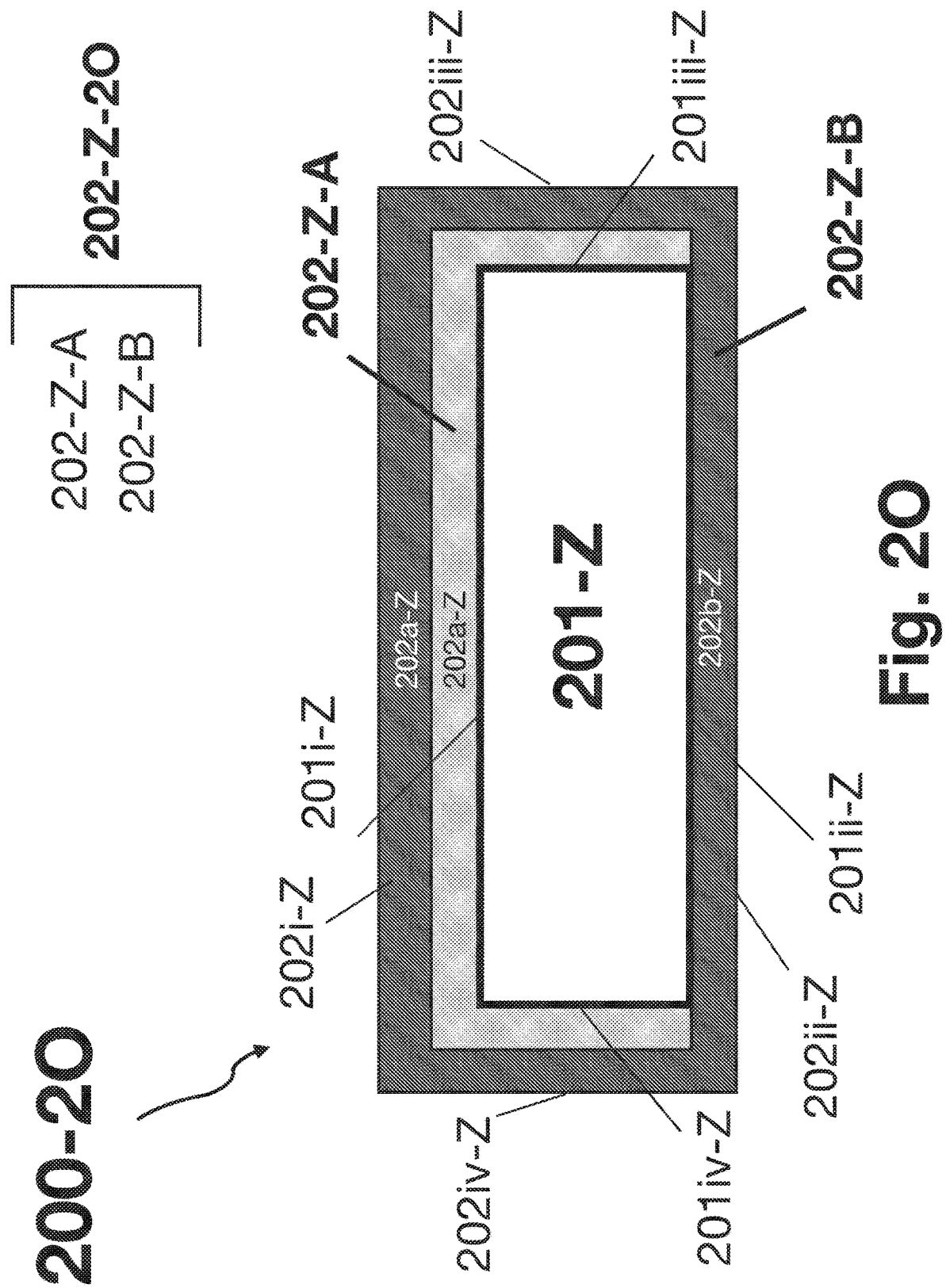

Additional nanofilm-encapsulated sulfide glass solid electrolyte structures having asymmetric architectures are shown in FIGS. 2M, 2N, and 2O, and described in more detail below.

With reference to FIG. 2M there is illustrated nanofilm-encapsulated sulfide glass solid electrolyte structure 200-2M wherein sulfide glass solid electrolyte sheet 201-Z is encapsulated by two continuous and conformal nanolayers (first nanolayer: 202-Z-A) and (second nanolayer: 202-Z-B), which, in combination, form continuous nanofilm 202-Z-2M. Continuous nanolayer 202-Z-B encapsulates in direct contact sulfide sheet first major surface 201i-Z and sulfide sheet second major surface 201ii-Z. And continuous nanolayer 202-Z-A encapsulates, in direct contact, nanolayer 202-Z-B, in that region of nanofilm 202-Z-2M which is adjacent to sulfide sheet 201i-Z and does not encapsulate (and preferably does not contact) nanolayer 202-Z-B in that region of the nanofilm adjacent to sulfide sheet surface 201ii-Z. In accordance with this embodiment, the material composition of first nanolayer 202-Z-A is different than the material composition of second nanolayer 202-Z-B. And with reference to FIG. 2N, nanofilm-encapsulated sulfide glass solid electrolyte structure 200-2N is similar to structure 200-2M, as shown in FIG. 2M, except that for structure 200-2N, nano layer 202-Z-B encapsulates nanolayer 202-Z-A adjacent sulfide glass sheet surface 201ii-Z, and nanolayer 202-Z-B does not encapsulate (and preferably does not contact) nanolayer 202-Z-A in that region of nanofilm 202-Z-2N which is adjacent to sulfide sheet surface 201i-Z.

With reference to FIG. 2O there is illustrated nanofilm-encapsulated sulfide glass solid electrolyte structure 200-2O wherein sulfide glass solid electrolyte sheet 201-Z is encapsulated by two continuous and conformal nanolayers (first nanolayer: 202-Z-A) and (second nanolayer: 202-Z-B), which, in combination, form continuous nanofilm 202-Z-2O. Continuous nanolayer 202-Z-A encapsulates in direct contact sulfide sheet first major surface 201i-Z, and continuous nanolayer 202-Z-B encapsulates, in direct contact, nanolayer 202-Z-A, in that region of nanofilm 202-Z-2O which is adjacent to sulfide sheet 201i-Z and encapsulates sulfide glass sheet surface 201ii-Z in direct contact. Nanolayer 202-Z-A, however, does not encapsulate (and preferably does not contact) sulfide glass sheet surface 201ii-Z. And with reference to nanofilm-encapsulated structure 200-2P illustrated in FIG. 2P, sulfide glass solid electrolyte sheet 201-Z is encapsulated on glass sheet surface 201ii-Z by nanolayer 202-Z-B and is encapsulated on glass sheet surface 201i-Z by nanolayer 202-Z-A, which also encapsulates nanolayer 202-Z-B in that region of nano film 202-Z-P which is adjacent to sulfide sheet surface 201ii-Z.

In various embodiments sulfide glass solid electrolyte sheet 201-Z is in the form of a ribbon (e.g., a long narrow sheet), having substantially parallel lengthwise edges and a thickness in the range of 5 um to 500 um, and more typically in the range of 10 um to 100 um, and even more typically in the range of 20-50 um. In various embodiments sulfide glass solid electrolyte sheet 201-Z is in the form a discrete sheet, typically at least 1 cm wide and at least 2 cm long (e.g., at least 2 cm wide and at least 5 cm long). Particularly suitable sulfide glass solid electrolyte sheets are described in Applicant's pending patent applications U.S. patent application Ser. No. 14/954,816 filed Nov. 30, 2015 and titled Standalone Sulfide Based Lithium Ion-Conducting Glass Solid Electrolyte and Associated Structures, Cells and Methods, and U.S. patent application Ser. No. 14/954,812 filed Nov. 30, 2015 and titled Vitreous Solid Electrolyte Sheets of Li ion Conducting Sulfur-Based Glass and Associated Structures, Cells and Methods; incorporated by reference herein for their glass composition and processing disclosures. For instance, sulfide glass compositions described therein, and which are particularly useful as the sulfide glass composition for sheet 201-Z include the following specific compositional examples: $0.7Li_2S$-$0.29P_2S_5$-$0.01P_2O_5$; $0.7Li_2S$-$0.28P_2S$-$0.02P_2O_5$; $0.7Li_2S$-$0.27P_2S_5$-$0.03P_2O_5$; $0.7Li_2S$-$0.26P_2S_5$-$0.04P_2O_5$; $0.7Li_2S$-$0.25P_2S_5$-$0.05P_2O_5$; $0.7Li_2S$-$0.24P_2S_5$-$0.06P_2O_5$; $0.7Li_2S$-$0.23P_2S$-$0.07P_2O_5$; $0.71Li_2S_5S$-$0.22P_2S$-$0.08P_2O_5$; $0.7Li_2S$-$0.21P_2S_5$-$0.09P_2O_5$; $0.7Li_2S$-$0.2P_2S_5$; $0.1P_2O_5$; $0.07Li_2S$-$0.29B_2S_3$-$0.01B_2O_3$; $0.7Li_2S$-$0.28B_2S_3$-$0.02B_2O_3$; $0.7Li_2S$-$0.27B_2S_3$-$0.03B_2O_3$; $0.7Li_2S$-$0.26B_2S_3$-$0.04B_2O_3$; $0.7Li_2S$-$0.25B_2S_3$-$0.05B_2O_3$; $0.7Li_2S$-$0.24B_2S_3$-$0.06B_2O_3$; $0.7Li_2S$-$0.23B_2S_3$-$0.07B_2O_3$; $0.7Li_2S$-$0.22B_2S_3$-$0.08B_2O_3$; $0.7Li_7S$-$0.21B_2S_3$-$0.09B_2O_3$; $0.7Li_2S$-$0.20B_2S_3$-$0.1B_2O_3$; $0.7Li_2S$-$0.29B_2S_3$-$0.01P_2O_5$; $0.7Li_2S$-$0.28$ $B_2S_3$-$0.02P_2O_5$; $0.71Li_2S$-$0.27B_2S_3$-$0.03P_2O_5$; $0.7Li_2S$-$0.26B_2S_3$-$0.04P_2O_5$; $0.7Li_2S$-$0.25B_2S_3$-$0.05P_2O_5$; $0.7Li_2S$-$0.24B_2S_3$-$0.06P_2O_5$; $0.7Li_2S$-$0.23B_2S_3$-$0.07P_2O_5$; $0.7Li_2S$-$0.22B_2S_3$-$0.08P_2O_5$; $0.7Li_2S$-$0.21B_2S_3$-$0.09P_2O_5$; $0.7Li_2S$-$0.20B_7S_3$-$0.1P_7O_5$; $0.7Li_2S$-$0.29B_2S_3$-$0.01SiS_2$; $0.7Li_2S$-$0.28B_2S_3$-$0.02SiS_2$; $0.7Li2S$-$0.27B_2S_3$-$0.03SiS_2$; $0.7Li_2S$-$0.26B_2S_3$-$0.04SiS_2$; $0.7Li_2S$-$0.25B_2S_3$-$0.05SiS_2$; $0.7Li2S$-$0.24B_2S_3$-$0.06SiS_2$; $0.7Li_2S$-$0.23B_2S_1$-$0.07SiS_2$; $0.7Li_2S$-$0.22B_2S_3$-$0.08SiS_2$; $0.7Li_2S$-$0.21B_2S_3$-$0.09SiS_2$; $0.71Li_2S$-$0.20B_2S_3$-$0.1SiS_2$.

Particularly suitable silicon sulfide glass compositions include $(1-x)(0.5Li_2S$-$0.5SiS_2)$-$xLi_4SiO_4$; $(1-x)(0.6Li_2S$-$0.4SiS_2)$-$xLi_4SiO_4$; $(1-x)(0.5Li_2S$-$0.5SiS_2)$-$xLi_3BO_3$; $(1-x)(0.6Li_2S$-$0.4SiS_2)$-$xLi_3BO_3$; $(1-x)(0.5Li_2S$-$0.5SiS_2)$-$xLi_3PO_4$; $(1-x)(0.6Li_2S$-$0.4SiS_2)$-$xLi_3PO_4$; wherein x ranges from 0.01-0.2. Specific examples include: $0.63Li_2S$-$0.36SiS_2$-$0.01Li_3PO_4$; $0.59Li_2S$-$0.38SiS_2$-$0.03Li_3PO_4$; $0.57Li_2S$-$0.38SiS_2$-$0.05Li_3PO_4$; and $0.54Li_2S$-$0.36SiS_2$-$0.1Li_3PO_4$.

In various embodiments the composition of sulfide glass sheet 201-Z is of the type having composition: $xLi_2S$-$yP_2S_5$-

$zSiS_2$, $xLi_2S$-$yB_2S_3$-$zSiS_2$, $xLi_2S$-$yP_2S_5$-$zSiO_2$, $xLi_2S$-$yB_2S_3$-$zSiO_2$, $xLi_2S$-$yB_2S_3$-$zB_2O_3$, or $xLi_2S$-$yP_2S_5$-$zP_2O_3$; wherein $x+y+z=1$ and $x=0.4$-$0.8$, $y=0.2$-$0.6$, and z ranging from 0 to 0.2. (e.g., about 0.01, 0.02, 0.03, 0.04, 0.05, 0.06, 0.07, 0.08, 0.09, 0.1, 0.11, 0.12, 0.13, 0.14, 0.15, 0,16, 0.17, 0.18, 0.19, 0.2), and particularly $x+y+z=1$ and $x=0.6$-$0.7$, $y=0.2$-$0.4$, and z ranging from 0 to 0.2 (e.g., z is between 0.01-0.2, such as about 0.01, 0.02, 0.03, 0.04, 0.05, 0.06, 0.07, 0.08, 0.09, 0.1, 0.11, 0.12, 0.13, 0.14, 0.15, 0.16, 0.17, 0.18, 0.19, 0.2); and more particularly $x+y+z=1$ and $x=0.7$, $y=0.2$-$0.3$, and z ranging from 0 to 0.2 (e.g., z is between 0.01-0.2, such as about 0.01, 0.02, 0.03, 0.04, 0.05, 0.06, 0.07, 0.08, 0.09, 0.1, 0.11, 0.12, 0.13, 0.14, 0.15, 0.16, 0.17, 0.18, 0.19, 0.2).

In various embodiments the composition of sulfide glass sheet 201-Z is of the type having composition: $xLi_2S$-$ySiS_2$-$zP_2S$, or $xLi_2S$-$ySiS_2$-$zP_2O_5$; wherein $x+y+z=1$ and $x=0.4$-$0.6$, $y=0.2$-$0.6$, and z ranging from 0 to 0.2 (e.g., z is between 0.01-0.2 such as about 0.01, 0.02, 0.03, 0.04, 0.05, 0.06, 0.07, 0.08, 0.09, 0.1, 0.11, 0.12, 0.13, 0.14, 0.15, 0.16, 0.17, 0.18, 0.19, 0.2), and particularly wherein $x+y+z=1$ and $x=0.5$-$0.6$, $y=0.2$-$0.5$, and z ranging from 0 to 0.2 (e.g., z is between 0.01-0.2 such as about 0.01, 0.02, 0.03, 0.04, 0.05, 0.06, 0.07, 0.08, 0.09, 0.1, 0.11, 0.12, 0.13, 0.14, 0.15, 0.16, 0.17, 0.18, 0.19, 0.2).

As described above, n exemplary embodiments sulfide based solid electrolyte sheet 201-Z is a continuous vitreous sheet of sulfide glass (e.g., a monolithic sheet of sulfide glass); however, the present disclosure is not limited to nanofilm-encapsulated sulfide sheets of glass, but is meant to include other moisture sensitive sulfide based solid electrolyte layers, such as sheets composed of Li ion conducting sulfide ceramics and glass ceramics materials that benefit from an encapsulating-nanofilm, as described herein. For instance, it is contemplated herein that moisture sensitive sulfide solid electrolyte sheet 201-Z may be formed as a continuous sheet of sulfide glass that is subsequently crystallized or partially crystallized to form a ceramic or glass-ceramic sulfide sheet, or the ceramic/glass-ceramic sulfide sheet may be crystallized during glass sheet formation. In alternative embodiments, sulfide based solid electrolyte layer 201-Z may be a sulfide sheet formed by powder/particle compaction of Li ion conducting sulfide particles, including sulfide glass particles, sulfide glass-ceramic particles, polycrystalline sulfide ceramic particles and combinations thereof. Such materials include thio-Lisicons and Li—Ge—P—S (LGPS) type ionic conductors. For example, $Li_4GeS_4$, $Li_3PS_4$, $Li_4SiS_4$, $Li_{3.25}Ge_{0.25}P_{0.75}S_4$, $Li_{4+x}Si_{1-x}Al_xS_4$ and $Li_{4+x}Ge_{1-x}Ga_xS_4$, $Li_{4-x}Si_{1-x}P_xS_4$ with $x=0.6$, $Li_{10}GeP_2S_{12}$, $Li_7P_3S_{11}$, $Li_1lAlP_2S_{12}$, $Li_{10}SnP_2S_{12}$. The techniques of this disclosure are also applicable to enhance the performance of sulfide based solid electrolyte structures made by particle compaction, such as are described in U.S. Pat. Pub. No.: 20120177997; U.S. Pat. Pub. No.: 20130164631; and U.S. Pat. Pub. No.: 20160133989, and as described herein, by encapsulating one or more of the sulfide surfaces with an encapsulating nanofilm, as described throughout this disclosure.

Nanofilm Composition and Thickness

The choice of material layer compositions for the inorganic nanofilm is informed by the ability of that material, in dense ultra-thin form, to impart the desired functionality and/or advantage, such as moisture imperviousness, improved mechanical strength, enhanced chemical resistance to liquid electrolytes and oxidative stability in direct contact with cathode electroactive materials (e.g., intercalation materials having a voltage versus lithium metal that is greater than about 2.5V or greater than about 3V or greater than about 3.5V).

In various embodiments the material composition of the nanofilm or nanolayer is an insulator in bulk form, but is transparent or permeable to lithium ions as a nano layer.

In various embodiments the nanofilm composition is a binary metal/semi-metal oxide or metal/semi-metal nitride; the binary nature generally simplifies nanofilm deposition, and so is preferable, however the present disclosure is not limited as such. Particularly suitable compositions include the following and their combinations, aluminum oxide, boron oxide, zirconium oxide, yttrium oxide, hafnium oxide, and niobium oxide, tungsten oxide, titanium oxide, tantalum oxide, molybdenum oxide, zinc oxide, silicon oxide, vanadium oxide, chromium oxide, and silicon nitride, aluminum nitride, boron nitride, tungsten nitride, titanium nitride, chromium nitride, tantalum nitride, copper nitride, gallium nitride, indium nitride, tin nitride, zirconium nitride, niobium nitride, hafnium nitride, tantalum nitride. Multi-component nanofilm compositions (e.g., tertiary, ternary, and quaternary compositions) are also contemplated herein, including oxides and nitrides of one or more metals/semi-metals, including aluminum, boron, zirconium, yttrium, hafnium, niobium, tungsten, titanium, tantalum, vanadium, chromium, molybdenum, zinc, and silicon. Moreover, the above listed compositions may be combined with lithium to form lithium containing nanofilm compositions, including: lithium metal/semi-metal oxides, such as lithium aluminum oxide, lithium aluminum silicon oxide, lithium tantalum oxide and lithium niobium oxide; and lithium metal/semi-metal nitrides, such as lithium aluminum nitride, lithium silicon nitride, lithium boron nitride and combinations thereof.

In particular embodiments, the nanofilm is a phosphorous oxide or oxynitride, such as a lithium phosphorous oxide (e.g., $Li_2PO_4$) and lithium phosphorous oxynitride (i.e., a LIPON type nanofilm) with various stoichiometries, including $Li_2PO_2N$.

In particular embodiments, the nanofilm is a phosphorous-nitride (e.g., $P_3N_5$), and in embodiments thereof may be a lithium phosphorous nitride devoid of oxygen; i.e., a ternary lithium phosphorous-nitride compound (e.g., $LiPN_2$, $Li_7PN_4$).

In various embodiments, the nanofilm composition is that of an intrinsic Li ion conducting material. Intrinsic lithium ion conducting materials comprise lithium ions, and are generally understood in the art as lithium ion conducting solid electrolyte materials. An intrinsic Li ion conducting material is, itself, Li ion conductive, and typically has a room temperature conductivity of at least $10^{-7}$ S/cm, and its ability to conduct Li ions does not depend on a second material (e.g., a material layer onto which it is coated). Examples of intrinsic Li ion conducting material compositions which are suitable herein for use as the material of the nanofilm or that of a nanolayer include lithium phosphorous oxynitride (e.g., LiPON), lithium titanates, lithium lanthanium titanates, lithium phosphate (e.g., $Li_3PO_4$), lithium nitrate ($LiNO_3$), lithium silicates, lithium tantalum oxide (e.g., $LiTaO_3$), lithium aluminum oxide (e.g., $LiAlO_x$), lithium niobium oxide (e.g., $LiNbO_3$), lithium nitride ($Li_3N$), lithium silicon aluminum oxide, lithium germanium aluminum oxide, and lithium germanium silicon aluminum oxide. In contradistinction, nanofilm materials that are devoid of lithium, are not intrinsic lithium ion conductors (e.g., metal oxides and metal nitrides devoid of lithium as well as phosphorous nitrides devoid of oxygen and lithium).

With reference to FIG. 2I, in various embodiments, the nanofilm composition is an inert binary metal oxide (e.g., alumina, hafnia, zirconia), and the thickness of the alumina nanofilm is in the range of 1 nm to 100 nm (e.g., about 1 nm, or about 2 nm or about 5 nm, or about 10 nm, or about 20 nm or about 30 nm or about 40 nm or about 50 nm or about 60 nm or about 70 nm or about 80 nm or about 90 nm or about 100 nm). In particular embodiments, the inert metal oxide nanofilm fully encapsulates all surfaces of the sulfide glass sheet and has a thickness in the range of about 1 nm to 5 nm (e.g., about 1 nm, or about 2 nm, or about 3 nm, or about 4 nm, or about 5 nm. It is also contemplated herein that some amount of moisture barrier benefit is provided from an exceptionally thin fully encapsulating nanofilm, having thickness less than 1 nm (e.g., about 0.1 nm, or about 0.2 nm, or about 0.3 nm, or about 0.4 nm, or about 0.5 nm, or about 0.6 nm, or about 0.7 nm, or about 0.8 nm, or about 0.9 nm). In another particular embodiment, the inert nanofilm may be employed to provide superior moisture barrier properties for protecting the sulfide glass during storage. In such said embodiments, thicker nanofilms generally provide an improved barrier; for instance, inert nanofilms with enhanced barrier properties are contemplated herein to have thickness in the range of 5 nm to 10 nm, or 11.0 nm to 20 nm, or 20-30 nm, or 30-40 nm, or 40-50 nm, or 50-60 nm or 60-70 nm, or 70-80 nm, or 80-90 nm or 90-100 nm. In various embodiments, prior to incorporating the solid electrolyte structure into a battery cell and/or prior to depositing lithium metal onto the first major surface of the nanofillm, the nanofilm thickness adjacent the first and/or second major surfaces of the sulfide glass sheet is reduced or entirely removed (e.g., by plasma etching that portion of the nanofilm). As described in more detail herein below, when making a solid-state laminate of the present disclosure, the procedure to remove the nanofilm is performed just prior to depositing lithium metal onto the first major surface of the glass sheet (e.g., an inert binary metal oxide nanofilm (e.g., alumina) of thickness greater than 5 nm is entirely removed by Argon plasma etching prior to depositing lithium metal onto that surface).

With reference to nanofilm-encapsulated sulfide glass solid electrolyte structure 200-2L shown in FIG. 2L, nanofilm 202-Z-2L is configured to have an asymmetric architecture wherein the thickness and/or composition of the nanofilm first major portion is different than that of the nanofilm second major portion. In various embodiments, the asymmetric architecture nanofilm is composed of two nanolayers: i) first nanolayer 202-Z-A, which is an inert material layer having a thickness and composition that provides a moisture barrier and a low resistance interface in direct contact with lithium metal (e.g., the ASR of the solid electrolyte structure is less than 50 $\Omega$-cm$^2$, and preferably less than 25 $\Omega$-cm$^2$; and ii) second nanolayer 202-Z-B having thickness and composition suitable for it to serve as a moisture barrier and to provide an inert surface, which, when configured in a battery cell, opposing the cathode, is chemically compatible in direct contact with cathode electroactive material having an electrochemical potential of 3 Volts or greater versus lithium metal, and therewith prevents oxidation of the sulfide glass and/or prevents dissolution of sulfide glass material into the liquid electrolyte of the battery cell.

Continuing with reference to FIG. 2L, in a particular embodiment first nanolayer 202-Z-A is an inert metal nitride and second nanolayer 202-Z-B is an inert metal oxide (e.g., a binary metal nitride and a binary metal oxide). In a specific embodiment thereof inert metal nitride nanolayer 202-Z-A is devoid of lithium metal (e.g., silicon nitride), and reactively converts to a lithiated composition when contacted with lithium metal during fabrication of a solid-state laminate electrode assembly, as described in more detail herein below. For instance, silicon nitride (e.g., SiN, Si$_3$N$_4$, SiN$_x$) converts to Li$_2$SiN$_2$ to form a low resistance interface between the lithiated silicon nitride nanolayer and the as-deposited lithium metal layer, which is typically formed by evaporation. In various embodiments thickness of first major portion 202a-Z of silicon nitride nanolayer 202-Z-A is in the range of 1 to 100 nm (e.g., in the range of 1 nm to 10 nm). Continuing with reference to nanofilm-encapsulated sulfide glass solid electrolyte structure 200-2L, in a specific embodiment second nanolayer 202-Z-B is an inert metal oxide such as aluminum oxide, zirconium oxide, and niobium oxide, with thickness in the range of 0.1 nm to 100 mn. In particular embodiments, the thickness of inert metal oxide nanolayer 202-Z-B is in the range of 0.1 nm to 1 nm, or in the range of 1 nm to 10 nm.

Continuing with reference to FIG. 2L, in another particular embodiment first nanolayer 202-Z-A is a phosphorous nitride devoid of oxygen (e.g., P$_5$N$_5$) that reactively lithiates in direct contact with lithium metal (e.g., upon lithium evaporation), to form a lithiated phosphorous nitride devoid of oxygen (e.g., LiPN$_2$, Li$_7$PN$_4$, or a combination thereof). In various embodiments thickness of first major portion 202a-Z of the P$_3$N$_5$ nanolayer 202-Z-A is in the range of 1 to 100 nm (e.g., in the range of 1 nm to 10 nm).

With reference to the encapsulated sulfide glass solid electrolyte structures described and illustrated in FIGS. 2I-2P, in various embodiments all surfaces of the sulfide glass solid electrolyte sheet 201-Z are encapsulated in directed contact by the nanofilm.

In various embodiments, to achieve the requisite conformal and encapsulating features, the continuous encapsulating nanofilm and its associated nanolayers are deposited/coated onto the surfaces of the sulfide glass sheet via the technique known as atomic layer deposition (ALD), including PEALD (plasma enhanced atomic layer deposition). ALD is a vapor phase deposition process, and generally consists of multiple coatings of chemical precursors that react with each other, and the sulfide sheet, to form a monolayer on the sheet surface. Forming the nanofilm using an ALD process allows for precise and accurate control of thickness and conformality, which is an attribute that allows the continuous nanofilm to form and encapsulate the edge and corner surfaces of the sulfide solid electrolyte sheet. Two reviews on ALD include: i) a journal article published in Materials Today, Volume 17, Number 5, June 2014 by Richard W. Johnson, Adam Hultqvist, and Stacey F. Bent entitled "A brief review of atomic layer deposition: from fundamentals to applications;" and ii) a journal article published in Chem. Rev. 2010, 110, 111-131 by Steven M. George, and entitled "Atomic Layer Deposition: An Overview," both of which are incorporated by reference herein for their disclosures relating to ALD techniques. When the sulfide sheet takes the form of a continuous web (e.g., a continuous web of Li ion conducting vitreous sulfide glass), ALD techniques for continuous roll-to-roll deposition may be used, and are described in U.S. Pat. No. 9,598,769 entitled "Method and System for Continuous Atomic Layer Deposition;" U.S. Pat. No. 8,304,019 entitled "Roll-to-Roll Atomic Layer Deposition Method and System;" U.S. Pat. Pub. No.; 2007/0281089 entitled "Systems and Methods for Roll-to-Roll Atomic Layer Deposition on Continuously Fed Objects;" U.S. Pat. Pub. No.: 2015/0107510 entitled "Coating a Substrate Web by Atomic Layer Deposition." In various embodiments, immediately prior to depositing the nanofilm (or nanolayers) the surfaces of the sulfide based solid electrolyte sheet are cleaned by plasma etching.

Figure 2P:
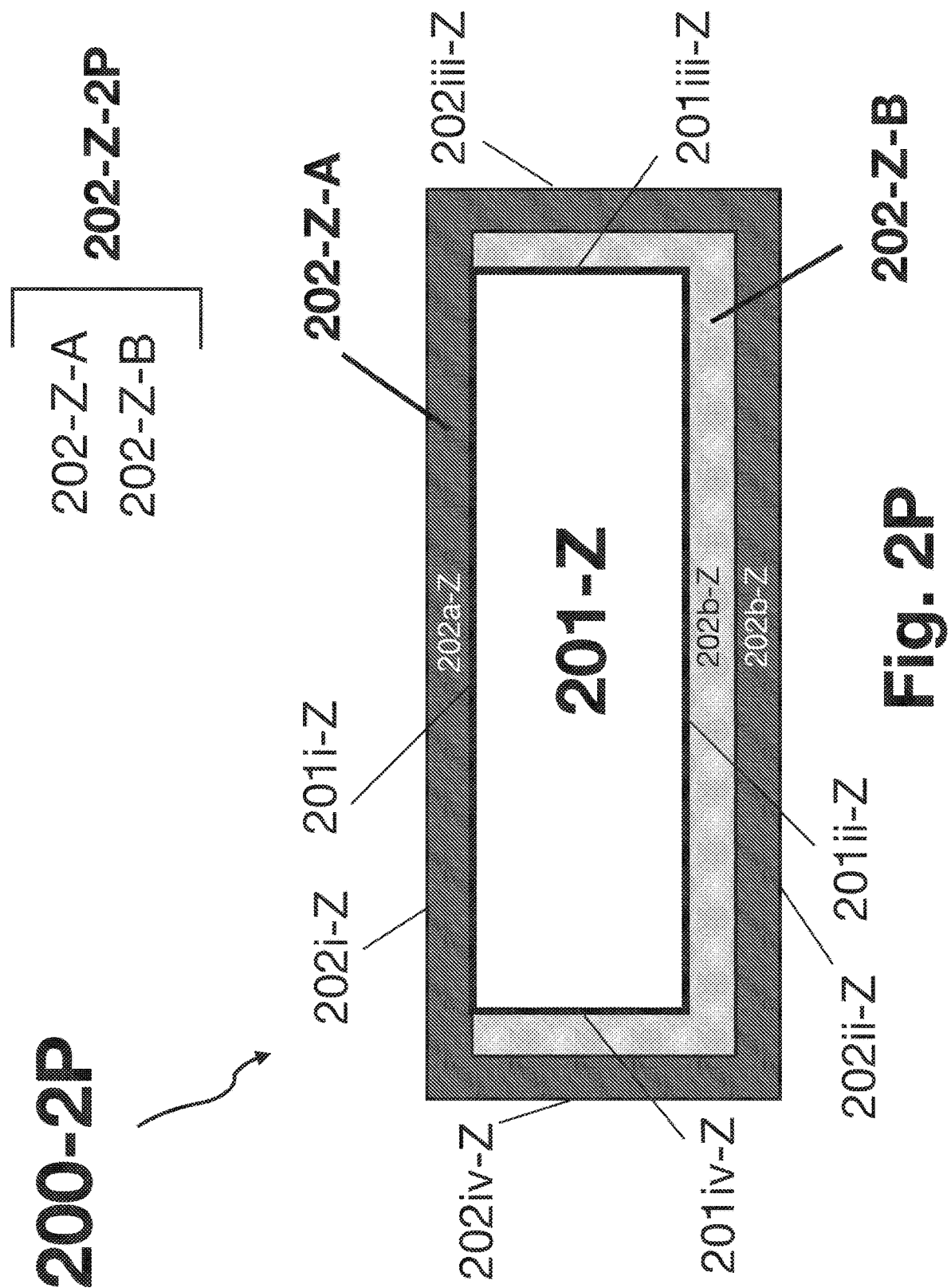
Figure 2Q:
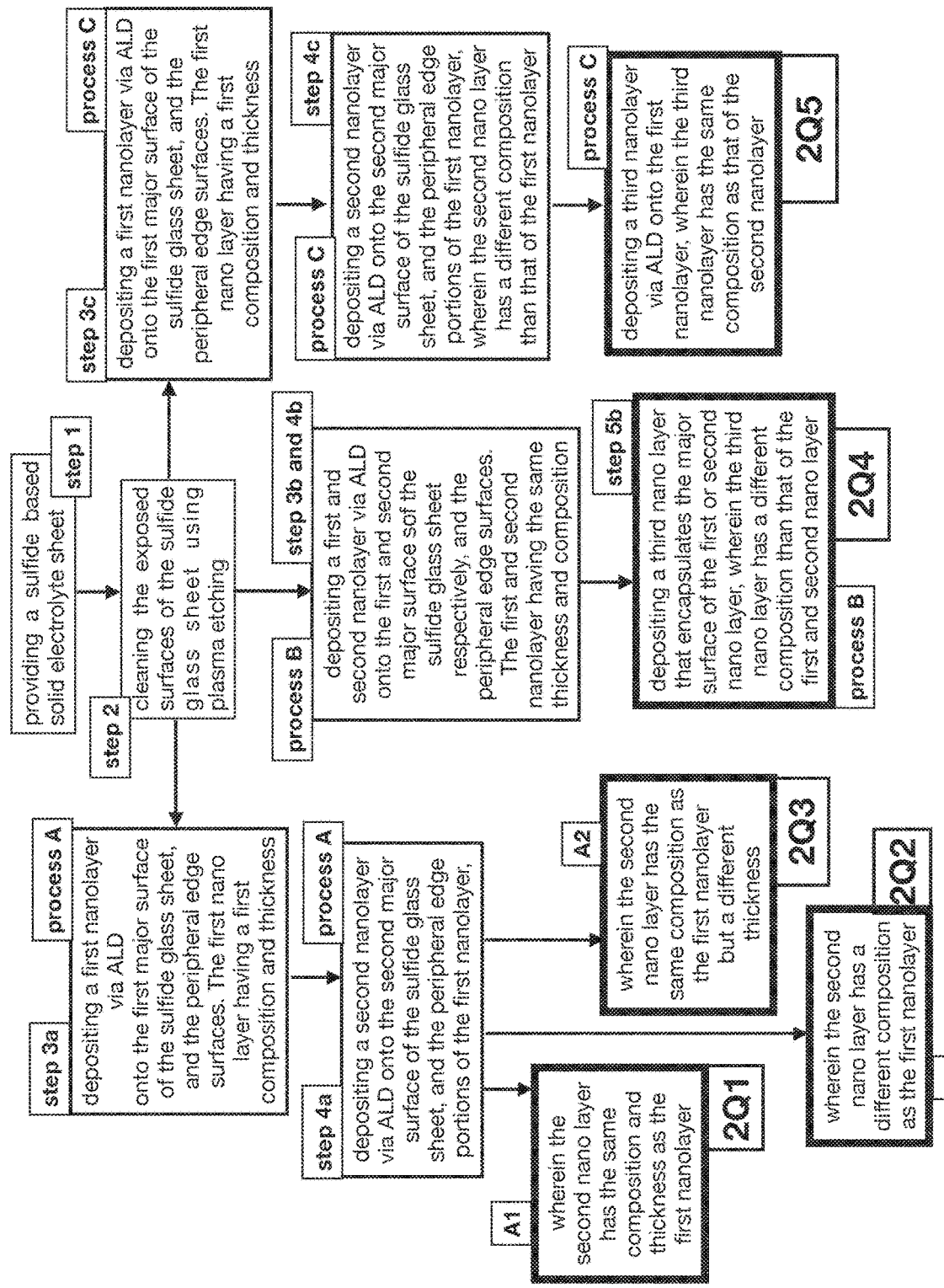
FIG. 2Q is a process flow diagram illustrating various process embodiments of making a nanofilm-encapsulated sulfide glass solid electrolyte structure in accordance with the present disclosure.

With reference to FIG. 2Q there is illustrated a process flow chart illustrating methods for making various embodiments of nanofilm-encapsulated sulfide glass solid electrolyte structures in accordance with the present disclosure. The methods include an initial step (step 1) of providing (e.g., making) a sulfide glass solid electrolyte sheet. In various embodiments, the sheet is a strip of sulfide glass having a length to width aspect ratio of at least 2, or at least 3 or at least 4 or at least 5 or at least 10. In particular embodiments the sulfide sheet of glass is provided as a web. In a second step (step 2), organic residue is removed from the surfaces of the glass sheet by any suitable technique, for example by plasma etching, such as Argon plasma etching. Thereafter the encapsulating-nanofilm is deposited via atomic layer deposition (ALD) onto the sulfide glass sheet, and the steps for making the nanofilm vary depending on the final architecture of the nanofilm-encapsulated sulfide solid electrolyte structure, and in particular the construction of the nanofilm.

In various embodiments the deposition of the nanofilm takes place in two steps. With respect to process A, as shown in FIG. 2Q, the third step (step 3a) involves depositing a first nanolayer via ALD onto the first major surface of the sulfide glass sheet as well as the peripheral edge surfaces of the glass. The fourth step (step 4a) involves depositing a second nanolayer via ALD onto the second major surface of the sulfide glass sheet, and the peripheral edge portions of the first nanolayer. Depending on the composition and thickness of the nanolayers, process A may yield a number of different nanofilm architectures, and three embodiments are illustrated in the process flow diagram, Solid electrolyte structure 2P1 is formed when the second nanolayer has the same composition and thickness as the first nanolayer (solid electrolyte structure 2Q1 is similar solid electrolyte structure 200-2I shown in FIG. 2I). Solid electrolyte structure 2Q2 is formed when the second nanolayer has a different composition than that of the first nanolayer, and is similar to solid electrolyte structure 200-2L, shown in FIG. 2L. Solid electrolyte structure 2Q3 is formed whn the second nanolayer has the same composition as the first nanolayer, but a different thickness (solid electrolyte structure 23 is similar to solid electrolyte structure 200-2J or 200-2K, as shown in FIGS. 2J and 2K respectively. With respect to process B, as shown in FIG. 2Q, the third and fourth steps (step 3b and step 4b) involve depositing a first and second nanolayer via ALD onto the first and second major surfaces of the sulfide glass sheet, respectively. The first and second nanolayers also providing encapsulation of the peripheral glass edge surfaces. The fifth step (step 5b) for process B involves depositing a third nanolayer that encapsulates the major surface of the first or the second nanolayer, wherein the third nanolayer has a different composition than that of the first and second nanolayer. In accordance with process B, the solid electrolyte structure 2Q4 thus formed is similar to solid electrolyte structures 200-2M and 200-2N, as shown in FIGS. 2M and 2N, respectively. With respect to process C, as shown in FIG. 2Q, the third step (step 3c) involves depositing a first nanolayer via ALD onto the first major surface of the sulfide glass sheet and the peripheral edge surfaces. This is followed by step 4c, which involves depositing a second nanolayer via ALD onto the second major surface of the sulfide glass sheet, and the peripheral edge portions of the first nanolayer, and further wherein the second nanolayer has a different composition than that of the first nanolayer. This is followed by step 5c, which involves depositing a third nanolayer via ALD onto the first nanolayer, wherein the third nanolayer has the same composition as that of the second nanolayer. In accordance with process C, solid electrolyte structure 2Q5 thus formed, is similar to solid structures 200-2O and 200-2P, as shown in FIGS. 2O and 2P, respectively.

Liquid Phase Protective Fluid Layer

With reference to FIGS. 2A-D and 2E-H, in accordance with the present disclosure one function of protective mated al layer 102/202 (e.g., inert liquid layer) is to removably cover and protect (e.g., encapsulate) at least the first major surface of the battery active material layer, and thereon provide a degree of protection against facile degradation caused by direct exposure of the lithium metal layer or sulfide glass layer to ambient gaseous atmospheres during handling, processing and/or storage. By use of the term "removably cover and protect" when describing the protective inert liquid layer it is meant that the layer: i) covers the first surface of the battery active material in a manner that sufficiently protects the surface against chemical attack; ii) remains on the first surface during handling and storage; and iii) can be controllably removed without damaging the battery active material layer. By use of the term "controllably remove" or "controllably removed" when referring to the protective material layer it is meant that the laminate structure is engineered to facilitate removal of the protective material layer in a controlled fashion, and is otherwise not easily removed (e.g., by happenstance, such as incidental evaporation dining handling and processing of downstream components). Accordingly, the chemical make-up and physical properties of the protective material layer is properly selected to enable its controlled removal without damaging the battery active material layer, and the laminate structure engineered to ensure that the inert material layer stays intact as a protective layer for the desired time frame.

In various embodiments protective material aver 102/202 is an inert liquid that intimately covers and spans substantially the first major surface of the battery active material layer (i.e., it is a continuous inert liquid layer). Accordingly, in various embodiments the composition of the inert liquid is selected, in part, based on it having a lower surface energy than the battery active material layer surface, and therefore capable of wetting out the battery active first major surface, and, thus, intimately covering it in direct contact, the liquid flowing and spreading out evenly to span substantially the entire surface (i.e., encapsulate the surface); e.g., encapsulate the first major surface.

Preferably inert liquid layer 102/202 readily wets the first major surface of the battery active material layer. In various embodiments, the wetting angle (θ) that the inert liquid makes in contact with the battery active material layer is less than 90° (e.g., 0≤θ<90°), preferably less than 60°, more preferably less than 30°, even more preferably θ is less than 10°, and yet even more preferably about 0°. Accordingly, in various embodiments, the ability of the inert liquid layer to wet the battery active material layer surface is sufficient to encapsulate the one or more surfaces that it covers in direct contact.

Generally, the thickness of inert liquid layer 102/202 is less than 1 mm. In embodiments the thickness of the continuous inert liquid layer is in the range of 500 to 1000 um; or in the range of 200 to 500 um; or in the range of 100 to 200 um; or in the range of 50 to 100 um; or in the range of 20-50 um; or in the range of 10-20 um or in the range of 5-10 um; or in the range of 1-5 um; or, in some embodiments, it is contemplated that it may be less than 1 um.

In various embodiments, in order to retain inert liquid layer 102/202 on the surface of the battery active material layer during handling and processing, and controllably remove it (the inert liquid layer) without imparting damage or leaving behind a chemical residue, the inert liquid is selected based on a combination of its vapor pressure and boiling point.

In various embodiments, in order to mitigate uncontrolled evaporation of inert liquid layer 102/202, while facilitating its controlled removal, the inert liquid of the protective material layer (i.e., the inert liquid layer) is selected, in part, based on having a room temperature vapor pressure in the range of 0.1-10 mmHg (e.g., 0.1-1 mmHg), and/or based, in part, on having a boiling temperature in the range of 100-200° C.

In various embodiments, the inert liquid of protective material layer 102/202 is selected based on having a sufficiently low vapor pressure at room temperature (e.g., less than 10 mmHg, or less than 1 mmHg).

In various embodiments, the inert liquid of protective material layer 102/202 is selected based on having a sufficiently high boiling point temperature (e.g., greater than 100° C., or greater than 150° C. or greater than 200° C.).

In various embodiments the inert liquid of protective material layer 102/202 is selected based on having a room temperature vapor pressure that is less than 10 mmHg and a boiling point temperature greater than 100° C.

In various embodiments protective material layer 102/202 is composed of one or more inert hydrocarbon liquids (e.g., isododecane). Particularly suitable hydrocarbon liquids for use as a protective material layer are saturated hydrocarbons (e.g., having a number of carbon atoms per molecule ranging from 5 to 15).

In various embodiments the inert hydrocarbon liquid is a saturated hydrocarbon liquid.

In some embodiments the protective inert liquid saturated hydrocarbon is a straight chain alkane (typically having between 5 and 15 carbon atoms per molecule), such as n-Pentane, n-Hexane, n-Heptane, n-Octane, n-Nonane, n-Decane, n-Undecane, n-Dodecane.

In some embodiments the protective inert liquid saturated hydrocarbon is a branched chain alkane (typically having 5 to 15 carbon atoms per molecules), such as isopentane, isohexane, isoheptane, isooctane, tetraethyl methane, isodecane, 3-methyldecane, isododecane.

In some embodiments the protective inert liquid saturated hydrocarbon is a cycloalkane, such as cyclohexane, and cycloheptane, cyclooctane.

In some embodiments the protective inert liquid hydrocarbon is an unsaturated acyclic hydrocarbon (e.g., $C_nH_{2(n-m-1)}$ wherein n is the number of carbon atoms and m is the number of double bonds), such as alkenes (e.g., 1-Hexane, 1-Octane, 1-Nonene, 1-Docene, 1-Undecene, 1-Dodecene, or Alkadienes (e.g., 1,5-Hexadiene; 2,4-Hexadiene; 1,6-Heptadiene; 1,7-Octadiene; 1,8-Nonadiene; 1,9-Decadiene; 1,10-Undecadiene; and 1,11-Dodecadiene.

In various embodiments the inert hydrocarbon liquid is an unsaturated hydrocarbon liquid.

In some embodiments the protective inert liquid is an unsaturated cyclic hydrocarbon (e.g., of the type $C_nH_{2(n-m)}$ wherein n is the number of carbon atoms and m is the number of double bonds), such as Cyclohexane, Cycloheptane, and Cyclooctene).

In some embodiments the protective inert liquid is an unsaturated cyclic hydrocarbon (e.g., one or more Cycloalkadienes), such as 1,3-Cyclohexadiene; 1,4-Cyclohexadiene; 1,3-Cycloheptadiene; and 1,3-Cyclooctadiene).

Generally, protective inert liquid layer 102/202 is devoid of dissolved and/or dispersed chemicals (e.g., salts, lubricants and/or greases) that would coat the surface of the battery active material layer with a solid film or leave behind a sticky residue. Accordingly, the protective inert liquid layer is generally devoid of dissolved salts (e.g., lithium salts, or more generally alkali metal salts).

In order to be inert in direct contact with the battery active material layer, the liquid hydrocarbon(s), and, more generally, the protective inert liquid layer should have a very low concentration of moisture. Preferably the concentration of moisture in the inert liquid hydrocarbon layer is less than 10 ppm of water, more preferably less than 5 ppm of water, even more preferably less than 1 ppm of water, and yet even more preferably less than 0.1 ppm of water (i.e., super dry). In various embodiments the inert liquid is actively dried in the presence of sacrificial alkali metal surfaces (e.g., pieces/chips of lithium metal) that getter oxygen, water and nitrogen impurities. In various embodiments, the cumulative area of the sacrificial alkali metal surfaces in direct contact with the inert liquid is greater than the first major surface of the battery active material layer on which the inert liquid covers in direct contact, for instance, when the battery active material layer is disposed in a protective liquid bath, as described in more detail herein below.

Standalone Alkali Metal Laminate Structures in accordance with the standalone electrochemical material laminate structure embodiments described with reference to FIGS. 2A-D, the laminate structures 100A-D are alkali metal laminate structures wherein battery active material layer 101 is an alkali metal layer having substantially unpassivated first major surface 101i, and preferably surface 101i is pristine.

In various embodiments alkali metal layer 101 is a dense alkali metal layer. In various embodiments it is a lithium metal layer or sodium metal layer. It is also contemplated that the alkali metal layer may be a lithium metal alloy or a sodium metal alloy, which may include one or more of the following alloying elements, including Ca, Mg, Sn, Ag, Zn, Bi, Al, Cd, Ga, In and Sb. In various embodiments alkali metal layer 101 is a lithium metal layer.

In various embodiments thickness of lithium metal layer 101 is typically no greater than 50 microns, and more typically no greater than 25 microns (e.g., 50 µm≥t>30 µm; or 30 µm≥t>20 µm; or 20 µm≥t>10 µm; or 10 µm≥t≥5 µm). In some embodiments lithium metal layer 101 is a thin film coating on a current collector having a scant amount of lithium, with thickness no greater than 5 um thick, and typically thinner, such as about 4 µm or about 3 µm or about 2 µm or about 1 µm, or less than 1 µm (e.g., 5 µm≥t≥0.1 µm). For example, the thin film of lithium metal may be coated by evaporation onto a copper current collector in a vacuum chamber, and then prior to backfilling the chamber with a dry inert gas, such as argon or helium, the first major surface of the coated film is immersed in protective liquid or coated with a layer of inert protective liquid.

In accordance with the present disclosure, in various embodiments, lithium metal surface 101i is substantially unpassivated and preferably pristine, as defined herein below. And even more preferably, lithium metal surface 101i is 100% unpassivated. Preferably, lithium metal surface 101i is 100% unpassivated and molecularly or atomically clean.

Continuing with reference to the lithium metal laminate structures described herein above with reference to FIGS. 2A-D, in various embodiments first major surface 101i of lithium metal layer 101 is substantially unpassivated (or pristine), and is able to remain substantially unpassivated (or pristine) for a duration of at least 10 seconds, or at least 1 minute, or at least 5 minutes, or at least 10 minutes when it (the laminate structure) is disposed in a dry chamber having a water and oxygen content of about 1 to 10 ppm (e.g., about 5 ppm).

By use of the term "pristine surface" with reference to alkali metal layer 101 (e.g., a lithium metal layer), it is meant a substantially unpassivated lithium metal surface that is also sufficiently clean to i) facilitate complete reactive bonding to an opposing solid electrolyte layer, wherein the adherence created by the complete bond is sufficiently strong to prevent mechanical non-destructive release or delamination between the layers; and ii) effectuate a sufficiently uncontaminated interface (with the solid electrolyte layer) that is conductive to Li ions and does not result in a prohibitively large interface resistance (preferably no greater than 50 $\Omega\text{-cm}^2$) between the alkali metal layer (e.g., a lithium metal layer) and the solid electrolyte layer (e.g., a sulfide glass layer).

By "substantially unpassivated" when referring to an alkali metal layer surface (e.g., a lithium metal surface) it is meant that the surface is predominately defined by a continuous unpassivated and substantially unoxidized surface region that accounts for at least 70% of the area of the referenced lithium metal surface (e.g., first major surface 101*i*). When referring to a lithium metal layer surface as pristine it is meant that the continuous unpassivated and substantially unoxidized surface region accounts for at least 90% of the area of the referenced lithium metal surface, and preferably at least 95%, and even more preferably the pristine surface is entirely unpassivated (i.e., 100% of the surface is unpassivated). In various embodiments, as described in more detail herein below, the substantially unpassivated or pristine surface may contain a certain amount of discrete passivated surface portions (i.e., passivated islands).

By "sufficiently clean" when referring to the pristine lithium metal surface, it is meant that the continuous unpassivated and substantially unoxidized surface region, as described above, is not poisoned by an unduly thick non-self-limiting surface-layer, which, if otherwise present would preclude complete reactive bonding and strong adherence to a reactive solid electrolyte layer (e.g., as defined with respect to peel strength), and would degrade electrochemical interface properties (e.g., as defined by interface resistance, and uneven plating and stripping reactions). Notwithstanding the preference to eliminate any poisoning of the pristine surface, a minimal non-self-limiting surface-layer covering the continuous unpassivated region may be acceptable, as described in more detail herein below.

Top down and cross sectional depictions of alkali metal layers (e.g., lithium metal layers) having pristine surfaces in accordance with various embodiments of the present disclosure are depicted in FIGS. 3A-D; and for comparison, passivated lithium metal layer 3E-101 is depicted in FIG. 3E.

Briefly, in FIG. 3A, lithium metal layer 3A-101 is shown having pristine surface 3A-101*i* that is 100% unpassivated, and molecularly or atomically clean; in FIG. 3B, pristine surface 3B-101*i* of lithium metal layer 3B-101 contains a certain amount of passivating islands 3B-160 dispersed on continuous unpassivated region 3B-165; in FIG. 3C, the pristine surface of lithium metal layer 3-101C is covered by minimal surface-layer 3C-181, which defines the surface of its unpassivated region, and has an average thickness that is preferably less than 10 nm; and in FIG. 3D pristine surface 3D-101*i* includes passivating islands 23D-160 and minimal surface-layer 3D-181 which defines the surface of its unpassivated region. Prior to describing these embodiments in more detail, it is instructive, for the purpose of comparison, to first depict the make-up of a fully passivated lithium layer.

With reference to FIG. 3E, a depiction of fully passivated lithium metal layer 3E-101 which may be a lithium metal foil that was made by extrusion and/or roller reduction in a dry air, dry oxygen and/or dry $CO_2$ gaseous environment (e.g., dry air room), or it (layer 3E-101) may be an evaporated thin lithium film deposited on a current collector (not shown) under vacuum in a chamber, and then breaking the vacuum by bleeding a stream of dry air, dry oxygen and/or dry $CO_2$ (e.g., dry air) into the chamber. The exposure to dry air immediately upon making the lithium foil/film results in the formation of passivation film 3E-179, which is a dense substantially self-limiting film of lithium oxide, and it may be several hundred angstroms thick (e.g., about 500 A), or thicker, when formed in a dry room atmosphere (i.e., dry air). The exact stoichiometry of the passivating film is difficult to ascertain, and so is generally referred to as $Li_2O_x$. Alternatively, if formed in the presence of dry $CO_2$ gas, the composition of the passivating film is primarily lithium carbonate. By use of the term substantially self-limiting it is meant that the passivating film, formed as such, is sufficiently dense and thick to effectively block further reactions and thereby mitigate subsequent film growth. For instance, lithium passivating film 3E-179, once completely formed, is chemically stable to exposure to dry room air unless subjected to an atmosphere having a prohibitively high concentration of a reactive impurity such as water, which is known to breakdown lithium passivating films overtime.

With reference to FIG. 3-A, pristine surface 3A-101*i* of lithium metal layer 3A-101 is 100% unpassivated and substantially unoxidized, and absent of even a minimal surface-layer contaminant.

With reference to FIG. 3B, pristine surface 3B-101*i* of alkali metal layer 3B-101 contains passivated islands 3B-160 dispersed throughout continuous unpassivated and substantially unoxidized surface region 3B-165. The cumulative area of the islands is less than 10% of the total area of the first major surface, and preferably the cumulative area is less than 5%, and even more preferably less than 1%. Preferably, the area size of the islands does not exceed 1 $mm^2$, and more preferably does not exceed 0.5 $mm^2$, and even more preferably does not exceed 0.1 $mm^2$. In certain embodiments the method of making alkali metal layer 3B-101 results in first major surface 3B-101*i* that is characterized as predominately unpassivated (as opposed to pristine), wherein the area of continuous unpassivated region 3B-165 accounts for less than 90%, but at least 70%, of the area of first major surface 38-101*i*.

With reference to FIG. 3C, pristine surface 3C-101*i* of alkali metal layer 3C-101 is defined, in part, by the presence of non-self-limiting minimal surface-layer 3C-181 composed of an ionically and/or covalently bonded compound which forms as a result of alkali metal atoms of the continuous unpassivated region oxidizing in contact with reactive impurity molecules derived from the external environment about the alkali metal layer structure, and especially oxygen, nitrogen and/or water impurities which may be present in the ambient gas or ambient vacuum of the external environment in which the alkali metal layer is formed, stored and/or handled, and/or as impurities in the protective liquid in which it (the pristine surface) is preserved. In various embodiments, minimal surface-layer 3C-181 is a compound product of the alkali metal atoms reacting with one or both of oxygen and water present as an impurity, and generally derived from the ambient gas of the external environment; for instance, surface-layer 3C-181, an alkali metal oxyhydroxide compound (e.g., lithium oxyhydroxide). Minimal surface-layer 3C-181 is not necessarily continuous as shown in FIG. 3C, and may be spread out as discrete sections over the continuous unpassivated region. When present, surface-layer 3C-181 is minimal and exceptionally thin, having an average thickness that is less than 200 Å, and more preferably less than 100 Å, and even more preferably less than 50 Å or less than 40 Å or less than 30 Å. Even more preferably, the pristine surface is characterized as molecularly clean, which is to mean that the average thickness of surface-layer 3C-181 is less than 25 Å, and even more preferably the pristine surface is atomically clean, with surface-layer 3C-181 181 having an average thickness of less than 10 Å.

With reference to FIG. 3D, lithium metal layer 3D-101 has pristine surface 3D-101$i$ which is similar to that shown in FIG. 3C in that the unpassivated surface region is defined by a minimal surface-layer 3D-181, similar to 3C-181 (as described above and shown in FIG. 3C), but also containing passivating islands 3D-160, similar to the passivating islands described above with reference to FIG. 3B.

Methods of Making Pristine Lithium Metal Layers and Lithium Metal Layers Having Substantially Unpassivated Surfaces As described above, the present disclosure provides methods and apparatus' for making lithium metal layers having substantially unpassivated and preferably pristine surfaces, and, in particular, for making lithium metal layers wherein at least one major surface is maintained in its pristine or substantially unpassivated condition under, or immersed in, a protective fluid (e.g., a protective liquid).

With reference to FIGS. 4A-D there are illustrated apparatus' 400A-D for the manufacture of lithium metal layer 101, having first and second major opposing surfaces 101$i$/101$ii$, wherein at least first surface 101$i$ is formed in direct contact with protective fluid 102 (e.g., super dry inert hydrocarbon liquid, vapor or combination thereof), and therewith surfaces 101$i$ and 101$ii$ are substantially unpassivated, and in some embodiments pristine.

Figure 4A:
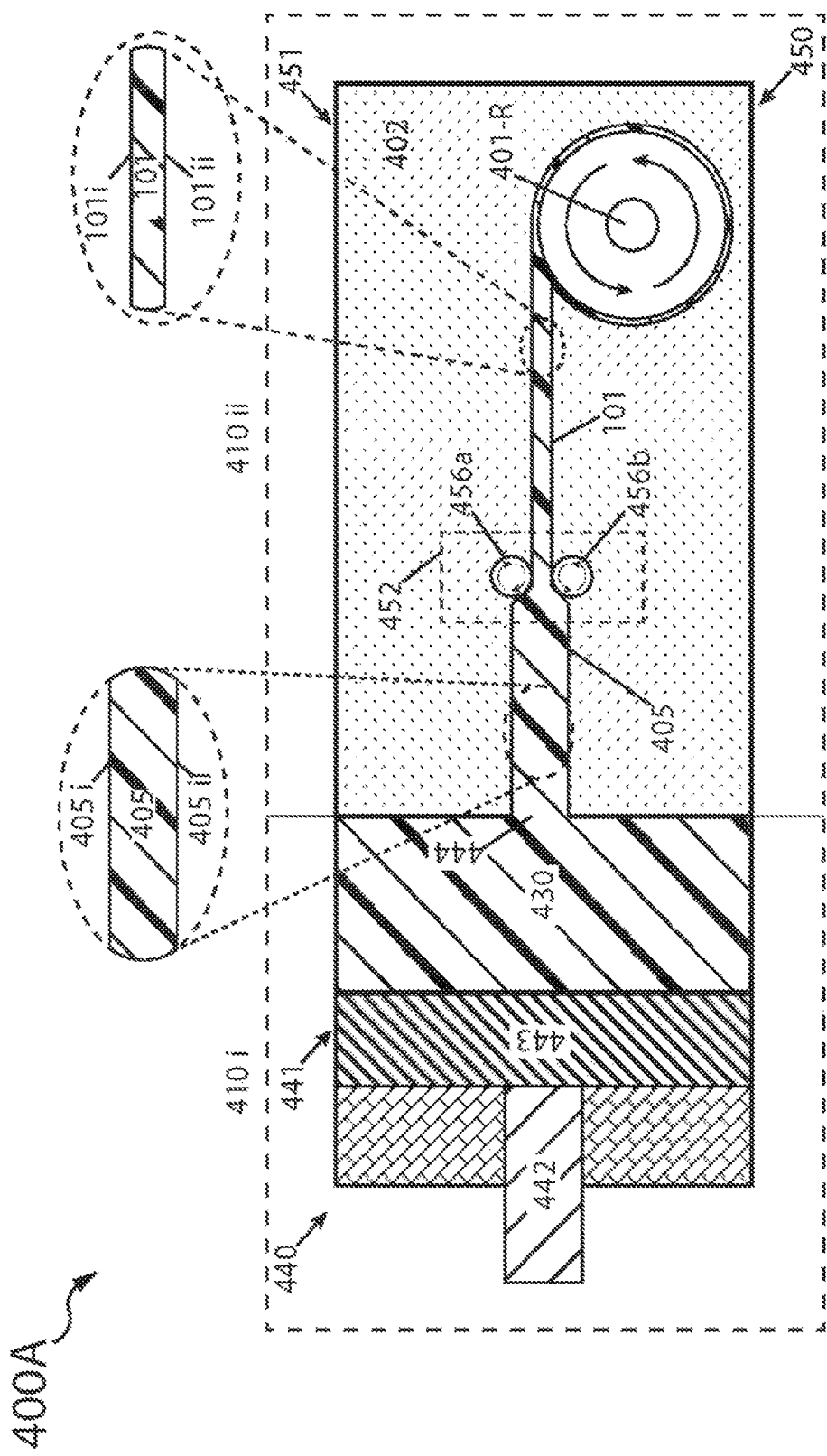

Apparatus' 400A-D may be divided into two main sections or regions. First section 410$i$ (typically a staging section) is where the initial stock of lithium metal 430 (e.g., an ingot or foil of lithium) is positioned for entry or disposition into second section 410$ii$ (surface generating section), and, in particular, surface forming chamber 450 wherein lithium layer 101 and/or its pristine first surface 101$i$ (and optionally 101$i$) are formed in direct contact with protective fluid 402 (e.g., super dry inert hydrocarbon liquid as described above). Chamber 450 includes enclosure 451, and is equipped with surface forming device 452, and interior environmental controls not shown. Once created, as-formed lithium layer 101 may be wound and/or stored in protective liquid of the same or different composition as that in which the layer itself (or at least its first surface) was generated. As shown in FIG. 4A, as formed lithium layer 101 is wound to form lithium roll 401-R. The winding may be performed inside chamber 450 (as shown), or lithium layer 101 may be fed to a separate downstream chamber for subsequent winding and storage in roll form.

In various embodiments, a lithium decal (as shown in FIG. 2D) may be formed by interleaving one or a pair of solid release layers (e.g., a polyolefin sheet or film) into the roll during winding. As described above, in a lithium decal of the present disclosure, the solid release layer is positioned on the first and/or second major surface where it keeps the inert liquid in place, ensures that the liquid spreads evenly over surface 101$i$, mitigates evaporative losses because it (the solid release) enhances barrier properties, provides physical protection against contact damage, enables the use of protective liquids having relatively high vapor pressures, and serves as an interleave when stacking or rolling the layer(s) to avoid sticking. Once the decal is wound, surface 101$i$ is encapsulated by a protective liquid layer, and in some embodiments the liquid may be caused to form a sheath about the layer, which encapsulates both first and second surfaces.

Figure 4B:
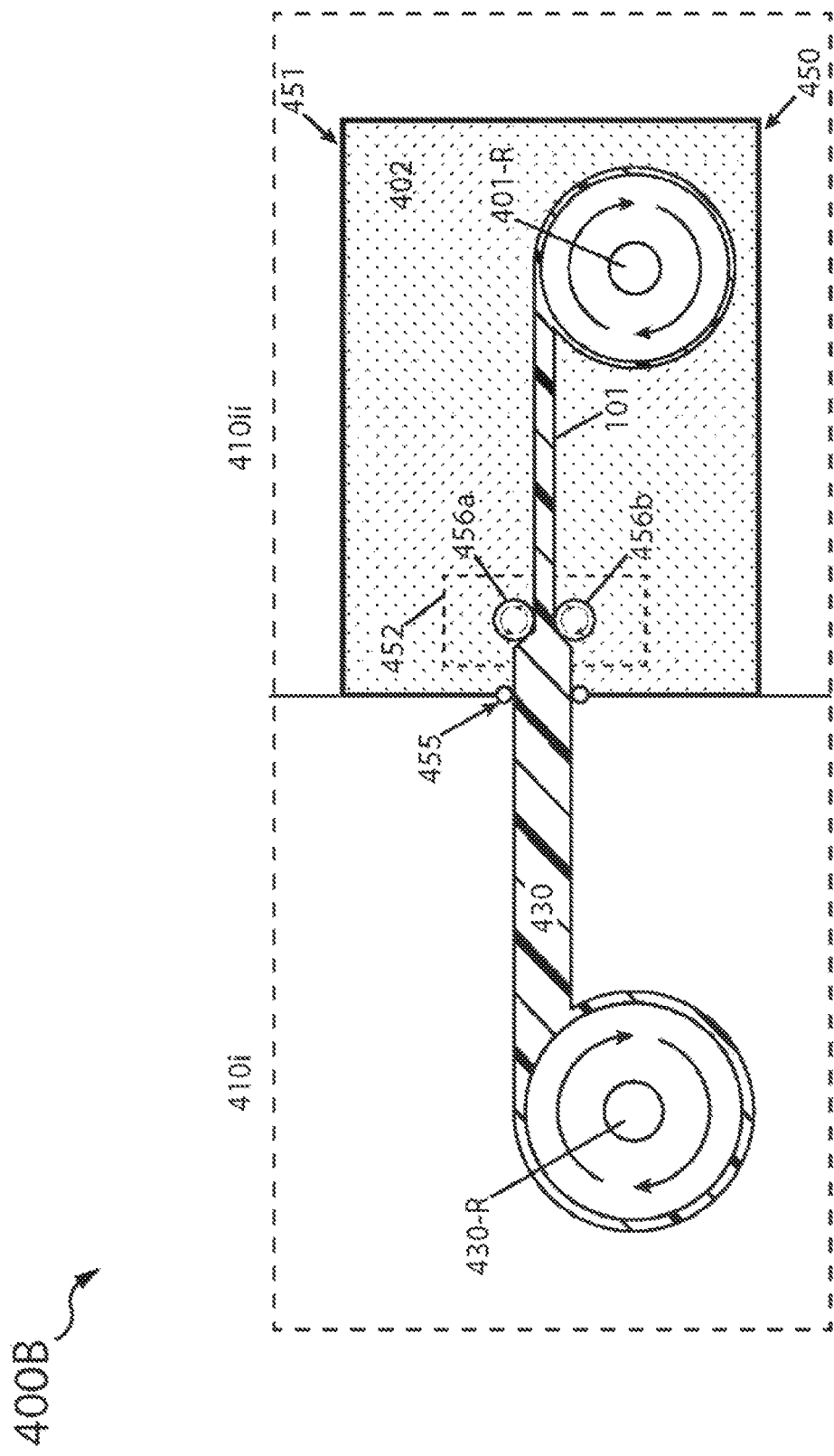
Figure 4D:
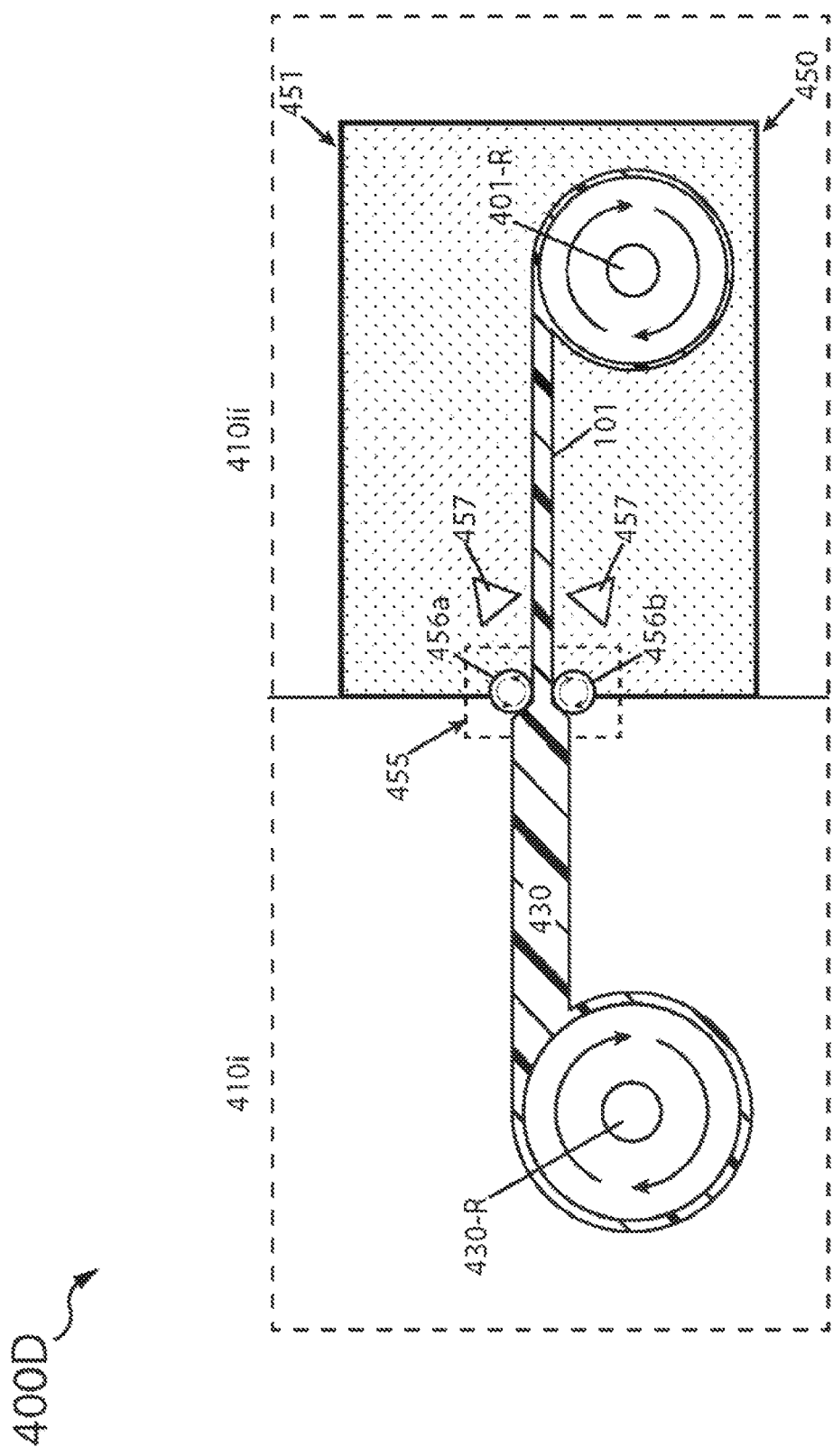

With reference to FIGS. 4A-B and FIG. 4D, in various embodiments, both first and second major opposing surfaces (101$i$ and 101$ii$; see figure inserts) are formed in direct contact with protective liquid by action of surface forming device 452 having surface forming component(s) 456$a/b$ that directly contact lithium metal layer 101 as it forms. As shown, surface forming device 452 may be a roller reduction mill that reduces thickness of the lithium metal layer and in so doing produces substantially unpassivated lithium surfaces by extruding initial stock 430, or lithium layer 405 (as shown in FIG. 4A), between rollers 456$a/b$. When roller reducing a lithium metal foil, the area of the new surface created is proportional to the decrease in thickness.

Surface forming device 452 contacts protective liquid 402 such that as lithium metal layer 101 is formed, or surface 101$i$ and/or surface 101$i$ is created, the as-formed surfaces substantially instantaneously become immersed in protective fluid (e.g., inert liquid). Once the layer is formed, the inert liquid is caused to remain on the freshly created lithium layer surfaces (e.g., by using a solid release layer on that surface), typically fully encompassing (i.e., encapsulating) the surface, and thereon protecting it (the pristine surface) from direct contact with lithium reactive constituents that may be present as contaminants in of the ambient environment about the layer. In various embodiments, the protective fluid in which pristine lithium metal surface 101$a$ is formed may be exchanged with protective fluid having a different composition for downstream processing and/or storage. For instance, surface 101$i$ formed in or under a first protective liquid having a first vapor pressure or boiling point and that first inert liquid is replaced by a second inert liquid having a second vapor pressure or boiling point (e.g., the second liquid having a higher vapor pressure and lower boiling point than the first liquid, or vice-versa).

In various embodiments, surface forming device 452 is fully, or at least partially, immersed in protective fluid 402. For instance, active surface forming component 456, may be fully submerged or encompassed inside a bath of protective liquid. To contain protective liquid 102, surface generating section 410$ii$ includes enclosure 451 (e.g., an environmental chamber). In various embodiments, the surface forming device, and in particular its surface forming components, are also housed in the enclosure.

In various embodiments protective fluid 402 is a liquid at room temperature (i.e., 18° C. to 25° C.) and standard pressure (1 atm), and is primarily contained in the enclosure as a liquid. In various embodiments the interior environment of the enclosure is substantially filled by inert liquid, and as described above, and in more detail herein below, in various embodiments surface forming component 456 is immersed in the inert liquid phase protective fluid, and specifically that portion of the surface forming component which directly contacts lithium metal surface 101$i$ is immersed in the liquid phase. Accordingly, surface 101$i$, or both surfaces 101$i$ and 101$bii$, are formed in direct contact with liquid phase protective fluid, and preferably the as-formed surfaces are fully encompassed/encapsulated by the liquid phase, and as such the surfaces are formed in the absence of direct contact with a gaseous phase environment (e.g., dry air or an inert gas phase environment, including one or more noble gases), and thus also not formed in a vacuum environment. For instance, the lithium metal layer and/or its associated surfaces are fully formed immersed in a protective liquid. For example, formed inside a bath of protective liquid or inside a chamber filled with protective vapor of an inert liquid.

As described in more detail herein below, once formed within the protective liquid, lithium metal layer 101, or its first and/or second major surface(s) 101i/101ii are maintained in the protective liquid for subsequent winding to form a roll of lithium metal foil 101-R (typically on a spool) and/or storage. By this expedient, as-formed lithium metal layer 101, and/or surface 101i, or both surfaces 101i and 101ii, have never been exposed to a gaseous phase environment or to a vacuum environment. In such embodiments, the lithium metal foil and its associated pristine surfaces, are formed, and thereafter stored in a pristine state, never exposed in direct contact with a gaseous atmosphere. For example, the foils so formed are maintained pristine during storage inside a bath of protective liquid for more than 24 hours, or more than 1 week, or more than 1 month. The pristine foils may then be sold and/or transported as such to a facility for manufacture of downstream battery cell components, including solid-state electrode laminates and battery cells of the present disclosure. In various embodiments the lithium foils are stored under protective liquid, and are preferably never been exposed in direct contact with gaseous atmospheres, including dry noble gases such as dry Argon gas, or dry Helium gas, or some combination thereof, or even dry air (i.e., air having a very low moisture content, such as that typical of a dry room). When rolled with a solid release layer, the release removably covers and protects the substantially unpassivated lithium metal surface 101i, and optionally its opposing surface 101ii. When a solid release is used the inert liquid layer is formed and sandwiched between the solid release layer and the lithium metal layer, and this laminate structure is sometimes referred to herein as a wet-decal architecture, or more simply a wet-decal. Preferably, the inert liquid is capable of wetting out both the lithium metal surface and the release layer.

In alternative embodiments the interior environment of chamber 450 is primarily composed of protective fluid as a vapor. In such embodiments, the vapor molecules may condense on the as-formed lithium metal surfaces. When a vapor phase protective fluid is used, the enclosure is typically vacuum evacuated, followed by evaporating the protective liquid inside the chamber to form the inert vapor. Notably, when referring to vapor phase protective fluid it is not meant a noble gas such as Argon or Helium, or the like. By protective fluid in the vapor phase it is meant vapor of the inert liquid.

With reference to FIG. 4A there is illustrated apparatus 400A for making pristine lithium metal layer 101 in protective fluid 402; for example, a super dry liquid hydrocarbon. With particular reference to FIG. 4A, initial lithium metal stock 430 (e.g., a lithium ingot) is extruded via die press 440 to form relatively thick freshly extruded lithium layer 405 (typically in the range of 75 to 500 um thick). Specifically, lithium ingot 430 is loaded and pressed against extrusion die 444 via plunger 442 and die plate 443, as is known in the art for making extruded lithium foil from lithium ingots in a gaseous dry room atmosphere.

As-formed, layer 405 is generally substantially unpassivated and preferably pristine upon exiting die 444. If formed in direct contact with a gaseous dry room environment the freshly made lithium metal surface would immediately start chemically reacting with the oxygen and carbon dioxide in the dry room, which would passivate the exposed surfaces. With respect to various embodiments of the present disclosure, because layer 405 is formed directly in protective liquid 102, its major opposing surfaces 105a/105b are fully covered in direct contact with protective liquid 102 substantially immediately upon formation (e.g., in less than one second). In the instant embodiment, thickness of layer 405 is reduced in a subsequent roll reduction step, as shown in section 410ii of FIG. 4A. Once formed, layer 405 is caused (e.g., by a pulling tension) to enter roll reduction device 452, which can be a rolling mill having reduction work rolls 456a/456b, both of which are immersed in protective liquid inside enclosure 451. Work rolls 456a-b may be made of compatible metal or plastic (e.g., polyacetal), or plastic coated metal rolls. Because the work rolls are immersed in protective hydrocarbon liquid, the issue of lithium metal sticking to the rolls is mitigated. In various embodiments roll reduction reduces the lithium layer down to a thickness of no greater than 50 um. Thin lithium metal layer 101 is formed upon exiting the roller mill; the roller reduction step effectively transforms pristine lithium layer 405 (e.g., 500 um thick) to thinner layer 101 having fresh surfaces 101i and 101ii formed in direct contact with protective liquid 402. Once formed, layer 101 may be transferred from chamber 450 to a distinct/discrete winding chamber, or the winding device may be incorporated in chamber 450, and layer 101 subsequently wound to yield lithium foil roll 401-R, which, in its wound condition, remains directly exposed in contact with protective liquid (e.g., the protective liquid forming a thin layer of liquid between the lithium metal layer and a solid release layer, not shown). As described in more detail herein below, and with reference to a lithium roll package assembly of the present disclosure, wound roll 401-R may be stored in a functional canister containing protective liquid of the same or different composition as that of protective liquid 402, and a sealable port for ease of dispensing the lithium layer during battery cell or battery cell component manufacture. In various embodiments a solid release layer is positioned on the substantially unpassivated lithium surface (e.g., during winding or stacking), and the laminate structure so formed has, what is termed herein, a wet-decal architecture as described in more detail herein below.

Continuing with reference to FIGS. 4A-D, in various embodiments lithium metal layer 101 is a thin lithium metal layer, typically of thickness no greater than 50 μm, and more typically no greater than 25 μm (e.g., the thickness (t) of layer 101 is in the range of: 25 μm≥t>20 μm; or 20 μm≥t>15 μm; or 15 μm≥t>10 μm; or 10 μm≥t>5 μm). The standalone lithium metal layer may be self-supporting (if thicker than about 20 μm) or supported on a substrate layer. As described in more detail herein below, in various embodiments the lithium metal layer may be supported on a thin substrate layer that also serves as a current collector, the combination of current collector and thin lithium metal layer is sometimes referred to herein as having an electrode architecture.

As shown in FIG. 4B, in an alternative embodiment, initial lithium stock 430 may be a continuous foil of lithium (e.g., in the form of wound roll 430-R). As stock 430 is already in foil form, it may be contained inside a chamber that is configured for entry into chamber 450 via portal 455, or the layer may be exposed to the ambient external environment about chamber 450 (e.g., a dry box or dry room environment), and in this instance the stock layer would have passivated surfaces. In operation, stock foil 430 is unwound and caused, by pulling tension, to extrude through work rolls 456*a/b* immersed in protective liquid 402. As described above, once foil 430 is extruded through roller reduction mill 452, it is wound in a similar fashion as described above, to form lithium roll 401-R immersed in protective liquid. In various embodiments stock lithium foil 130 may be pre-passivated (e.g., by exposing its surfaces to dry $CO_2$) and by this expedient improve reproducibility of the surface condition of the initial stock foil.

As shown in FIG. 4C, in yet another alternative embodiment stock foil 430 may be surface treated inside chamber 450 to expose a fresh lithium surface in direct contact with protective fluid 402 (e.g., ground with an abrasive element such as a brush or rough polymeric sheet). For instance, surface forming device 456 (e.g., an abrasive brush) may be positioned over stock foil 430 as it enters the chamber, and caused to engage with a surface of stock layer 430 to form pristine layer 101 and its associated pristine surface 101*i*. In this embodiment the stock foil does not undergo a significant reduction in thickness, as the transformation of the foil from stock 430 to pristine layer 101 is based on forming pristine surface 101*i* in direct contact with protective fluid 402 (e.g., liquid phase, vapor phase, or both). As shown in FIG. 4C, in various embodiments the stock may be a laminate of lithium layer 430 and a current collecting layer 461 in direct contact with the second surface of layer 430. In other embodiments, the stock is a lithium foil, and one or both surfaces are formed in the protective fluid, (e.g., by brushing/grinding).

With reference to FIG. 4D there is illustrated yet another alternative apparatus for making pristine lithium metal layer in the presence of protective fluid, and in accordance with the instant disclosure. The apparatus is similar to that described above for fresh surfaces produced by roll reduction, except in this embodiment the work rolls 456*a/b* are positioned at the interface between the staging section 110*i* and surface forming section 110*ii*. Lithium stock foil 430 is configured for entry into the chamber via roller mill 455. In particular, work rolls 456*a/b* effectively provide the portal into chamber 450, and the protective liquid is distributed to completely cover the freshly extruded surfaces (e.g., by spraying the inert liquid from nozzles 457 onto one or both surfaces 101*i/ii*). Chamber 450 may be held under a dynamic vacuum with the protective fluid, in vapor form, or the chamber environment may be a combination of protective fluid in vapor form protective vapor) and a dry noble gas such as argon or helium.

As described above, in various embodiments protective fluid 402 is a liquid. In some embodiments the interior environment of the chamber is held under a dynamic vacuum with protective fluid in the vapor phase. In some embodiments the protective fluid is present in the chamber in both the vapor and liquid phases. In some embodiments the chamber is substantially filled with liquid phase protective fluid (e.g., more than 90% of chamber volume is accounted for by protective liquid). Generally the protective fluid is a hydrocarbon composed of one or more hydrocarbon molecules that do not react in direct contact with lithium atoms.

Figure 4E:
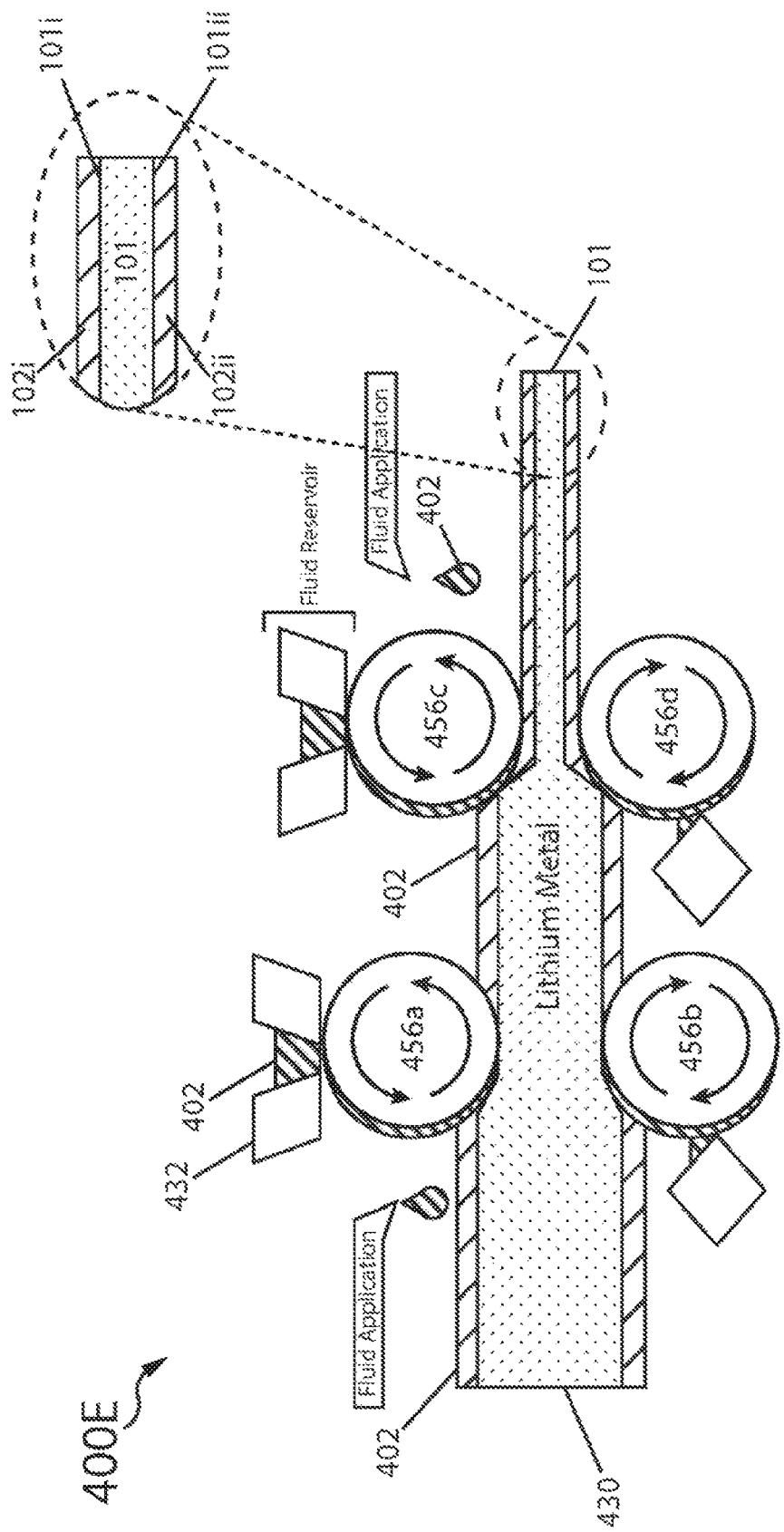

With reference to FIG. 4E there is illustrated another embodiment in accordance with the instant disclosure for a process and apparatus 400E for fabricating pristine lithium metal layer 101 using a series of roller reduction mills (e.g., two or more). Apparatus 400E is generally disposed in a closed environmentally controlled chamber, similar or the same as chamber 451, as described above. Liquid phase protective fluid 402 is applied directly onto the major opposing surfaces of lithium stock 430 (e.g., by dripping or spraying), and is configured for extrusion rolling (i.e., roller reduction). Care should be taken to ensure that the major surfaces are entirely covered with protective liquid throughout the process. Additionally, protective liquid 402 is dispensed from fluid reservoir 432 for application directly onto work roll pairs 456*a*/456*b* and 456*c*/456*d*. A further application of the protective liquid is dispensed onto surface 101*i* of the as-formed lithium metal layer 101 to ensure that the entirety of that surface is coated with a sufficient amount of protective liquid layer 102 to encapsulate the surfaces and provide sufficient protection for conveyance of the lithium foil 101 downstream for laminating processes, or for disposition into a canister for storage as a Li roll package assembly, as described below with reference to FIG. 6.

Figure 4F:
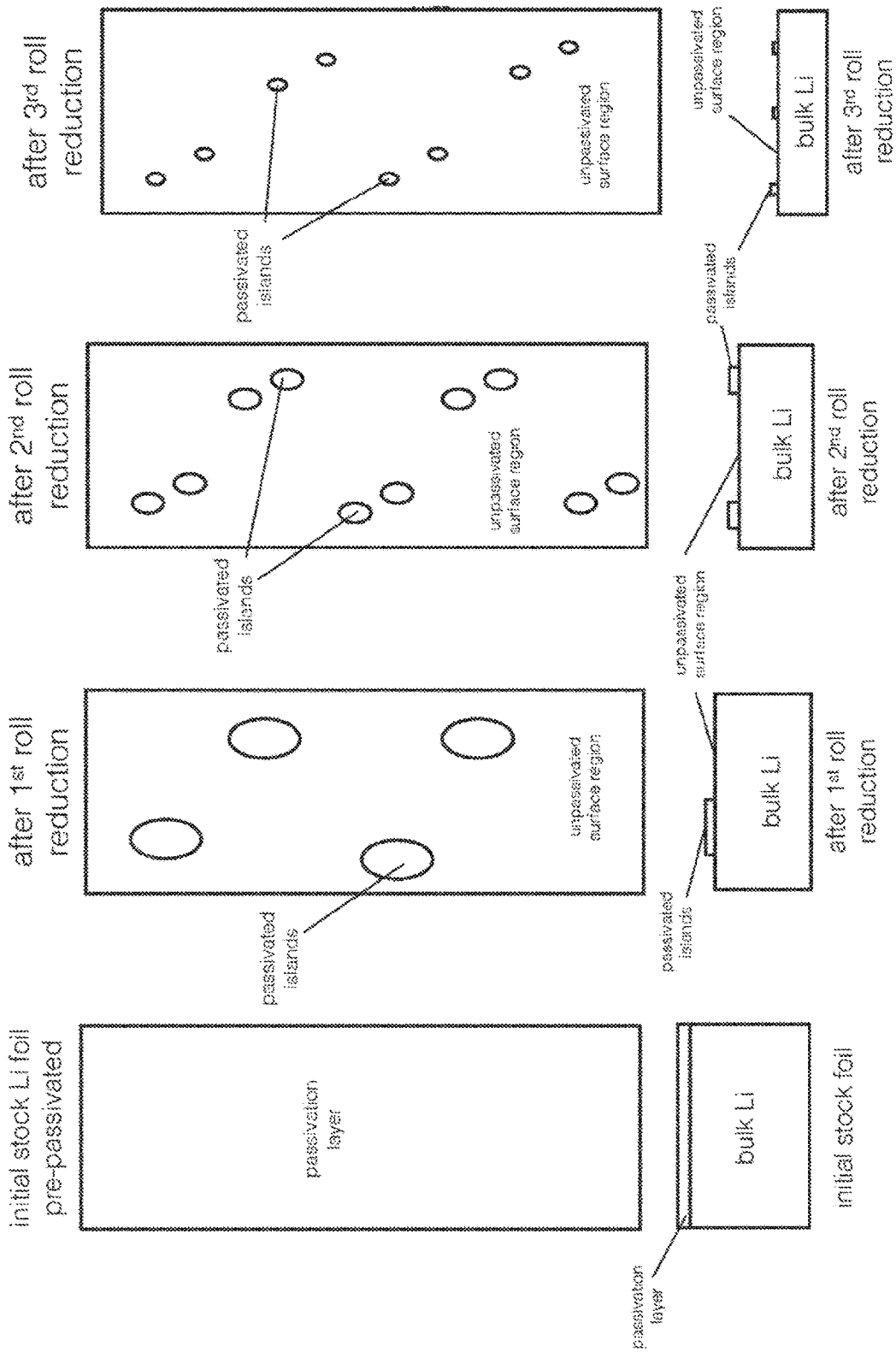

With reference to FIG. 4F there is illustrated top down views and cross sectional views qualitatively depicting the evolution of a lithium surface resulting from multiple roll reduction steps performed in protective liquid in accordance with various embodiments of the present disclosure. The initial lithium foil is stock and may be pre-passivated as shown by treatment with carbon dioxide on its surface to form a lithium carbonate passivation layer). After the first roll reduction, the lithium thickness is reduced (as shown in the cross section depiction), and the lithium carbonate passivating layer has been broken apart to expose fresh lithium metal surfaces and scattered passivated islands. Because the steps are performed in protective liquid, and the lithium metal layer is maintained covered in protective liquid throughout the entire process, the fresh formed surfaces can remain unpassivated. With each consecutive roll reduction the thickness of the layer decreases and the area of the unpassivated surface region increases (also the passivated islands become smaller in size and area). As noted above, the decrease in lithium thickness is proportional to the increase in the unpassivated surface region. Accordingly, in various embodiments the method of making a thin lithium metal layer having a pristine surface includes: i) determining a final lithium metal layer thickness; determining the thickness of the stock of pre-passivated lithium metal layer necessary to create a pristine surface (i.e., at least 90% of the surface is defined by the unpassivated surface region); roll reduce the stock lithium metal foil under protective liquid. For instance, if the desired lithium metal thickness is 25 um, starting with a 50 um passivated lithium foil will produce a surface that is just 50% passivated and 50% unpassivated, which is insufficient for forming a pristine first major surface. To create a pristine lithium metal layer that is 25 um thick from pre-passivated lithium metal foil requires that the stock foil be at least 250 um thick.

Figure 4G:
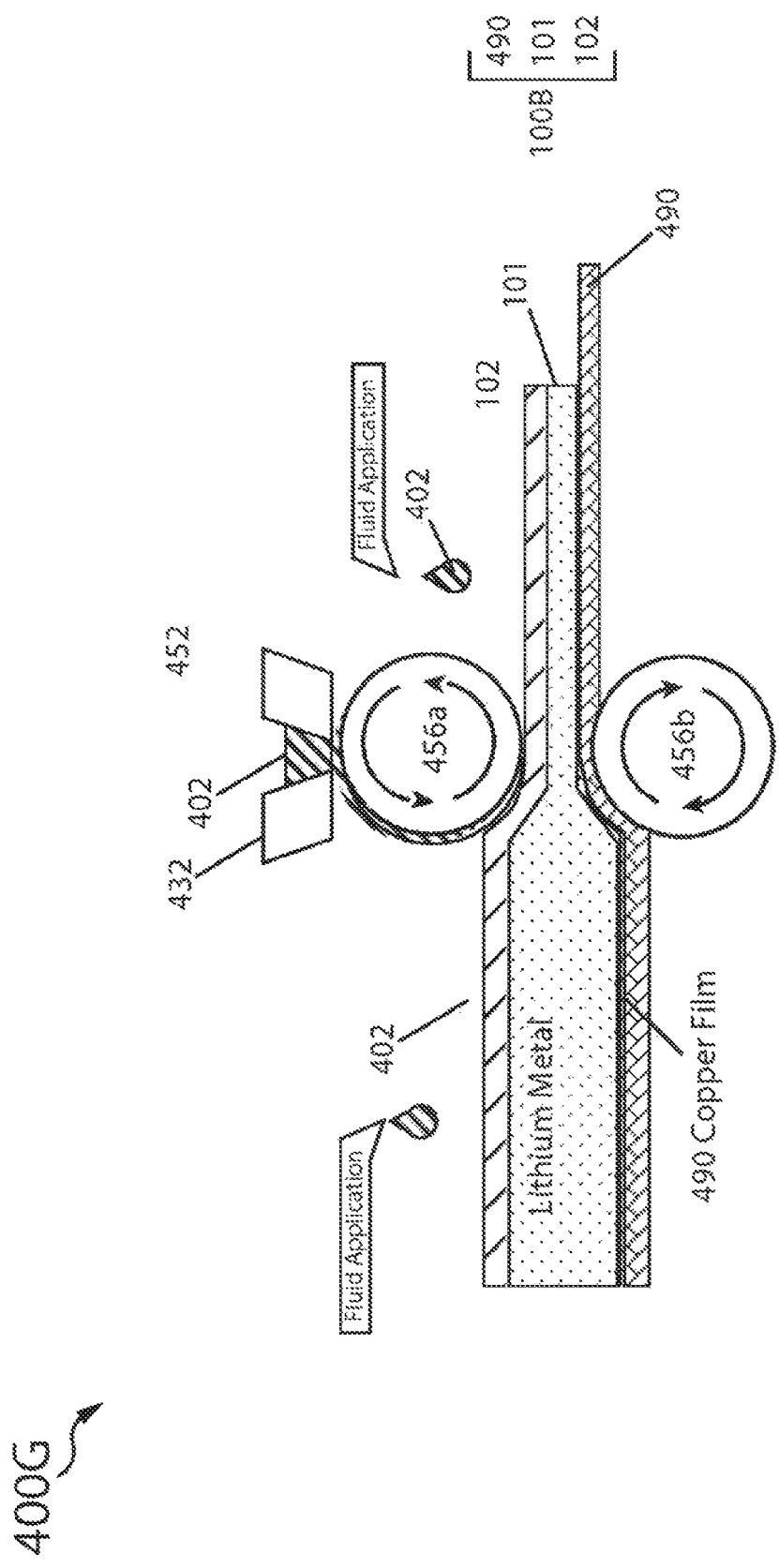
Figures 5A, 5B:
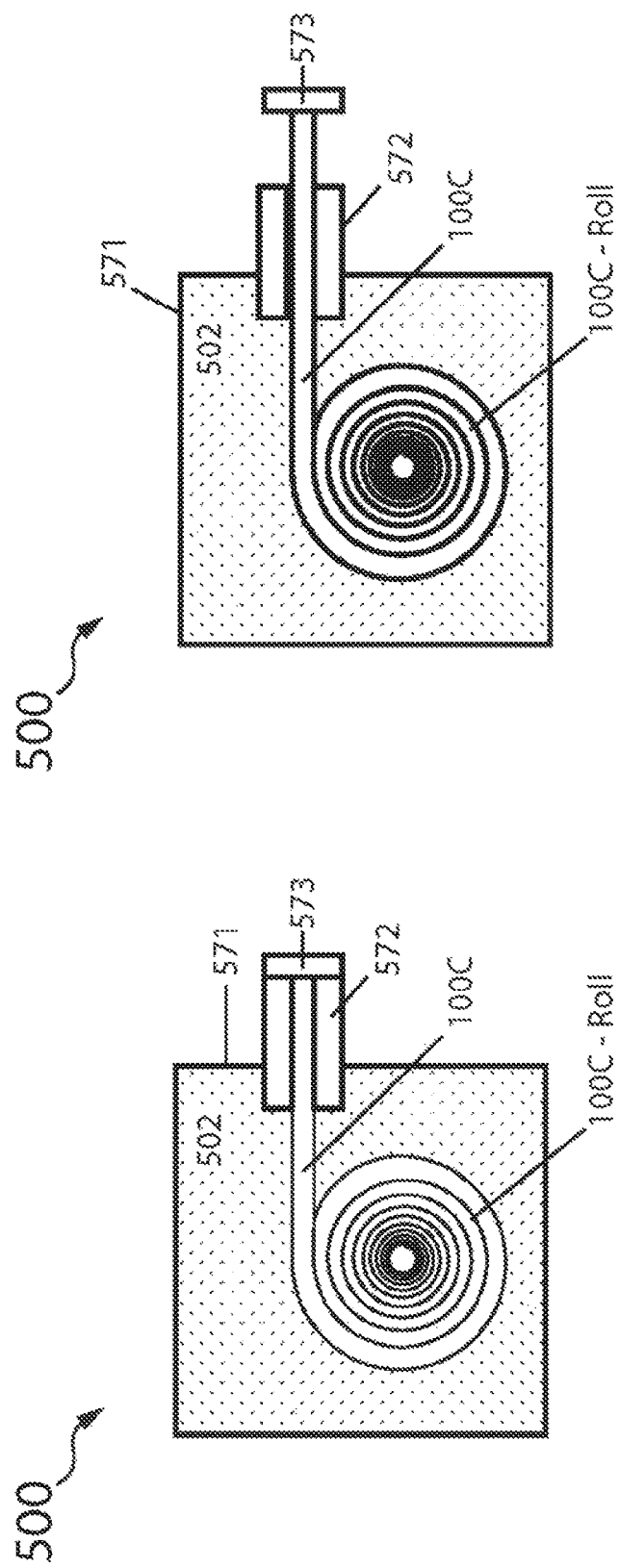
FIGS. 5A-B illustrate a lithium roll assembly cartridge according to one embodiment of the present disclosure.

With reference to FIG. 4G, stock lithium foil 430 may be simultaneously roller extruded and laminated to substrate layer 490 (e.g., a copper current collecting layer) using roller reduction mill 452 equipped with fluid dispensing reservoir 432 and work rolls 456*a/b* as described above. Once processed, laminate structure 100B (as described with reference to FIG. 1B), has an electrode architecture that is composed of lithium metal layer 101 laminated with copper current collector 490F as the backing layer behind second major surface 101*ii*. First major surface of layer 101 is entirely covered, in direct contact, with liquid phase protective fluid 102 (i.e., it is encapsulated). As-formed, laminate 100B may be subsequently wound and disposed into canister 571 (as shown in FIGS. 5A-B) to form laminate roll package assembly for storage and ultimately downstream production of a lithium battery cell. In various embodiments the lithium metal layer may be roller extruded directly onto an inorganic solid electrolyte layer serving as substrate, such as a lithium ion conducting sulfide glass layer, the roll extrusion exposing substantially unpassivated lithium metal directly onto the sulfide glass to effect a reactive bond between the layers.

In accordance with the methods and apparatus' shown in FIGS. 4A-F, the process steps of: i) roller reducing the thickness of stock lithium metal foil; ii) forming freshly extruded lithium metal surfaces; iii) and laminating the second major surface 101b to a copper current collector, may be performed in a conventional dry box or dry chamber having a noble gas atmosphere (e.g., argon or helium), with the interior environment of the dry box at low moisture content, preferably less than 10 ppm water, more preferably less than 5 ppm, even more preferably less than 1 ppm, and yet even more preferably less than 0.1 ppm. However, the embodiment is not limited to the apparatus being disposed in a conventional thy box, and in a manner similar to that shown in FIGS. 4A-D, apparatus' 400E/400F may be configured inside an environmentally controlled chamber, similar to that of chamber 450, with an interior atmosphere primarily composed of protective fluid (e.g., protective vapor).

Figure 4I:
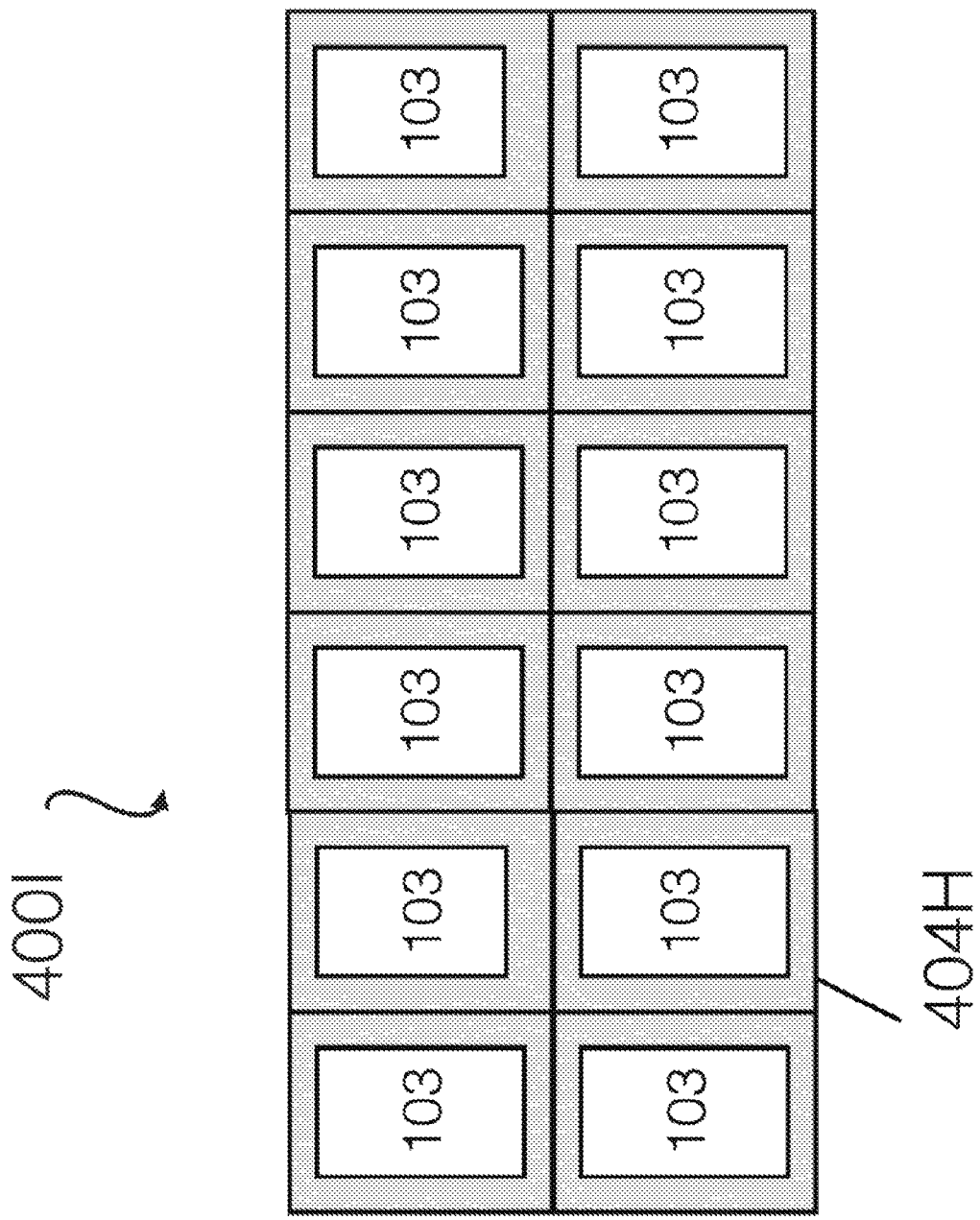

With reference to FIG. 4H there is illustrated, in a cross sectional depiction, another embodiment in accordance with the instant disclosure for a process and apparatus 400H for fabricating pristine lithium metal layer 101 by evaporating (e.g., thermal evaporation) the layer on current collecting substrate 103. Unit 410H is the evaporator, and the vacuum chamber is not shown. In various embodiments, current collecting substrate 103 is a copper foil or a metallized plastic such as PET metallized with a thin layer of copper. Substrate 103 is actively cooled during the thermal evaporation by flowing cool Argon gas onto the second surface of the substrate. Optionally, the first surface of the lithium metal layer is smoothed by ion bombardment, and the apparatus includes an ion gun (not shown), which emits low energy Argon ions onto the evaporated lithium surface (i.e., its first major surface). When actively cooling the substrate with Argon gas, substrate 103 is inserted into ceramic frame 404H. Substrate 103 may be releasably sealed to the frame (e.g., via a glue or epoxy) in order to prevent the Argon gas from reaching the opposing side of the substrate. With reference to FIG. 4I, there is illustrated in top down view cassette 400I composed of plurality of ceramic frames 404H and substrates 103 fitted to each frame for making multiple components.

Figure 4J:
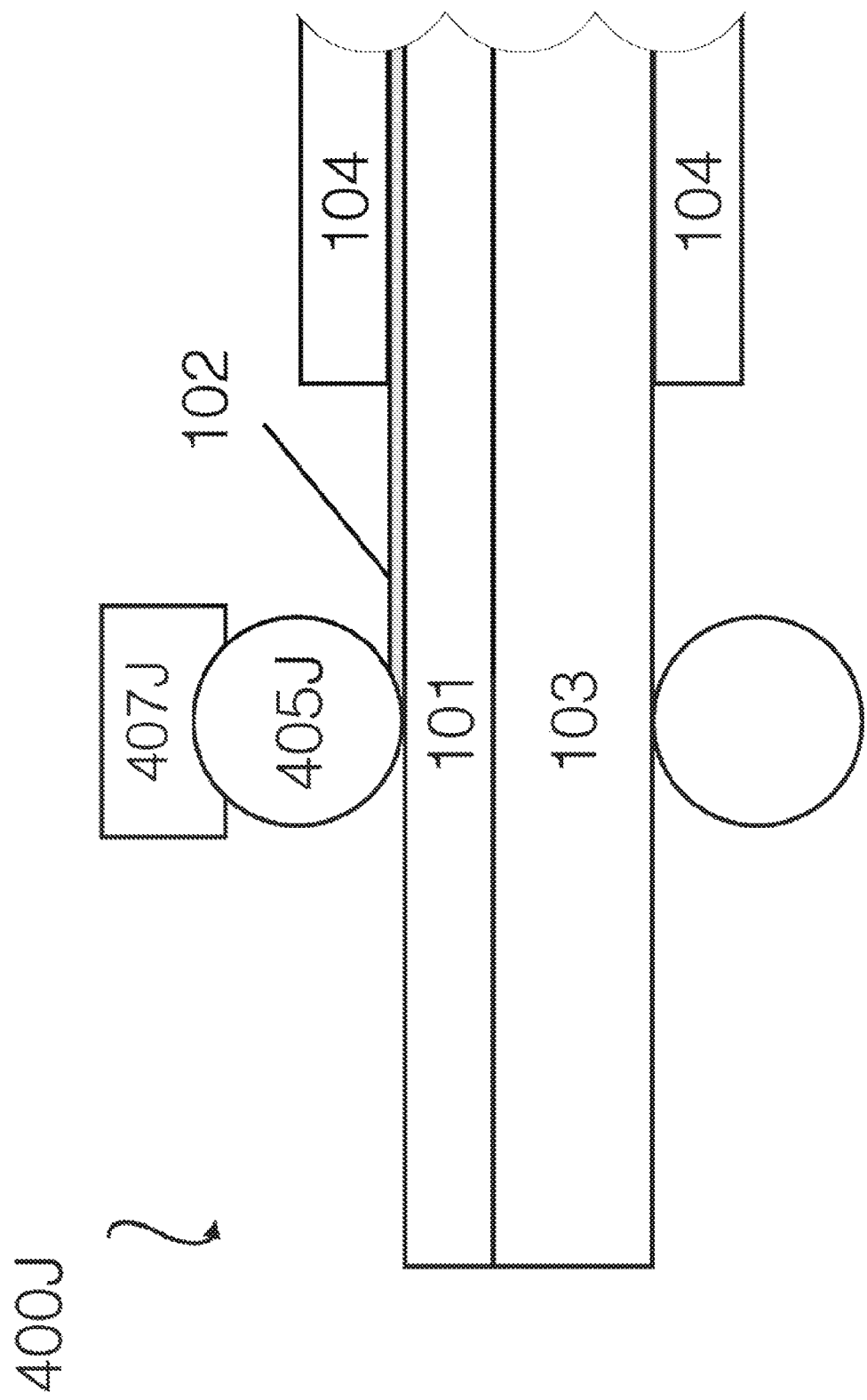

With reference to FIG. 4J, once lithium metal layer 101 has been evaporated, its first major surface is covered by protective liquid layer 102, which may be applied onto the lithium metal surface by a gravure printing process, using gravure roll cylinder 405J having recessed cells that take-up protective fluid and apply it to the surface of the lithium metal layer is it passes through the rollers. Once protective liquid 102 is applied, it flows to cover the entire lithium metal surface. The gravure cylinder is partially immersed in trough 407J filled with protective liquid that provides a reservoir for filling the recessed cells of roll 405J with fluid. The lithium metal layer is sandwiched between the rollers and the surface tension of the protective liquid provides the force to extract the liquid from the cells and onto the lithium metal surface. Thereafter, the lithium metal laminate structure thus formed (i.e., Cu foil substrate 103/thermally evaporated lithium metal layer 101/protective liquid layer 102) may be sandwiched between solid material release layers 104 for further protection.

With reference to FIGS. 5A-B there is illustrated a lithium metal roll assembly cartridge 500 (sometimes referred to herein as a lithium roll assembly package) in accordance with various embodiments of the present disclosure. Cartridge 500 includes Li decal laminate 100C in roll form 100C-Roll, and entirely immersed in protective inert liquid 502, which is itself contained in canister 571. The cartridge also includes sealable port 572 and associated sealing cap 573. FIG. 5A shows cartridge 500 in a hermetically closed state. FIG. 5B illustrates a mechanism for removing Li-decal laminate 100C from the canister, via sealable port 572, with sealing cap 573 configured to assist in dispensing the decal out of the canister. Cartridge 500 is suitable for storing the decal over extended time periods, including hours, days, or even weeks. The interior volume of canister 571 is substantially entirely filled with protective liquid, and may include moisture and oxygen gettering material, such as high surface area lithium metal in the form of numerable metal pieces immersed in the protective liquid.

Preferably cartridge 500 is sufficiently hermetic, and the protective liquid sufficiently dry (e.g., super dry), that lithium metal layer 101 is able to maintain its substantially unpassivated or pristine surface condition for at least 60 minutes, or at least 5 hours, or at least 10 hours, or at least 24 hours, or at least several days, weeks, or months (e.g., more than 3 days, more than 7 days, or more than 30 days).

Standalone Solid Electrolyte Laminate Structures

In accordance with the standalone electrochemical material laminate structure embodiments described with reference to FIGS. 2E-H, in various embodiments battery active material layer 201 is an inorganic alkali metal ion conducting solid electrolyte layer, and the laminate structure in such embodiments is referred to herein as an inorganic solid electrolyte laminate structure (e.g., a lithium ion conducting sulfide glass laminate structure). The room temperature alkali metal ion conductivity of the inorganic solid electrolyte layer is at least $10^{-6}$ S/cm, preferably at least $10^{-5}$ S/cm, and even more preferably at least $10^{-4}$ S/cm (e.g., between $10^{-5}$ S/cm and $10^{-4}$ S/cm or between $10^{-4}$ S/cm and $10^{-3}$ S/cm), with room temperature defined as 18° C.-25° C.

Continuing with reference to FIG. 2E-H in various embodiments inorganic alkali metal ion conductive solid electrolyte layer 201 is an inorganic lithium ion conductive solid electrolyte layer. In particular embodiments the inorganic lithium ion conductive solid electrolyte layer is an inorganic glass. In embodiments it is an oxide glass (in the absence of sulfur). In various embodiments inorganic solid electrolyte layer 201 is a lithium ion conductive sulfide glass. In various embodiments the inorganic solid electrolyte layer is moisture sensitive and chemically reacts in contact with water, and in particular the surface of the solid electrolyte layer degrades in the presence of the ambient atmosphere of a thy room (e.g., having a dew point at or below −20° C.) or in some embodiments that of a dry Argon glove box (e.g., having between 0.1 to 10 ppm of water). In various embodiments, solid electrolyte layer 201 is a moisture sensitive Li ion conductive sulfide glass comprising lithium, sulfur and one or more of boron, silicon, and/or phosphorous. Particular sulfide solid electrolyte glasses that can benefit from incorporation into a solid electrolyte laminate structure of the present disclosure include those described in U.S. Patent Publication No.: 20160190640, which is hereby incorporated by reference for all that it contains; for example: $0.7Li_2S$-$0.29P_2S_5$-$0.01P_2O_5$; $0.7Li_2S$-$0.28P_2S_5$-$0.02P_2O_5$; $0.7Li_2S$-$0.27P_2S_5$-$0.03P_2O_5$; $0.7Li_2S$-$0.26P_2S_5$-$0.04P_2O_5$; $0.7Li_2S$-$0.25P_2S_5$-$0.05P_2O_5$; $0.7Li_2S$-$0.24P_2S_5$-$0.06P_2O_5$; $0.7Li_2S$-$0.23P_2S_5$-$0.07P_2O_5$; $0.7Li_2S$-$0.22P_2S_5$-$0.08P_2O_3$; $0.7Li_2S$-$0.21P_2S_5$-$0.09P_2O_5$; $0.7Li_2S$-$0.2P_2O_5$-$0.1P_2O_5$; $0.7Li_2S$-$0.29B_2S_3$-$0.01B_2O_3$; $0.7Li_2S$-$0.28B_2S_3$-$0.02B_2O_3$; $0.7Li_2S$-$0.27B_2S_3$-$0.03B_2O_3$; $0.7Li_2S$-$0.26B_2O_3$-$0.04B_2O_3$; $0.7Li_2S$-$0.25B_2S_3$-

0.05$B_2O_3$; 0.7$Li_2$S-0.24$B_2S_3$-0.06$B_2O_3$; 0.7$Li_2$S-0.23$B_2S_3$-0.07$B_2O_3$; 0.7$Li_2$S-0.22$B_2O_3$-0.08$B_2O_3$; 0.7$Li_2$S-0.21$B_2S_3$-0.09$B_2O_3$; 0.7$Li_2$S-0.20$B_2S_3$-0.1$B_2O_3$; 0.7$Li_2$S-0.29$B_2S_3$-0.01$P_2O_5$; 0.7$Li_2$S-0.28$B_2S_3$-0.02$P_2O_5$; $_{0.7}L_2$S-0.27$B_2S_3$-0.03$P_2O_5$; 0.7$Li_2$S-0.26$B_2S_3$-0.04$P_2O_5$; 0.7$Li_2S_3$-0.05$P_2O_5$; 0.7$Li_2$S-0.24$B_2S_3$-0.06$P_2O_5$; 0.7$Li_2$S-0.23$B_2S_3$-0.07$P_2O_5$; 0.7$Li_2$S-0.22$B_2S_3$-0.08$P_2O_5$; 0.7$Li_2$S-0.21$B_2S_3$-0.09$P_2O_5$; 0.7$Li_2$S-0.20$B_2S_3$-0.1$P_2O_5$; 0.7$Li_2$S-0.29$B_2S_3$-0.01$SiS_2$; 0.7$Li_2$S-0.28$B_2S_3$-0.02$SiS_2$; 0.7$Li2$S-0.27$B_2S_3$-0.03$SiS_2$; 0.7$Li_2$S-0.26$B_2S_3$-0.04$SiS_2$; 0.7$Li_2$S-0.25$B_2S_3$-0.05$SiS_2$; 0.7$Li2$S-0.24$B_2S_3$-0.06$SiS_2$; 0.7$Li_2$S-0.23$B_2S_3$-0.07$SiS_2$; 0.7$Li_2$S-0.22$B_2S_3$-0.08$SiS_2$; 0.7$Li_2$S-0.21$B_2S_3$-0.09$SiS_2$; 0.7$Li_2$S-0.20$B_2S_3$-0.1$SiS_2$.

In other embodiments inorganic solid electrolyte layer 201 may incorporate a polycrystalline ceramic or a glass-ceramic layer (e.g., a garnet solid electrolyte layer). These include $Li_6BaLa_2Ta_1O_{12}$; $Li_7La_3Zr_2O_{12}$, $Li_5La_3Nb_2O_{12}$, $Li_5La_3M_2O_{12}$ (M=Nb, Ta) $Li_{7+x}La_{3-x}Zr_2O_{12}$ where A may be Zn. These materials and methods for making them are described in U.S. Patent Application Pub. No.: 2007/0148533 (application Ser. No. 10/591,714) and is hereby incorporated by reference in its entirety and suitable garnet like structures, are described in International Patent Application Pub. No.: WO/2009/003695 which is hereby incorporated by reference for all that it contains. Suitable ceramic ion active metal ion conductors are described, for example, in U.S. Pat. No. 4,985,317 to Adachi et al., incorporated by reference herein in its entirety and for all purposes. $LiM_2(PO_4)_3$ where M may be Ti, Zr, Hf, Ge) and related compositions such as Li those into which certain ion substitutions are made including $Li_{1-x}Ti_{2-x}Al_x(PO_4)_3$ and the like which are known in the lithium battery arts.

Generally, the thickness of the inorganic sold electrolyte layer is in a range that is sensible for use in a battery cell, and generally depends, in part, on its ionic conductivity. In various embodiments the thickness of the solid electrolyte layer is in the range of 200-1 um thick, and more typically in the range of 100-5 μm, and even more typically in the range of 50-10 μm thick (e.g., about 10 μm or about 15 μm or about 20 μm or about 25 μm or about 30 μm or about 35 μm or about 40 μm or about 45 μm or about 50 μm thick).

Solid Electrolyte Interphase (Engineered SET)

Figure 6A:
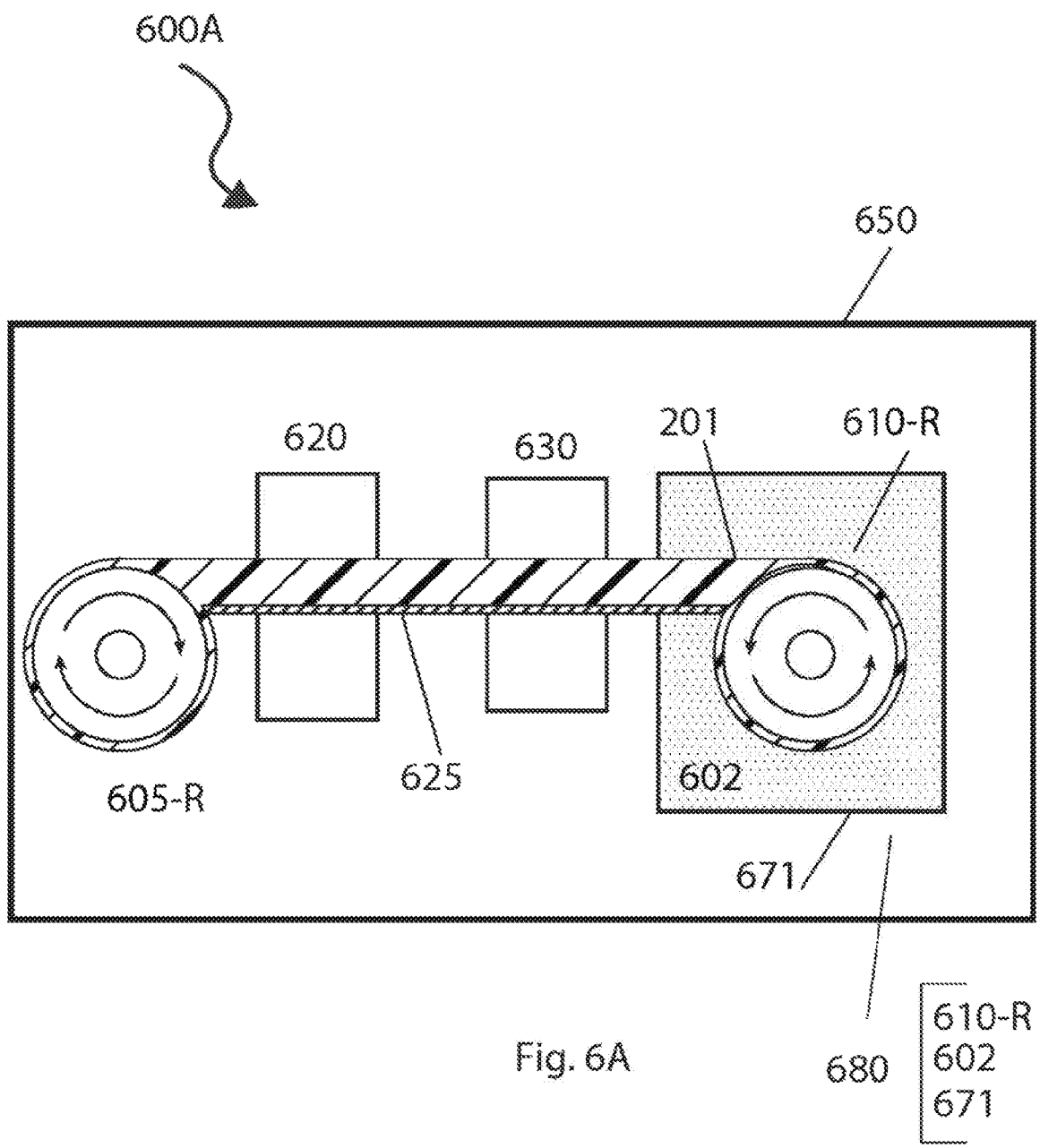
FIG. 6A illustrates an apparatus and method for cleaning and treating an inorganic solid electrolyte layer, in accordance with an embodiment of the present disclosure.

With reference to FIG. 6A, there is illustrated an apparatus 600 and method for cleaning a sulfide solid electrolyte glass layer and treating its surface to engineer a solid electrolyte interphase (SEI). The apparatus includes environmental chamber 650 having a very low moisture and oxygen content (e.g., less than 1 ppm), supply roll 605-R of sulfide glass sheet in roll form, web carrier for translating sheet 201 through cleaning chamber 620 and surface treatment chamber 630. Cleaning chamber 620 is a plasma treatment chamber for ion etching the glass under Argon plasma. The ion-etching/plasma etching step removes products of sulfide glass hydrolysis by etching off a thin layer of glass from the surface, typically in the range of 0.5 to 10 nm. Once surface 201i has been etched clean, it may be brought substantially immediately into cartridge 680 which is canister 681 filled with super dry hydrocarbon protective liquid 602, as described and listed above. Cartridge 680 receives the cleaned glass by rolling to form sulfide glass roll 610-R. Once immersed in the protective liquid, the cleaned surface can be preserved as such. Cartridge 680 is suitable for storing the decal over extended time periods, including hours, days, or even weeks. The interior volume of canister 571 is substantially entirely filled with protective liquid, and may include moisture and oxygen gettering material, such as high surface area lithium metal in the form of numerous metal pieces immersed in the protective liquid.

In various embodiments the sulfide glass surface 201i is not chemically compatible in contact with lithium metal, and so coatings on the glass surface are described herein which are useful for creating a solid electrolyte interphase (SEI), the SEI forming as a result of the coating reacting with the substantially unpassivated lithium metal surface during the step of reactive bonding (e.g., during lamination of the layers, typically using heat and pressure).

In various embodiments, after ion etching, sulfide glass layer 201 is translated via the carrier web into surface treating chamber 630. In various embodiments surface treating chamber 630 is a second plasma unit, and glass 201 is subjected to nitrogen plasma and/or a Nitrogen/Argon plasma mixture, the process cleans the glass and also modifies the glass surface composition by introducing Nitrogen into/onto the surface. Thereafter, the glass is wound into roll 610-R and immersed in protective liquid 602, as described above. In alternative embodiments, as opposed to bringing the cleaned and Nitrogen treated glass into protective fluid (e.g., liquid or vapor phase), it is stored in a dry oxygen free argon filled enclosure.

Continuing with reference to FIG. 6A, in another embodiment, protective liquid 602 contains dissolved reactive species such as Nitrogen and Halogens (e.g., iodine), which treat the glass surface as it (the glass layer) is immersed in protective hydrocarbon liquid. Additional reactive species such as Nitrogen and Halogens may be injected into the canister as well. In yet another embodiment, the glass surface may be cleaned and surface treated in the same chamber. For example, inside chamber 620 the glass surface is cleaned with Argon plasma, and then the argon gas in the chamber is displaced by protective fluid in the vapor phase containing sulfide glass reactive species such as Nitrogen or Halogens (e.g., iodine $I_2$ and iodine compounds).

In various embodiments the sulfide glass first major surface is treated in chamber 630 to form a thin precursor film that reacts with lithium metal to form an engineered solid electrolyte interphase (SEI). Various processes, reagents and treatments for engineering the SEI are described below.

With reference to FIG. 6B, in various embodiments a thin precursor film 640 may coated onto the clean first major surface of sulfide glass 201 to effect a solid electrolyte interphase via reaction with lithium metal during lamination, and preferably via reaction with pristine lithium metal surface.

In one embodiment precursor layer 640 is a halogen or interhalogen (diatomic or multi-atomic). For instance a monolayer, or several monolayers (e.g., up to 5 monolayers) of iodine or bromine molecules on the solid electrolyte glass surface is formed by condensation from the gas or liquid phase (e.g., gaseous or liquid phase iodine).

In one embodiment precursor layer is nitrogen. For example, a monolayer or several monolayers (e.g., up to 5 monolayers) of nitrogen molecules on the surface of the solid electrolyte gas is formed by condensation of nitrogen onto the solid electrolyte surface (from a gas or liquid phase). In a particular embodiment the nitrogen coated onto the surface of the solid electrolyte glass via a liquid carrier, such as liquid hydrocarbons, containing dissolved nitrogen molecules. The liquid hydrocarbons should be dry, as defined above, especially if the solid electrolyte is sensitive to moisture. Preferably the solubility of nitrogen in the hydrocarbon is large. For instance, the liquid carrier (e.g., liquid hydrocarbon) having a room temperature solubility of greater than 1 mole (nitrogen molecule) per mole of the liquid hydrocarbon, and preferably a ratio that is greater than 1.1, and even more preferably greater than 1.2. Particularly suitable liquid hydrocarbons include n-Octane, n-Nonane, n-Decane, n-Undecane, and n-Dodecane.

In other embodiments the solid electrolyte surface may be coated with a precursor of $SO_2$ or sulfur molecules, as described in more detail herein below.

While lithium is primarily referenced as the akali metal layer material herein, it should be understood that other alkali metals or alloys of lithium may also be used.

EXAMPLES

Coatings on Glass Electrolyte Surface to Form SEI Via Reaction With Li 1. halogens or interhalogens (diatomic or multi-atomic).

A monolayer, a few layers or condensed films are formed by iodine or bromine molecules on a glass surface from gas phase or from liquid phase. Halogen coating on the glass surface helps to improve wettability of Li metal towards glass (reactive wetting). In this case, the SEI formed on the clean Li surface consists of LiHal, in particular LiI or LiBr.
   a. Halogen adsorption from the gas phase onto a glass surface at elevated temperatures, room temperature, or low temperatures.

In order to minimize the coating thickness the source of iodine or bromine vapor is not a molecular halogen, but a halogen-containing compound having a lower halogen vapor pressure. The coating thickness can be optimized by using halogen-containing compounds with appropriate vapor pressure and by adjusting duration and temperature of the coating process. Among the compounds that are used as sources of halogen vapor are solid polyhalogens. Solid polyiodides with various cations described in (Per H. Svensson, Lars Kloo, Chemical Reviews, 2003, Vol. 103, No. 5) can be used as iodine sources (these compositions are incorporated by reference herein). Applicable polyhalogens include quaternary ammonium-polyhalogen compounds, in particular, tetraalkylammonium poly-halogens, inorganic polyiodides, such as $RbI_3CsI_3$ and $Cu—(NH_3)_4]I_4$, charge transfer complexes between dioxane, pyridine, polyvinyl, pyrrolidone, polyethyleneoxide and halogens (as acceptors), such as poly(2vinylpyridine)iodine and poly(4-vinylpyridine)bromine complexes. Other examples include metal-halogen compounds, for instance, CuI.
   b. Halogen coating of a glass surface from the liquid phase The glass surface is coated with halogens by its treatment in solutions containing molecular halogens (iodine, bromine) or polyhalogens that are dissolved in dry (less than 1 ppm of moisture), non-polar solvents. In the preferred case, the solvents are selected from a group of unsaturated hydrocarbons or benzene and its homologues. In another case, the solvents are halogenated hydrocarbons, in particular, carbon tetrachloride. In another case, the solvent is carbon disulfide. The glass surface is brought into contact with or the glass is immersed into a solvent containing dissolved coating material (halogens or polyhalogens). Then the solvent is allowed to evaporate. In one case, Li—Mg or Li—Ca alloys (solid solution range) are used instead of Li metal. As a result, the SEI consists of LiI or LiBr doped with corresponding halides of Mg or Ca and has increased Li ion conductivity due to formation of Li cation vacancies (Schottky defects). In one case, both the glass surface and Li are treated in Halogen vapor containing atmosphere. As a result, the halogen coating (preferentially, a very thin coating that consists of one or two molecular layers) is formed on the glass surface and a thin layer of LiHal is formed on the Li surface. After Li lamination onto glass, halogen molecules react with LiHal layer on Li forming an SEI consisting of a LiHal layer with increased thickness.

2. Nitrogen

A monolayer, a few layers or condensed films formed by nitrogen molecules on a glass surface from gas phase or from liquid phase at RT or low temperatures. At RT only one or two layers of nitrogen molecules are adsorbed onto metal surfaces. Nitrogen can be adsorbed onto glass surfaces either in pure Nitrogen atmosphere (the volume having been previously evacuated to high vacuum) or in a mixed nitrogen/inert gas atmosphere ($Ar/N_2$). In order to coat a long strip of glass, either a flow of pure nitrogen or a flow of carrier gas (Ar) mixed with nitrogen can be used.

In various embodiments, the resulting SEI is, or includes, $Li_3N$ with a high Li ion conductivity.

In various embodiments the molecular nitrogen precursor layer is formed by coating the surface of the solid electrolyte glass sheet with a thin layer of a liquid hydrocarbon containing an amount of dissolved nitrogen molecules. In various embodiments the mole ratio of nitrogen molecules dissolved in the hydrocarbon carrier liquid is at least 0.05 moles of Nitrogen molecules per mole of liquid hydrocarbon ($N_2$-moles/liq.hyd-moles), for instance, at least 0.1 $N_2$-moles/liq.hyd-moles, at least 0.2 $N_2$-moles/liq.hyd-moles, at least 0.3 $N_2$-moles/liq.hyd-moles, at least 0.4 $N_2$-moles/liq.hyd-moles, at least 0.5 $N_2$-moles/liq.hyd-moles, at least 1.0 $N_2$-moles/liq.hyd-moles. Particular suitable liquid hydrocarbon carriers are n-Octane, n-Nonane, n-Decane, n-Undecane, and n-Dodecane.

When using a liquid carrier containing dissolved nitrogen molecules, the SEI formed when the nitrogen coated solid electrolyte layer is directly contacted with lithium metal is a lithium nitride compound (e.g., $Li_3N$), preferably fully reduced and highly conductive to lithium ions. As described above, the formation of the SEI may be effected during the lamination step, and the liquid hydrocarbons on the surface of the solid electrolyte layer and/or the lithium metal layer removed prior to and/or as a result of bond laminating the layers together.

3. $SO_2$
   a. SO2 adsorption from the gas phase onto a glass surface at elevated temperatures, RT or low temperatures. SO2 can be adsorbed onto glass surfaces either in pure SO2 atmosphere (the volume having been previously evacuated to high vacuum) or in a mixed SO2/inert gas atmosphere (Ar/SO2).
   b. SO2 coating of a glass surface at low temperature using liquid SO2. In various embodiments, the resulting SEI is, or includes, Li2S2O4, which is a known Li ion conductor.

4. Sulfur
   a. Sublimation onto glass surface. S8 ring sulfur is known to be the dominant sublimation phase.
   b. Glass surface oxidation leading to formation of an elemental S layer. In various embodiments, the resulting SEI is, or includes, Li2S.

Solid-State Laminate Electrode Assembly

With reference to FIG. 7 there is illustrated standalone fully solid-state laminate electrode assembly 700 in accordance with various embodiments of the present disclosure. Laminate electrode assembly 700 is a laminate of alkali metal layer 101 having first major surface 101*i* and ii) inorganic alkali metal ion conducting solid electrolyte layer 201 having first major surface 201i. In various embodiments the alkali metal layer is a lithium metal layer and the inorganic solid electrolyte layer is an inorganic lithium ion conducting sulfide glass sheet, also as described above. In various embodiments, laminate 700 is formed by reactively bonding layer 101 (lithium metal) with layer 201 (sulfide glass) to form inorganic interface 705 (also referred to herein as the solid electrolyte interphase (SEI)) as ⅘ described in more detail herein below. The thickness of laminate 700 generally ranges from about 100 um down to as thin as about 5 um, and typically has a thickness in the range of 10 to 50 um. Preferably, the lithium ion resistance across the interface is less than 50 Ω-cm$^2$, and more preferably less than 25 Ω-cm$^2$.

The quality of inorganic interface 705 can be an important aspect for determining how well the laminate electrode assembly will operate in a battery cell. Preferably, inorganic interface 705 is substantially uncontaminated by organic material, including organic residues of any inert liquid that may have been used in making, storing and processing of the laminate structures. In various embodiments the inorganic interface may be further characterized as "sufficiently uncontaminated by passivated alkali metal," by which it is meant that at least 70% of the geometric area of the solid-state interface is uncontaminated by the presence of passivated alkali metal, such as patches of passivated alkali metal film (i.e., filmy patches), as well as pieces of passivated alkali metal that break off during battery cell cycling and/or handling, and could become trapped at the interface in the form of solid flakes, flecks or material bits of passivated alkali metal. Preferably, at least 80% of the geometric area of the solid-state interface is uncontaminated as such, and more preferably at least 90%, and even more preferably at least 95%, and yet even more preferable the entire geometric area of the solid-state interface is uncontaminated by the presence of passivated alkali metal flakes, flecks, filmy patches or material bits. To achieve an inorganic interface that is sufficiently uncontaminated by passivated alkali metal, surface 101i of lithium metal layer 101 should be substantially unpassivated prior to bonding, and preferably the lithium metal layer surface is pristine. Additionally, the surface of the sulfide glass should be cleaned (e.g., by ion etching) immediately prior to bonding in order to remove solid products of sulfide glass hydrolysis.

When the reactive bond between the layers is continuous and complete, the laminate should exhibit exceptional adherence. In various embodiments the reactively bonded solid-state interface imparts exceptionally high peel strength to the standalone solid-state laminate electrode assembly (i.e., room temperature peel strength). For instance, the room temperature peel strength of the solid-state laminate electrode assembly is significantly greater than the tensile strength of the lithium metal layer to which it is bonded, such that during room temperature peel strength testing the lithium metal layer starts to deform, or tears, prior to peeling.

Methods of Making a Solid-State Laminate Electrode Assembly

Figure 8A:
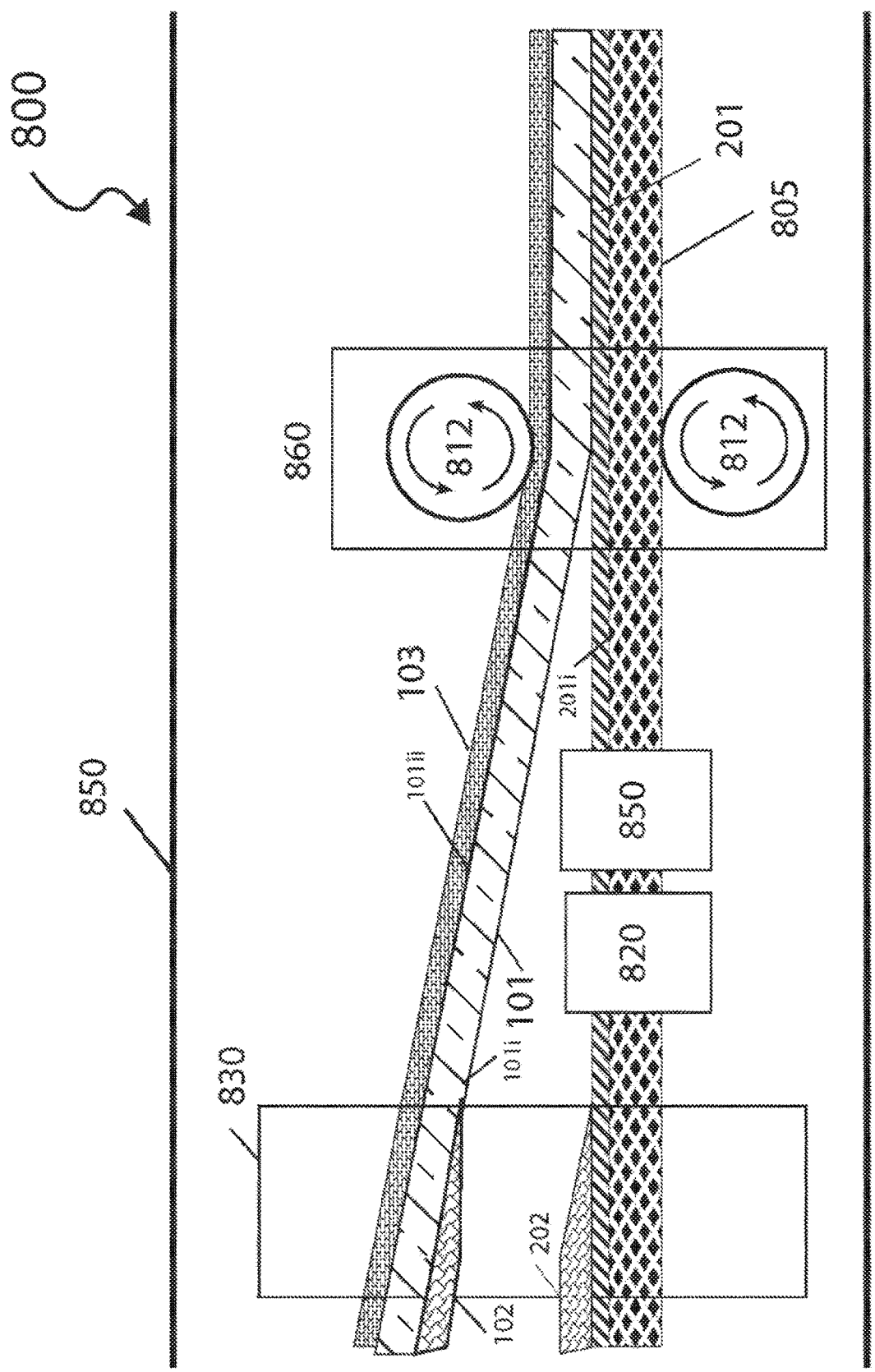
FIG. 8A illustrates an apparatus and method for making a solid-state laminate electrode assembly in accordance with one embodiment of the present disclosure.

With reference to FIG. 8A there is illustrated a process and apparatus 800 for making a fully solid-state laminate electrode assembly 700 in accordance with various embodiments of the present disclosure. The process takes place in an environmentally controlled chamber 850, and involves: i) providing a lithium metal laminate structure for processing into chamber 850, the laminate structure (as described above with reference to FIGS. 1A-D), the laminate structure composed of lithium metal layer 101 removably covered by protective inert liquid layer 102, which encapsulates first major surface 101i, and second major surface 101ii is held adjacent to current collector layer 103; providing for processing into chamber 850 an inorganic solid electrolyte laminate structure (as described above in various embodiments with reference to FIGS. 2A-D, the laminate composed of sulfide glass layer 201 having first major surface 201i encapsulated by protective liquid layer 202. As shown in FIG. 8A, sulfide glass layer is supported on its second major surface 102ii by web carrier 805, which is not a component of the sulfide glass laminate structure. When the laminate structures include a solid release layer, it is removed on a take-up roll not shown. Both layers 101 and 201 enter chamber 830 for removing the inert liquid layer 102 and 202 respectively. Removal of the inert liquid layer can involve a series of steps which may be performed sequentially and/or in parallel. In various embodiments one or more of the following steps is taken to remove the inert liquid layer, including: applying heat to the layers (convectively and/or conductively), applying a vacuum suction over the respective layers, applying a jet of dry gas (Ar or He preferably) and/or a jet of a high vapor pressure hydrocarbon, replacing a low vapor pressure fluid with another higher pressure fluid, or some combination thereof.

Once the liquid layer has been removed from sulfide glass surface 201i, the surface may be cleaned in ion etching chamber 820 using Argon plasma (as described above with reference to chamber 620 in FIG. 6). The cleaned sulfide glass may then be transferred into surface treating station 850 where it may undergo a second plasma treatment with Nitrogen or a mixture of Nitrogen and Argon, or it may be coated in chamber 850 to form a thin precursor film that is reactive with substantially unpassivated lithium metal to form a conductive solid electrolyte interphase. For instance, in various embodiments it may be coated with a thin layer of iodine or an iodine compound (e.g., condensing the iodine on the glass surface). Once the glass has been cleaned and/or its surface composition modified or coated with a thin precursor film, layers 101 and 201 are brought into laminating station 860 where they are reactive bonded to each other, generally by an application of both heat and pressure (via rollers 812) to form a fully solid-state laminate electrode assembly of the present disclosure.

Figure 8B:
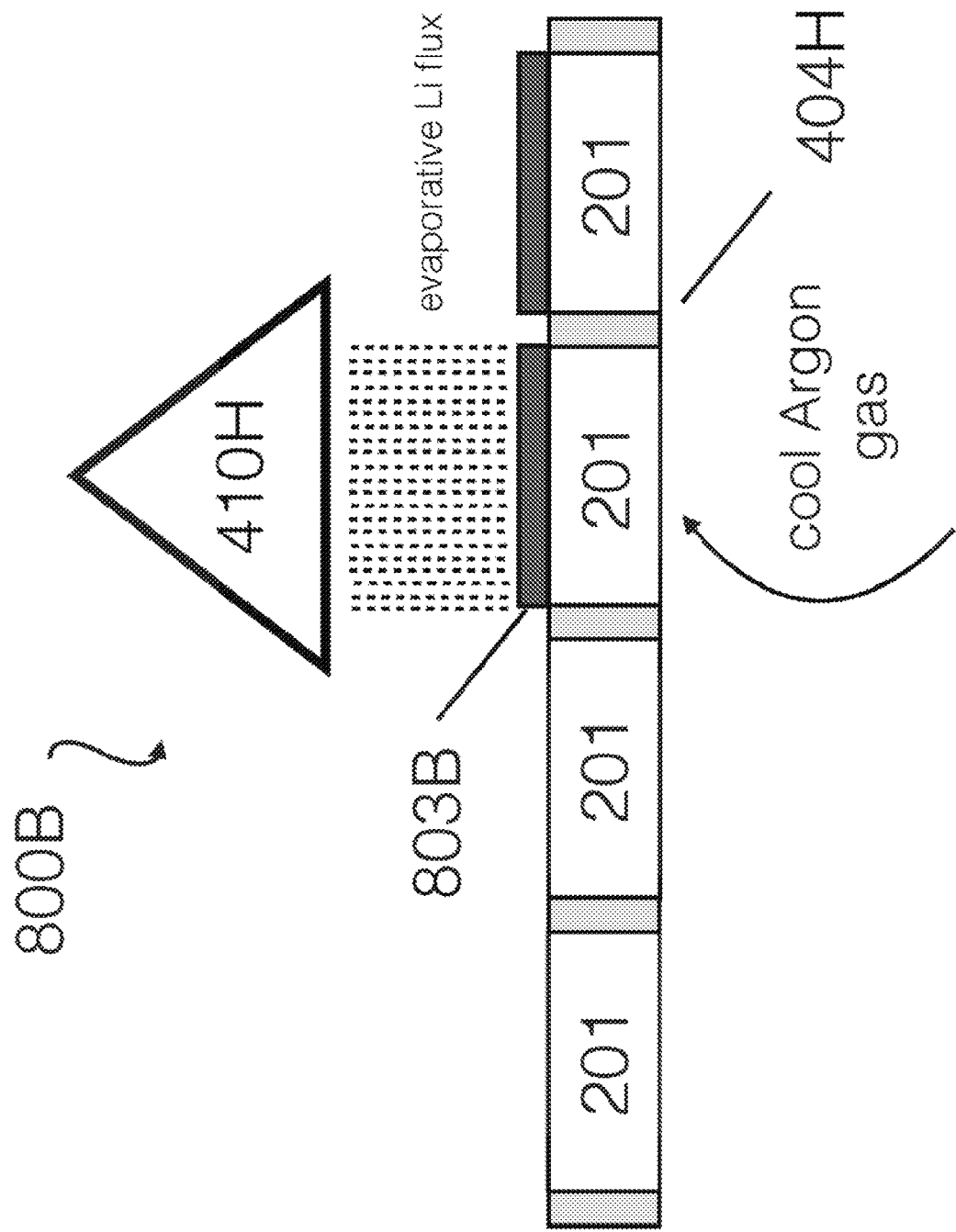
FIG. 8B-C illustrates apparatus, method and tool for making a solid-state laminate electrode assembly in accordance with one embodiment of the present disclosure.

With reference to FIG. 8B there is illustrated another process and apparatus 800B for making a fully solid-state laminate electrode assembly 801B wherein lithium ion conducting sulfide glass solid electrolyte sheet 201 is coated on its first major surface with lithium metal layer 803B by thermal evaporation. Unit 410H is the thermal evaporator, and the vacuum chamber is not shown. Glass sheet 201 is preferably freestandable and typically of thickness in the range of 10 um to 100 um, and more typically in the range of 20 to 50 um thick. Sulfide glass sheet 201 is positioned in ceramic frame 404H, and sealed to the frame via a releasable glue or epoxy, and sheet 201 is actively cooled during the thermal evaporation by flowing cool Argon gas onto the second major surface of the sheet (e.g., the cool Argon gas derived from a cryogenic tank of liquid argon). The cooling of glass substrate sheet 201 is sufficient to prevent the glass from fully or partially devitrifying and to prevent the heat of the evaporative process from damaging the surface of the glass. For instance, in various embodiments the temperature of the sulfide glass sheet is kept to 100° C. or less during the evaporation process, by application of the cooling gas. By actively cooled it is meant that the sulfide glass sheet is cooled while the evaporation of lithium metal is taking place. For instance, the inert gas (e.g., cool Argon gas) contacts the sulfide glass second major surface and it (the gas) is applied to the surface at a temperature that is no greater than 10° C., or no greater than 0° C., or no greater than −10° C., or no greater than −20° C. When actively cooling the sulfide glass sheet during evaporation, the sheet is preferably releasably sealed to the ceramic frame in order to prevent the cool Argon gas from releasing into the vacuum chamber of the evaporator or from diffusing into the evaporating lithium flux (e.g., the edges of the glass sheet glued to the frame, such as with an epoxy). In various embodiments several frames are incorporated into a cassette of frames, to allow for multiple evaporations in a single run. In other embodiments the sulfide glass sheet may be passively cooled, which is to mean cooled to a temperature below 15° C. prior to evaporating the lithium metal onto the glass first major surface. Typically when passively cooled the sulfide glass sheet is at a temperature that is less than 10° C. prior to evaporation, or less than 0° C., or less than −10° C., or less than −20° C. In some embodiments the substrate is both actively cooled and passively cooled as described above. In other embodiments the substrate is exclusively passively cooled (i.e., passively cooled and not actively cooled), or vice versa exclusively actively cooled.

In various embodiments, prior to evaporating the lithium metal layer onto the sulfide glass sheet, the first surface of sheet 201 is ion etched (e.g., as described herein with an Ar plasma). Preferably the ion-etching step takes place in the same chamber as the thermal evaporation, or the ion-etching and thermal evaporation tools/units are combined/arranged as a cluster tool, which allows for automatic transfer of the substrate between process chambers. Once the lithium metal layer is applied onto the surface of the glass, a copper current collector may be applied onto the exposed lithium metal surface (e.g., evaporated or sputter deposited).

Figure 8C:
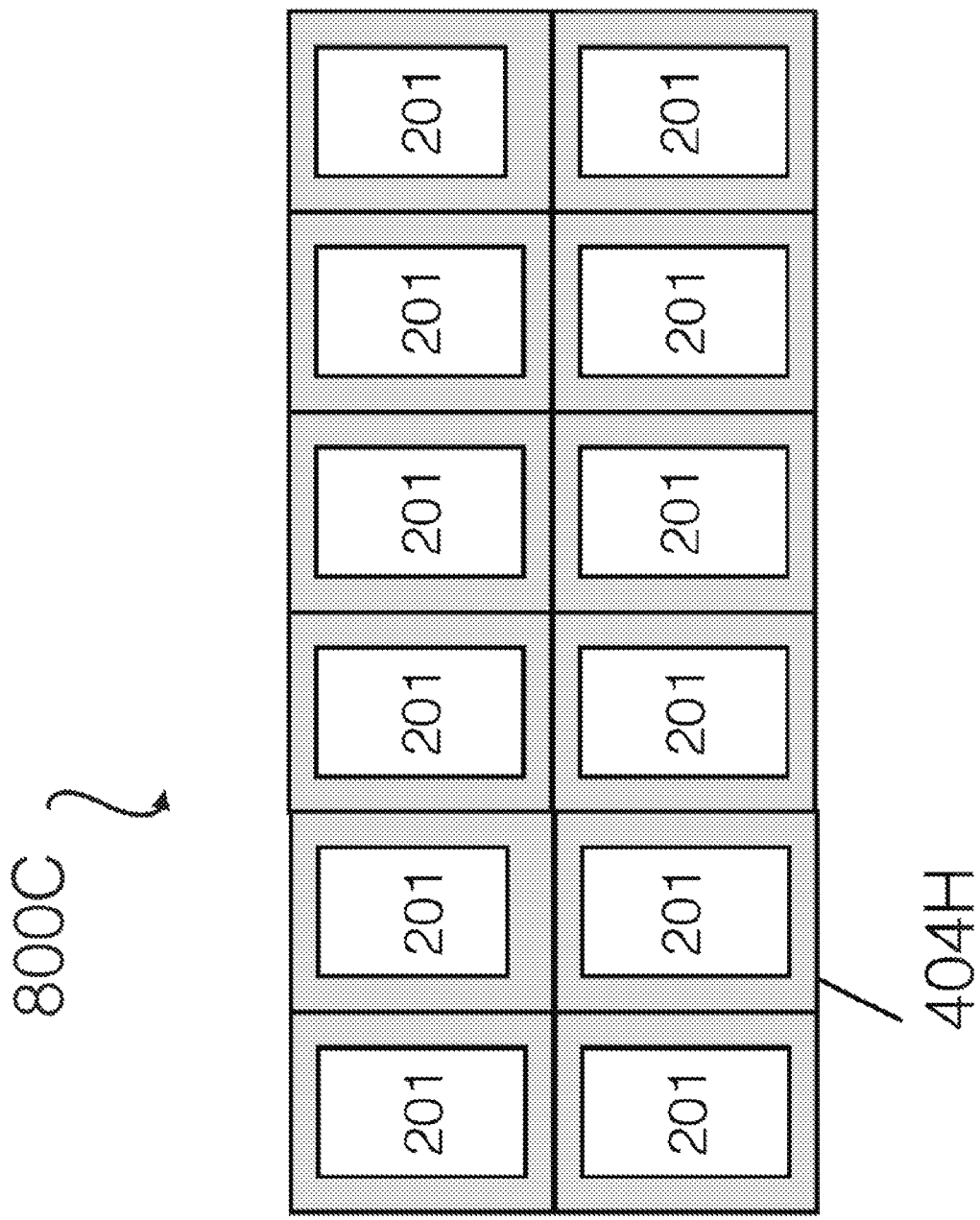

With reference to FIG. 8C, there is illustrated cassette 800C composed of plurality of ceramic frames 404H and freestanding sulfide glass solid electrolyte sheets 201 fitted to each frame for making multiple components.

With reference to FIG. 8D there is illustrated solid-state laminate electrode assembly Z800D composed of nanofilm-encapsulated sulfide glass solid electrolyte structure Z801, as described herein in accordance with various embodiments of the present disclosure, and lithium metal layer Z811 in direct contact with the first major surface of the encapsulating nanofilm. For example, lithium metal layer Z811 evaporated onto the first major surface of the nanofilm.

In various embodiments nanofilm encapsulated sulfide glass solid electrolyte structure Z801 has an asymmetric architecture such as those embodied in FIGS. 2L, 2M, 2N and 2O. In particular embodiments the first major surface of the nanofilm is defined by a material composition that is devoid of lithium, and reactively transforms in contact with evaporated lithium metal to form a lithiated composition, which, in turn, leads to a low resistance interface between the evaporated lithium metal layer Z811 and the nanofilm. In a specific embodiment the first nanolayer is silicon nitride (e.g., SiN) and it reactively lithiates to form a lithated compound (e.g., $Li_2SiN_2$). In another specific embodiment the first nanolayer is a phosphorous nitride devoid of lithium and oxygen (e.g., $P_3N_5$) and it reactively lithiates in contact with evaporated lithium to form a lithiated compound (e.g., $LiPN_2$, $Li_7PN_4$, or a combination thereof). Moreover, for the above embodiments, the second nanolayer is generally unchanged as a result of the lithiation reaction (e.g., the second nanolayer may be an inert oxide such as alumina or zirconia), and after lithium metal is evaporated onto the first major surface of the nanofilm, the composition of the second nanolayer does not change (i.e., the evaporation of lithium metal does not lithiate the second nanolayer).

In various embodiments the nanofilm has a silicon nitride or a phosphorous nitride nanolayer, and when lithium metal is thermally evaporated onto it, the nanolayer is reactively lithiated. For instance, when the nanolayer is silicon nitride (e.g., SiN) or a phosphorous nitride devoid of oxygen the reaction product formed as a result of lithium metal evaporation is lithiated silicon nitride (e.g., $Li_2SiN_2$) and lithiated phosphorous nitride (e.g., $LiPN_2$, $Li_7PN_4$, or a combination thereof), respectively.

In various embodiments lithium metal layer Z811 is deposited by thermal evaporation (as described throughout this specification), and layer Z811 typically not greater than 10 um and more typically not greater than 5 um thick. In various embodiments, ALD of the nanofilm is immediately followed by lithium evaporation using a combination or cluster tool that includes both an ALD tool and a lithium metal evaporation tool, and optionally an ion etch tool for cleaning the sulfide sheet prior to depositing the nanofilm. The combination of these processes and tools in a cluster provides significant fabrication advantages. Such a combination/cluster tool is illustrated in FIG. 8E. In particular embodiments tool 800E is engineered to interface with glove/dry box 896E (e.g., the sulfide solid electrolyte sheet may be fabricated and/or stored in box 896E). In addition to lithium thermal evaporation unit/tool 891E, the combination tool also includes ALD tool 892E, and plasma ion-etch tool 893E. As illustrated, the cluster tool is arranged to interface with glove box 896E for receiving the sulfide glass sheet. In various embodiments cluster tool 800E may further include a sputter deposition tool, for depositing lithium metal directly onto the sulfide sheet or the nanofilm, and/or for sputter depositing a metal current collector onto the exposed surface of the as-evaporated lithium metal layer. In other embodiments lithium metal layer Z811 may be a lithium foil laminated onto the nanofilm.

Once the nanofilm is formed, lithium metal may be evaporated directly onto the nanofilm first major surface using a single tool for both ALD deposition and lithium metal evaporation, and thus mitigating exposure to ambient air. Or the solid electrolyte structure may be removed from the ALD chamber for storage and then transferred to a lithium evaporation station. In various embodiments, prior to lithium evaporation, the first major surface of the nanofilm is cleaned by Argon plasma etching. In some embodiments, the Argon etching step may be utilized to remove a substantial thickness portion of the nanofilm, and in certain embodiments thereof it removes the nanofilm entirely in that portion which is adjacent the first major surface of the sulfide glass (i.e., the Argon etching step removes the nanofilm first major portion, thus exposing the sulfide glass for evaporation of lithium metal directly onto the sulfide glass first major surface.

Figure 8F:
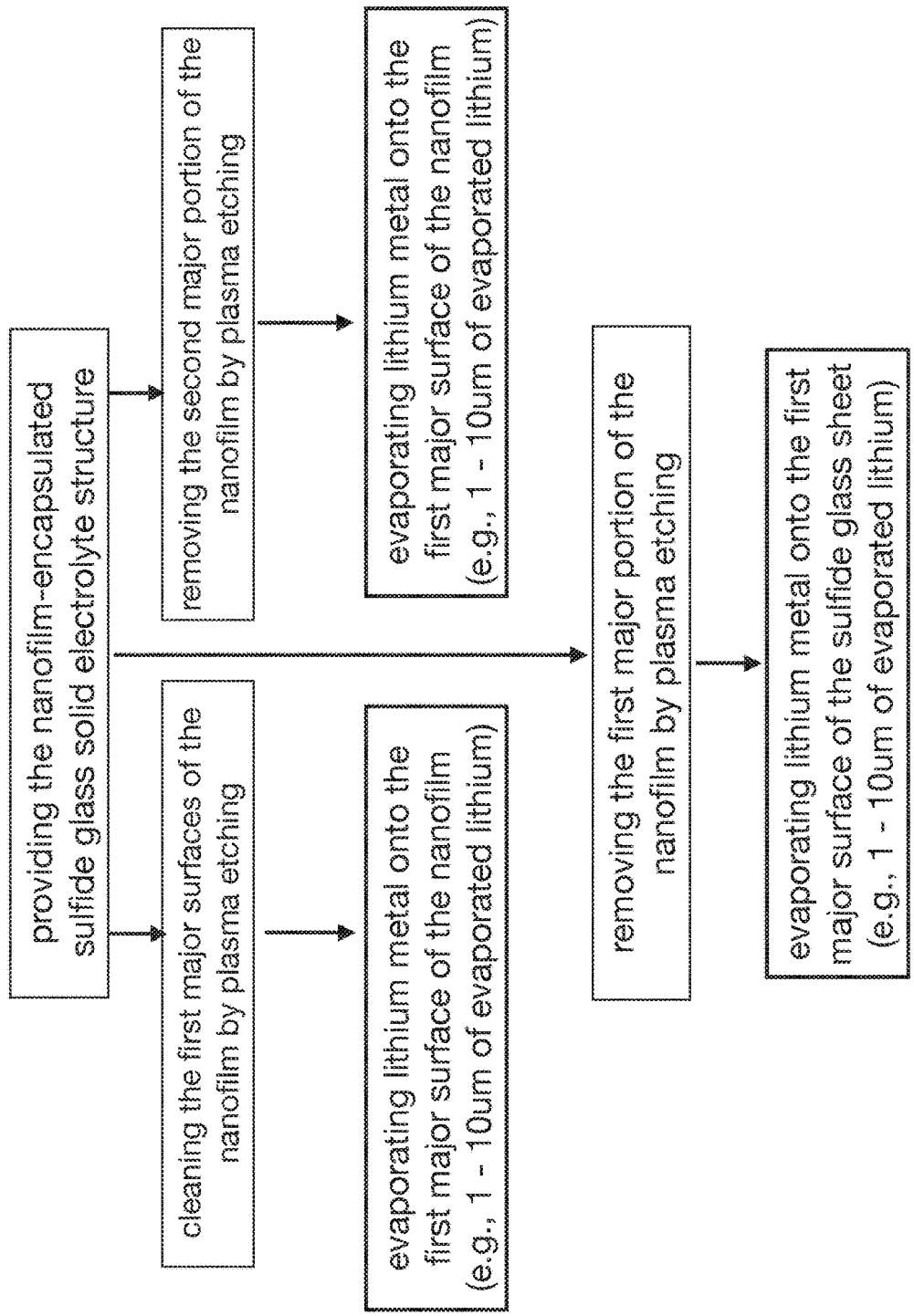
FIG. 8F is a process flow diagram illustrating methods for making solid-state laminate electrode assemblies in accordance with embodiments of the present disclosure.

With reference to FIG. 8F there is illustrated a process flow diagram illustrating methods for making solid-state laminate electrode assemblies made by evaporating lithium metal onto a nanofilm-encapsulated sulfide glass solid electrolyte structure. The initial step is providing a nanofilm-encapsulated sulfide glass solid electrolyte structure in accordance with various embodiments of the present disclosure. In a first process (Process D), the major opposing surfaces of the nanofilm are cleaned by etching the nanofilm surfaces in an Argon plasma, and immediately thereafter lithium metal is evaporated onto the first major surface of the nanofilm, and typically the lithium thickness is in the range of 1 um to 10 um (e.g., about 1 um or about 2 m, or about 5 um or about 10 um). In a second process (Process E) the first major portion of the nanofilm is completely removed by etching (e.g., in Argon plasma), and thereafter evaporating the lithium metal layer as described above. In a third process (Process F), the second major surface of the nanofilm is removed by the Argon plasma etch, and followed by the lithium metal evaporation step. In a fourth process not shown, the Argon plasma etch is configured to remove both the first and the second major portion of the nanofilm. In some embodiments, rather than completely removing the second major portion and/or the first major portion of the nanofilm, those portions are only partially removed to enhance the mobility of Li ions. By incorporating steps to remove the nanofilm portion, entirely or partially, the nanofilm can be configured with a film thickness that is greater than that which would allow facile mobility of Li ions. For instance, in some embodiments, the thickness of the first and/or second major portion of the nanofilm is greater than 10 nm or greater than 20 nm, and therewith provides excellent moisture barrier properties, and during formation of the solid-state laminate the nanofilm thickness is reduced or removed by Argon plasma etching immediately prior to evaporating lithium metal and/or incorporating the solid electrolyte structure into a battery cell. In some embodiments, after removing the nanofilm first major portion, a layer of lithium nitride (e.g., $Li_3N$) or lithium phosphide ($Li_3P$), preferably dense, may be deposited (e.g., via ALD) onto the glass sheet first major surface to provide low resistance interface between the sulfide glass sheet and the lithium metal layer.

Figure 9:
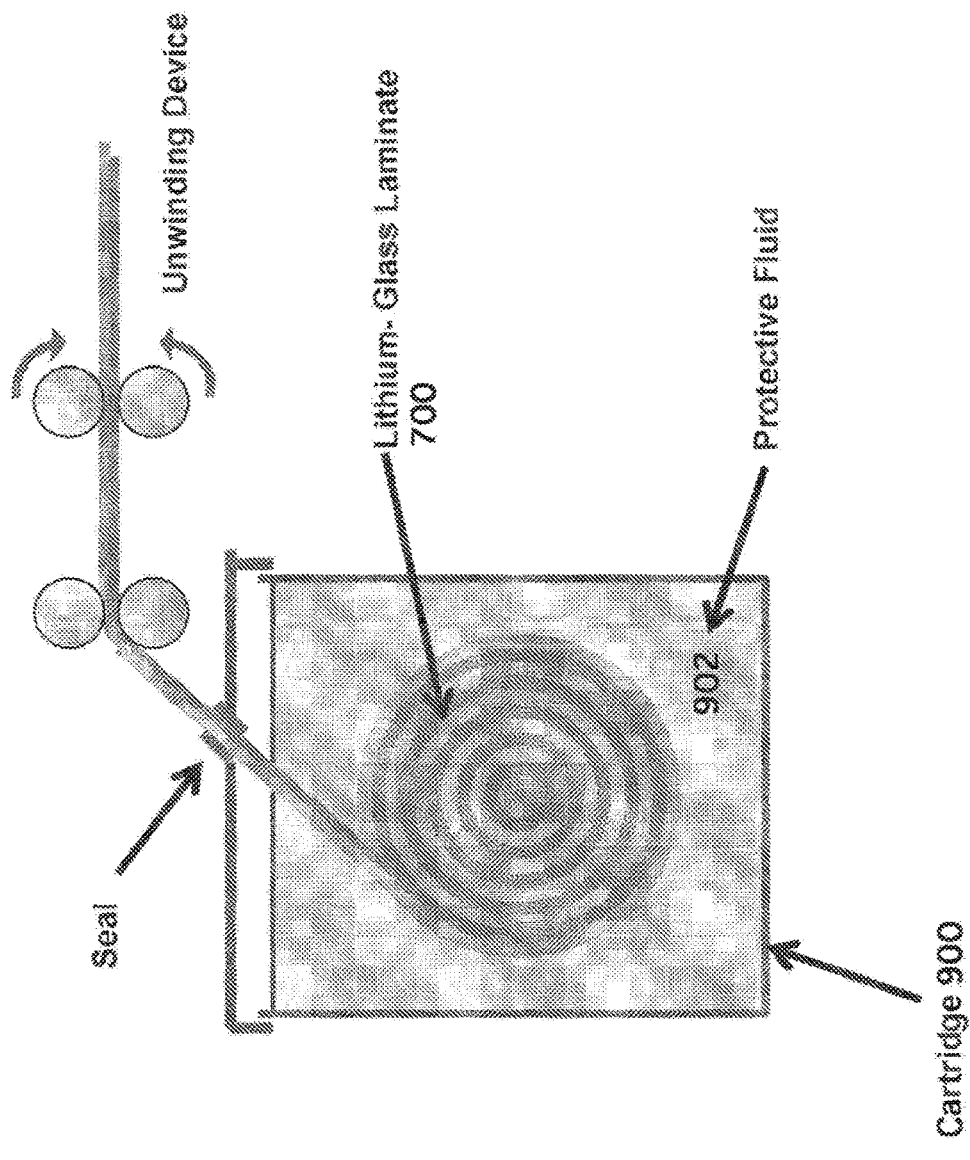
FIG. 9 illustrates a roll assembly cartridge containing a solid-state laminate electrode assembly according to one embodiment of the present disclosure.

With reference to FIG. 9, laminate electrode assembly 700, which may be formed as described above, includes second major surface 201ii of the sulfide glass, and which may be highly sensitive to moisture. Accordingly, in various embodiments, after laminate electrode assembly 700 has been formed it may be stored in cartridge 900, as shown in FIG. 9. Cartridge 900 containing a bath of super dry hydrocarbon protective liquid 902 and laminate assembly 700 immersed in the bath, and by this expedient preserving the sulfide glass second major surface. Cartridge 900 is suitable for storing laminate electrode assembly 700 over extended time periods, including hours, days, or even weeks. More generally, the laminate electrode assemblies described herein, and in particular with reference to FIGS. 8B-D may also be stored in cartridge 900, as described above with reference to FIG. 9.

Battery Cells

With reference to FIG. 10 there is illustrated battery cell 1000 composed of fully solid-state laminate electrode assembly 700 combined with positive electrode 1030, such as a lithium ion intercalating material electrode (e.g., intercalating transition metal oxides), and battery electrolyte 1010, disposed between the second major surface of sulfide glass layer 201 and positive electrode 1010. In various embodiments it is contemplated that the battery cell is fully solid-state. In some fully solid-state battery embodiments, it is contemplated that the positive electrode is disposed in direct contact with the sulfide glass second major surface, in the absence of battery electrolyte layer 1010. In other embodiments, battery cell 1000 may be a liquid or gel electrolyte battery wherein electrolyte layer 1010 is a liquid electrolyte impregnated porous polymer membrane and/or a gel electrolyte layer. The method of making the battery cell may include providing the solid state laminate electrode assembly and disposing it in a battery cell housing adjacent to a liquid electrolyte impregnated in a Celgard-like porous polymer layer, and placing the positive electrode adjacent to it.

With reference to FIG. 11 there is illustrated battery cell 1100 composed of positive electrode 1105 and solid-state lithium laminate electrode assembly 800D as described above in accordance with various embodiments of the present disclosure.

In various embodiments positive electrode 1105 is a lithium ion-intercalating electrode. Particularly suitable lithium ion intercalation compounds include, for example, intercalating transition metal oxides such as lithium cobalt oxides, lithium manganese oxides, lithium nickel oxides, lithium nickel manganese cobalt oxides, lithium nickel cobalt aluminum oxides (e.g., $LiCoO_2$, $LiMn_2O_4$, $LiNiO$, $LiNi_{0.33}Mn_{0.33}Co_{0.33}O_2$, $LiNi_{0.8}Co_{0.15}Al_{0.05}O_2$ and the like) or intercalating transition metal phosphates and sulfates (e.g., $LiFePO_4$, $Li_3V_2(PO_4)_3$, $LiCoPO_4$, $LiMnPO_4$, and $LiFeSO_4$) or others (e.g., $LiFeSO_4F$ and $LiVPO_4F$), as well as high voltage intercalating materials capable of achieving operating cell voltages versus lithium metal in excess of 4.5 Volts, including $LiNiPO_4$, $LiCoPO_4$, $LiMn_{1.5}Ni_{0.5}O_4$, and $Li_3V_2(PO_4)_3$. In some embodiments the intercalating material (e.g., an oxide), is unlithiated prior to incorporation in a battery cell, such as vanadium oxides and manganese oxides, including $V_2O_5$ and $V_6O_{13}$.

In some embodiments, battery cell 1100 further comprises a non-aqueous electrolyte layer (not shown), which may be a liquid electrolyte layer impregnated in a microporous polymer separator or a gel electrolyte layer or a solid polymer electrolyte layer disposed between laminate electrode assembly 800D and positive electrode 1105. In other embodiments, positive electrode 1105 directly contacts laminate electrode assembly 800D, and, in particular, directly contacts the inorganic encapsulating nanofilm, which, in such embodiments, is configured with a material composition having oxidative stability in direct contact with the cathode electroactive material (e.g., the nanofilm surface in contact with the cathode is composed of one or more of aluminum oxide, zirconium oxide or niobium oxide). Accordingly, in various embodiments the nanofilm is chemically compatible in direct contact with cathode electroactive material having an electrochemical potential versus lithium metal that is at least 3 Volts, or at least 3.5V, and the presence of the nanofilm provides a material barrier that prevents oxidation of the sulfide glass sheet by the cathode electroactive material.

In other embodiments it is contemplated that the battery cell is fully solid-state, and thus devoid of liquid electrolyte. For instance, in various solid-state battery embodiments, positive electrode 1105 (e.g., a lithium ion cathode of an intercalation material) directly contacts the encapsulating nanofilm.

CONCLUSION

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the appended claims. For instance, in various embodiments when referring to nanofilm encapsulated solid electrolyte structures, the moisture sensitive sulfide solid electrolyte sheet is generally embodied as a sulfide glass. However, in alternative embodiments the sulfide based solid electrolyte sheet may be a sulfide powder compact composed of highly conductive sulfide polycrystalline materials and/or glass ceramics or a sulfide glass sheet that has been crystallized, or partially crystallized to form a sulfide glass ceramic sheet.

What is claimed:

1. A nanofilm-encapsulated sulfide glass solid electrolyte structure, the structure comprising:
    a dense, moisture sensitive lithium ion conducting sulfide glass solid electrolyte sheet having substantially uniform thickness in the range of 5 50 µm and Li ion conductivity of at least $10^{-5}$ S/cm, the sulfide glass sheet having first and second major opposing surfaces and a peripheral edge surface; and
    a continuous inorganic nanofilm that conforms to the sulfide glass surfaces and encapsulates, in direct contact, the first and second major opposing surfaces of the glass sheet and the peripheral edge surface of the glass sheet;
    wherein the nanofilm has an asymmetric architecture, is pinhole free and protects the encapsulated glass surfaces against chemical degradation by ambient moisture during storage or battery cell manufacture.

2. The solid electrolyte structure of claim 1, having an area specific resistance (ASR) that is less than 200 Ω-cm² at room temperature.

3. The solid electrolyte structure of claim 2, wherein the nanofilm comprises a first nanolayer deposited onto the first major surface of the sulfide glass sheet and a second nanolayer deposited onto the second major surface of the sulfide glass sheet and further wherein the first and second nanolayer have a different material composition.

4. The solid electrolyte structure of claim 3, wherein the controlled atmosphere has a dew point in the range selected from the group consisting of −20° C. to −90° C.; −40° C. to −90° C.; −60° C. to −90° C.

5. The solid electrolyte structure of claim 3, wherein the controlled atmosphere has a dew point selected from the group consisting of about −20° C., about −40° C., about −60° C., about −70° C., about −80° C., and about −90° C.

6. The solid electrolyte structure of claim 4, wherein the solid electrolyte structure is exposed to the controlled atmosphere for a duration selected from the group consisting of 10 seconds to 60 seconds, 60 seconds to 120 seconds, 120 seconds to 300 seconds, 300 seconds to 600 seconds, and 600 seconds to 1800 seconds.

7. The solid electrolyte structure of claim 2, wherein the nanofilm increases the flexural strength of the sulfide glass sheet by at least 30% or at least about 100%.

8. The solid electrolyte structure of claim 1, wherein the nanofilm enhances the oxidative stability of the sulfide glass sheet, and thereby enables the solid electrolyte structure to directly contact an intercalation cathode material in a battery cell without chemical degradation, wherein the electrochemical potential of the cathode material versus lithium metal is at least 3 Volts.

9. A method of making a nanofilm-encapsulated sulfide glass solid electrolyte structure, the method comprising:
    (i) providing a substrate-less lithium ion conducting sulfide glass solid electrolyte sheet having a thickness in the range of 5 to 50 µm, and having first and second major opposing surfaces and a peripheral edge surface; and
    (ii) depositing by atomic layer deposition (ALD) a continuous inorganic nanofilm that encapsulates the sulfide glass sheet first and second major surfaces and the peripheral edge surface;
    wherein the nanofilm has an asymmetric architecture, is pinhole free and protects the encapsulated glass surfaces against chemical degradation by ambient moisture during storage or battery cell manufacture.

10. The method of claim 9, wherein the nanofilm is deposited onto all glass sheet surfaces.

11. The method of claim 9, wherein the thickness of the nanofilm is selected from the group consisting of 1 nm to 5 nm, 0.1 nm to 1 nm, and 5 nm to 10 nm.

12. The method of claim 9, wherein the nanofilm comprises a first nanolayer deposited onto the first major surface of the sulfide glass sheet and a second nanolayer deposited onto the second major surface of the sulfide glass sheet; and further wherein the first and second nanolayer have a different material composition.

13. The method of claim 12, wherein the first nanolayer is a metal nitride and the second nanolayer is a metal oxide.

14. The method of claim 13 wherein the metal nitride is silicon nitride.

15. The method of claim 13, wherein the metal oxide is selected from the group consisting of aluminum oxide, zirconium oxide, niobium oxide, and hafnium oxide.

16. The method of claim 9, wherein the ALD is plasma enhanced.

17. The method of claim 9, wherein the sulfide glass solid electrolyte sheet is in the form of a web of glass, and the atomic layer deposition is spatial ALD.

18. The method of claim 9, wherein a first nanolayer is deposited on the first major surface during a first deposition step, and a second nanolayer is deposited on the second major surface during a second deposition step.

19. The method of claim 9, wherein the nanofilm has a thickness of at least 5 nanometers.

20. A solid-state laminate electrode assembly comprising a nanofilm-encapsulated sulfide glass solid electrolyte structure in accordance with claim 1, and further comprising a lithium metal layer in direct contact with the nanofilm.

* * * * *